(12) United States Patent
Tae et al.

(10) Patent No.: US 12,740,206 B2
(45) Date of Patent: Sep. 15, 2026

(54) DISPLAY DEVICE INCLUDING ASYMMETRIC LED ARRANGEMENTS AND METHOD FOR MANUFACTURING SAME

(71) Applicant: SAMSUNG DISPLAY CO., LTD., Yongin-si (KR)

(72) Inventors: Chang Il Tae, Yongin-si (KR); Hyun Min Cho, Yongin-si (KR); Dae Hyun Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 952 days.

(21) Appl. No.: 17/769,455

(22) PCT Filed: Sep. 24, 2020

(86) PCT No.: PCT/KR2020/013016
§ 371 (c)(1),
(2) Date: Apr. 15, 2022

(87) PCT Pub. No.: WO2021/075755
PCT Pub. Date: Apr. 22, 2021

(65) Prior Publication Data

US 2024/0128418 A1 Apr. 18, 2024

(30) Foreign Application Priority Data

Oct. 16, 2019 (KR) ........................ 10-2019-0128706

(51) Int. Cl.
*H10H 20/857* (2025.01)
*H10H 20/01* (2025.01)
(Continued)

(52) U.S. Cl.
CPC .......... *H10H 20/857* (2025.01); *H10H 20/01* (2025.01); *H10H 29/142* (2025.01);
(Continued)

(58) Field of Classification Search
CPC ...... H10H 29/142; H10H 29/49; H10H 29/39; H01L 25/167; H01L 25/0753
See application file for complete search history.

(56) References Cited

U.S. PATENT DOCUMENTS 9,935,086 B2 4/2018 Moon et al.
10,249,603 B2 4/2019 Cho et al.
(Continued)

FOREIGN PATENT DOCUMENTS

CN 108206234 6/2018
CN 110137200 8/2019
(Continued)

OTHER PUBLICATIONS

International Search Report, with English translation, corresponding to International Application No. PCT/KR2020/013016 dated Jan. 11, 2021.
(Continued)

*Primary Examiner* — Tyler J Wiegand
(74) *Attorney, Agent, or Firm* — Womble Bond Dickinson (US) LLP

(57) ABSTRACT

A display device includes a display area including pixel areas; a non-display area; and a pixel provided in each pixel area. The pixel may include first to third areas divided from each other in a direction; first and second sub-electrodes provided in each of the first to third areas, and spaced apart from each other; light emitting elements provided in each of the first to third areas, and disposed between the first and second sub-electrodes; a bridge pattern disposed in each of the first to third areas under the first and second sub-electrodes of the corresponding area with an insulating layer disposed therebetween; a first contact electrode provided in each of the first to third areas on the first sub-electrode of the corresponding area; and a second contact electrode provided
(Continued)

in each of the first to third areas on the second sub-electrode of the corresponding area.

18 Claims, 38 Drawing Sheets

(51) Int. Cl.

| | |
|---|---|
| ***H10H 20/83*** | (2025.01) |
| ***H10H 20/831*** | (2025.01) |
| ***H10H 29/14*** | (2025.01) |
| ***H10H 29/39*** | (2025.01) |
| ***H10H 29/49*** | (2025.01) |
| ***H10W 90/00*** | (2026.01) |

(52) U.S. Cl.
CPC ............ *H10H 29/49* (2025.01); *H10W 90/00* (2026.01); *H10H 20/0364* (2025.01); *H10H 20/83* (2025.01); *H10H 20/8316* (2025.01); *H10H 29/39* (2025.01)

(56) References Cited

U.S. PATENT DOCUMENTS

| | | | | |
|---|---|---|---|---|
| 10,461,123 | B2 | 10/2019 | Kim et al. | |
| 10,720,558 | B2 | 7/2020 | Moon et al. | |
| 10,840,158 | B2 | 11/2020 | Guo et al. | |
| 11,063,194 | B2 | 7/2021 | Do et al. | |
| 11,069,726 | B2 | 7/2021 | Kim et al. | |
| 11,074,858 | B2 | 7/2021 | Cho et al. | |
| 2008/0128699 | A1 | 6/2008 | Seong et al. | |
| 2011/0210345 | A1 | 9/2011 | Lim et al. | |
| 2017/0358563 | A1* | 12/2017 | Cho | H01L 25/167 |
| 2018/0012876 | A1* | 1/2018 | Kim | H10H 20/8252 |
| 2018/0175009 | A1* | 6/2018 | Kim | H01L 25/0753 |
| 2020/0403131 | A1 | 12/2020 | Kim et al. | |

FOREIGN PATENT DOCUMENTS

| | | |
|---|---|---|
| EP | 4 040 494 | 8/2022 |
| JP | 2014-75550 | 4/2014 |
| JP | 2014-123583 | 7/2014 |
| JP | 2015-11784 | 1/2015 |
| KR | 10-1730977 | 4/2017 |
| KR | 10-2017-0104031 | 9/2017 |
| KR | 10-2017-0141305 | 12/2017 |
| KR | 10-2018-0072909 | 7/2018 |
| KR | 10-2019-0095638 | 8/2019 |
| KR | 10-2020-0145965 | 12/2020 |
| KR | 10-2020-0145966 | 12/2020 |
| KR | 10-2021-0008252 | 1/2021 |
| KR | 10-2021-0029337 | 3/2021 |
| TW | I641126 | 11/2018 |

OTHER PUBLICATIONS

Written Opinion, with English translation, corresponding to International Application No. PCT/KR2020/013016, dated Jan. 11, 2021.

* cited by examiner

Figure 11:
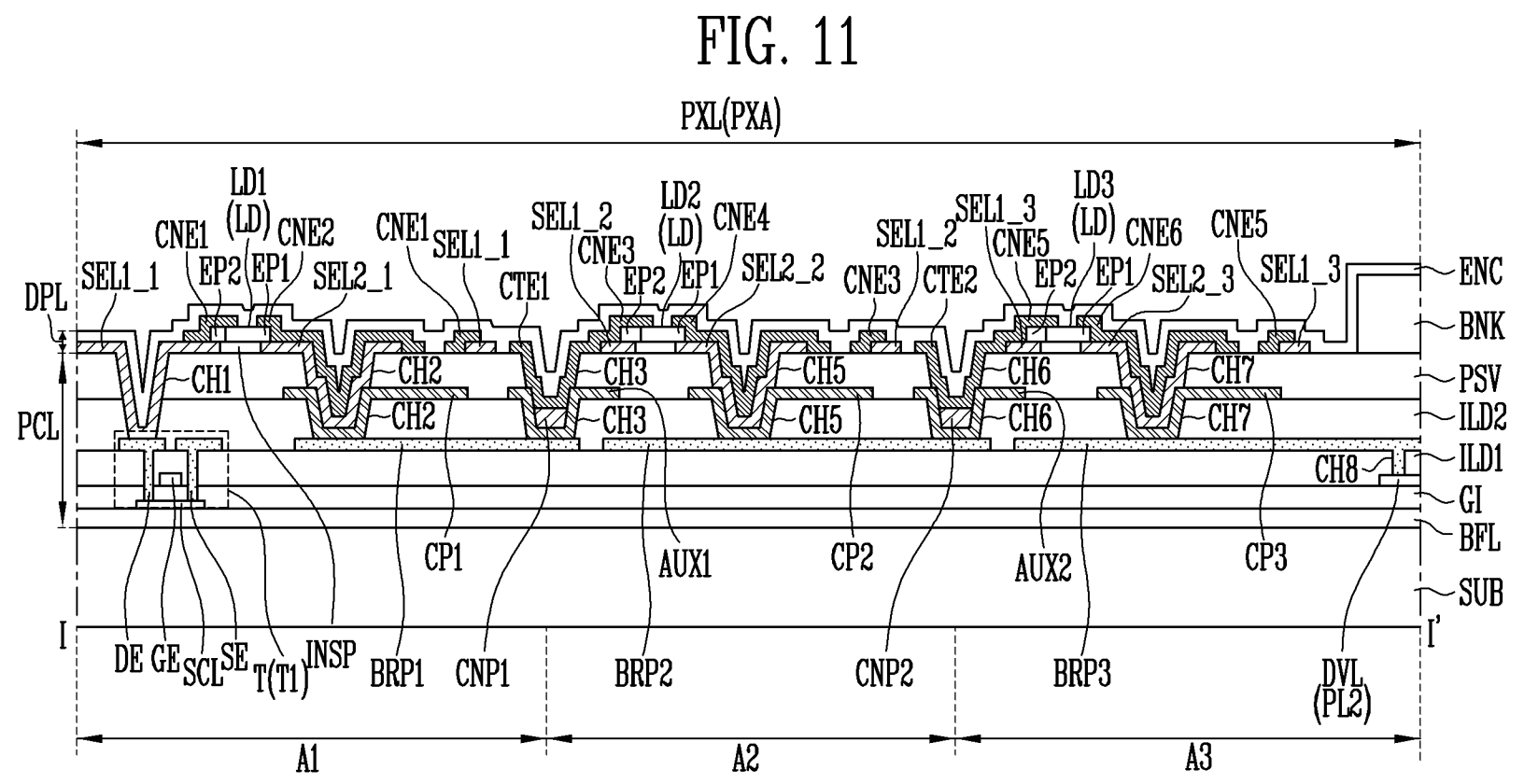

PXL(PXA)
ENC BNK PSV ILD2 ILD1 GI BFL SUB I'
DVL (PL2) CH8 CP3 SEL1_3 CNE5 CH7 CH7 SEL2_3 CNE6 EP1 LD3 (LD) EP2 CNE5 SEL1_3 CH6 CH6 AUX2 BRP3 A3
SEL1_2 CTE2 CNP2 CNE3 CP2 CH5 CH5 SEL2_2 CNE4 EP1 LD2 (LD) EP2 CNE3 SEL1_2 CH3 CH3 AUX1 BRP2 A2
CTE1 CNP1 SEL1_1 CNE1 CP1 CH2 CH2 BRP1 SEL2_1 CNE2 EP1 LD1 (LD) EP2 CNE1 CH1 INSP T(T1) SE SCL SE GE DE SEL1_1 A1
DPL PCL I

PXL(PXA)

PSV
ILD2
ILD1
GI
BFL
SUB
III'
DVL
(PL2)
CH8
CH7
CH6
CH5
CH3
CH2
CH1
BRP3
BRP2
BRP1
A3
A2
A1
SE
SCL
GE
DE
T(T1)
PCL
III

FIG. 19B

PXL(PXA)
PSV
ILD2
ILD1
GI
BFL
SUB
III'
III
DVL
(PL2)
CH1
CH2
CH3
CH5
CH6
CH7
CH8
BRP1
BRP2
BRP3
A1
A2
A3
BNK1
SE
SCL
GE
DE
T(T1)
PCL

FIG. 19C

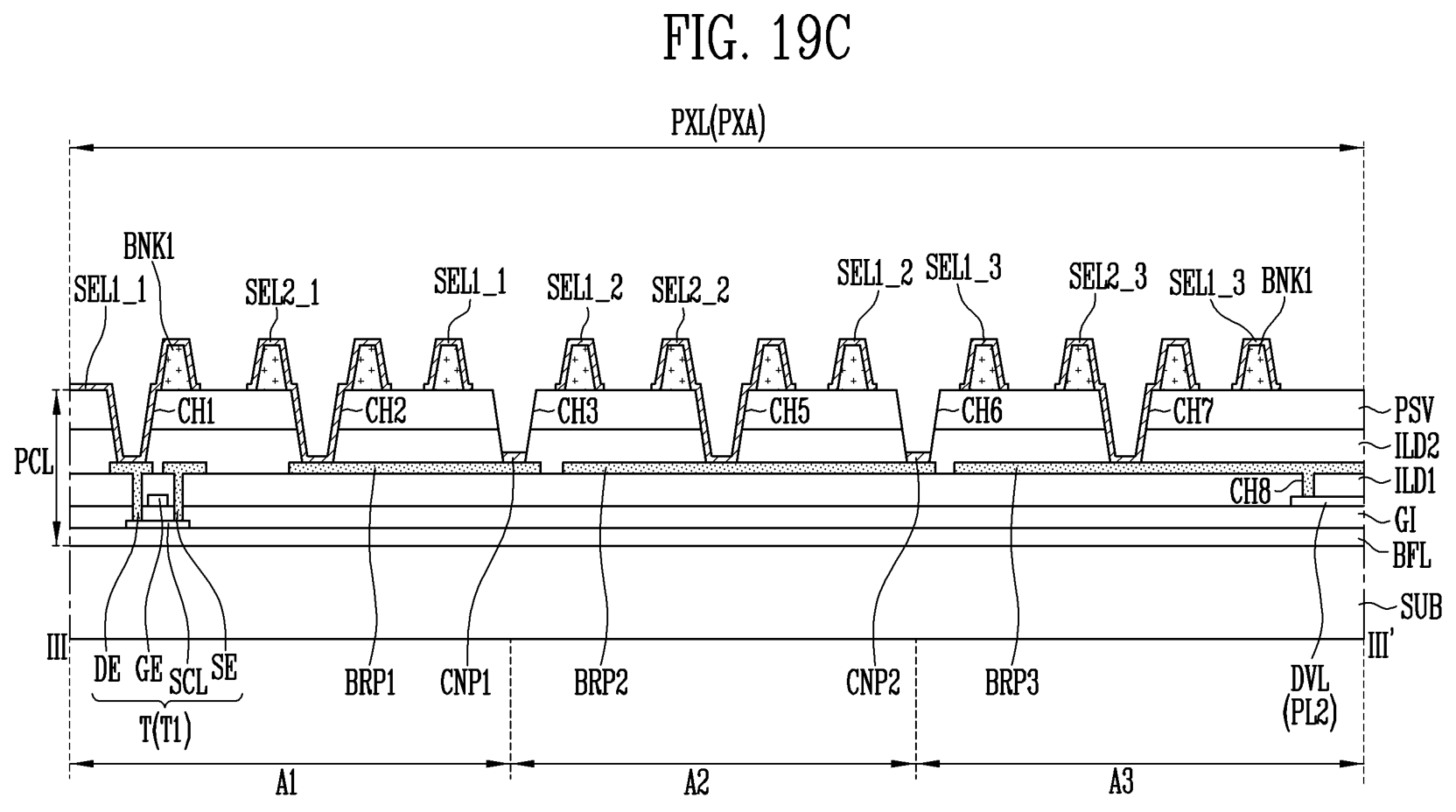

PXL(PXA)

PSV ILD2 ILD1 GI BFL SUB III'

DVL (PL2)

CH8

SEL1_3 BNK1

CH7

SEL2_3

BRP3

SEL1_3 CH6

SEL1_2

CNP2

CH5

SEL2_2

BRP2

SEL1_2 CH3

SEL1_1

CNP1

CH2 BRP1

SEL2_1

BNK1 CH1

SEL1_1

SE SCL GE DE T(T1)

III

PCL

A1 A2 A3

PXL(PXA)
BNK2
PSV
ILD2
ILD1
GI
BFL
SUB
III'
III
DVL (PL2)
CH8
BNK1
SEL1_3
CH7
SEL2_3
BRP3
SEL1_3
CH6
CNP2
SEL1_2
BNK1
CH5
SEL2_2
INSM
BRP2
SEL1_2
CH3
CNP1
SEL1_1
CH2
BRP1
SEL2_1
INSM
CH1
BNK1
SEL1_1
SE
SCL
GE
DE
T(T1)
PCL
A1
A2
A3

PXL(PXA)
BNK2
PSV
ILD2
ILD1
GI
BFL
SUB
III'
III
PCL
A1
A2
A3
DVL
(PL2)
CH8
BRP1
BRP2
BRP3
CNP1
CNP2
INS1
INS2
EP1
EP2
SE
SCL
GE
DE
T(T1)
LD1
(LD)
LD2
(LD)
LD3
(LD)
BNK1
SEL1_1
SEL2_1
SEL1_2
SEL2_2
SEL1_3
SEL2_3
CNE1
CNE2
CNE3
CNE4
CNE5
CNE6
CTE1
CTE2
CH1
CH2
CH3
CH5
CH6
CH7

PXL(PXA)
ENC
BNK2
PSV
ILD2
ILD1
GI
BFL
SUB
III'
III
DVL
(PL2)
CH8
A1
A2
A3
DPL
PCL
T(T1)
DE
GE
SCL
SE
EP1
EP2
INS1
INS2
BRP1
BRP2
BRP3
CNP1
CNP2
CTE1
CTE2
CH1
CH2
CH3
CH5
CH6
CH7
BNK1
SEL1_1
SEL2_1
SEL1_2
SEL2_2
SEL1_3
SEL2_3
CNE1
CNE2
CNE3
CNE4
CNE5
CNE6
LD1
(LD)
LD2
(LD)
LD3
(LD)

FIG. 21

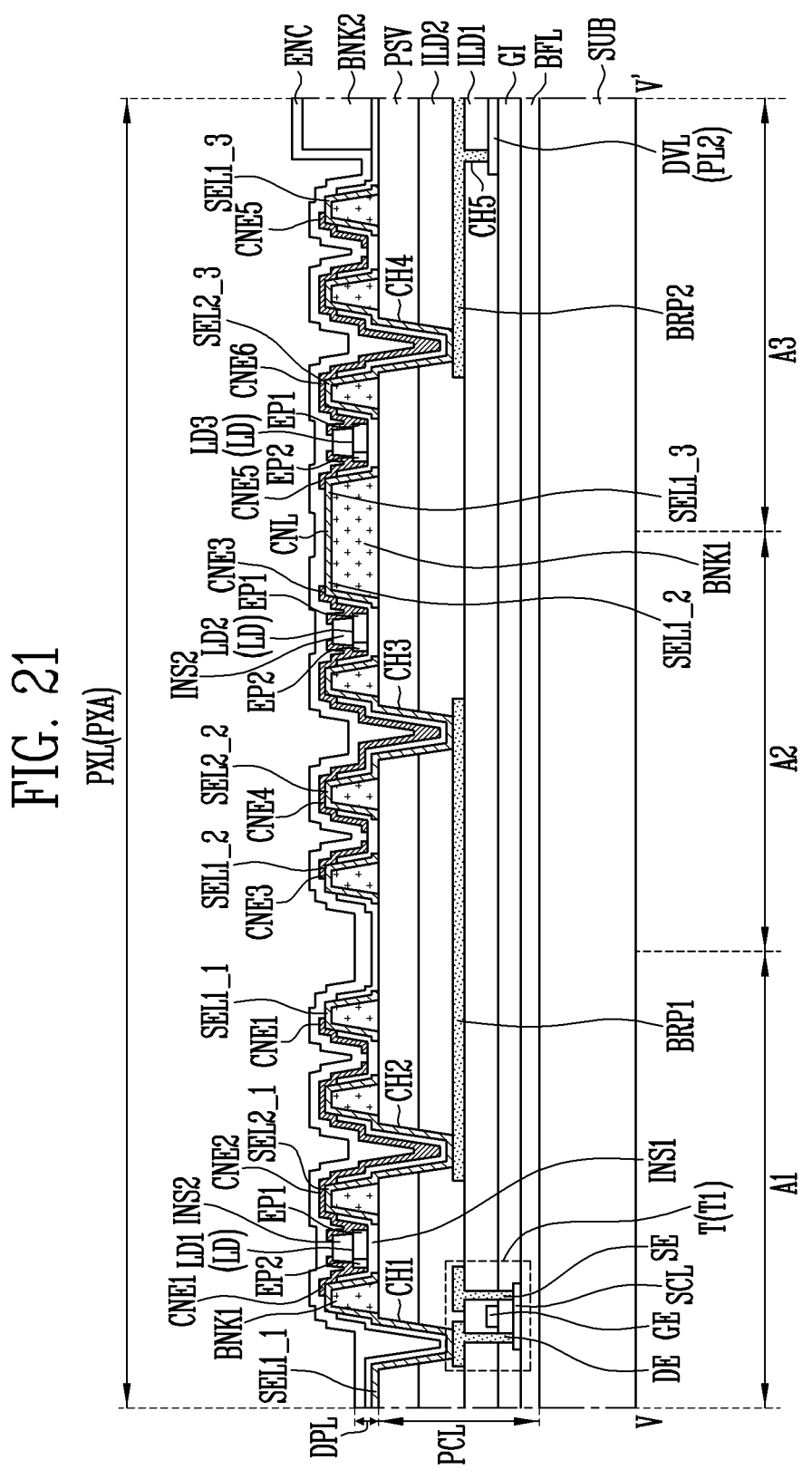

PXL(PXA)

ENC BNK2 PSV ILD2 ILD1 GI BFL SUB V'

SEL1_3 CNE5 CH5 DVL (PL2) CH4 BRP2 SEL2_3 CNE6 LD3 (LD) EP1 EP2 CNE5 SEL1_3 A3

CNL CNE3 EP1 BNK1 SEL1_2 LD2 (LD) INS2 EP2 CH3 SEL2_2 CNE4 SEL1_2 CNE3 A2

SEL1_1 CNE1 BRP1 CH2 SEL2_1 CNE2 EP1 INS2 LD1 (LD) INS1 T(T1) EP2 CNE1 CH1 SE SCL GE BNK1 DE SEL1_1 A1

DPL PCL V

DISPLAY DEVICE INCLUDING ASYMMETRIC LED ARRANGEMENTS AND METHOD FOR MANUFACTURING SAME

CROSS-REFERENCE TO RELATED APPLICATION(S)

This application is a national entry of International Application No. PCT/KR2020/013016, filed on Sep. 24, 2020, which claims under 35 U.S.C. §§ 119(a) and 365(b) priority to and benefits of Korean Patent Application No. 10-2019-0128706, filed on Oct. 16, 2019, in the Korean Intellectual Property Office (KIPO), the entire contents of which are incorporated herein by reference.

BACKGROUND

1. Technical Field

Various embodiments of the disclosure relate to a display device and a method of fabricating the display device.

2. Description of Related Art

With an increase in interest in an information display and an increase in demand to use portable information media, demand for display devices is markedly increased, and commercialization thereof is in progress.

SUMMARY

Various embodiments of the disclosure are directed to a display device having enhanced reliability, and a method of fabricating the display device.

A display device in accordance with an embodiment of the disclosure may include a display area including pixel areas; a non-display area; and a pixel provided in each of the pixel areas. The pixel may include a first area, a second area, and a third area divided from each other in a direction; a first sub-electrode and a second sub-electrode provided in each of the first to the third areas, and spaced apart from each other; light emitting elements provided in each of the first to the third areas, and disposed between the first and the second sub-electrodes; a bridge pattern disposed in each of the first to the third areas under the first and the second sub-electrodes of a corresponding one of the first to the third areas with an insulating layer disposed between the bridge pattern and the first and the second sub-electrodes; a first contact electrode provided in each of the first to the third areas on the first sub-electrode of a corresponding one of the first to third areas; and a second contact electrode provided in each of the first to the third areas on the second sub-electrode of a corresponding one of the first to the third areas, In an embodiment of the disclosure, the bridge pattern of the first area and the first contact electrode of the second area may be electrically connected to each other.

In an embodiment of the disclosure, in each of the first to third areas, one sub-electrode of the first sub-electrode and the second sub-electrode may have a circular shape, and a remaining sub-electrode of the first sub-electrode and the second sub-electrode may have a shape enclosing the one sub-electrode.

In an embodiment of the disclosure, the light emitting elements may include: first light emitting elements disposed between the first and the second sub-electrodes of the first area; second light emitting elements disposed between the first and the second sub-electrodes of the second area; and third light emitting elements disposed between the first and the second sub-electrodes of the third area. The first to the third light emitting elements each may be disposed around the one sub-electrode in a corresponding one of the first to third areas in a circumferential direction between the one sub-electrode and the remaining sub-electrode.

In an embodiment of the disclosure, in a plan view, the bridge pattern of the first area, the bridge pattern of the second area, and the bridge pattern of the third area may be spaced apart from each other.

In an embodiment of the disclosure, at least a portion of the bridge pattern of the first area may extend to the second area. At least a portion of the bridge pattern of the second area may extend to the third area.

In an embodiment of the disclosure, the insulating layer may include contact holes formed to expose a portion of the bridge pattern of each of the first to the third areas. The display device may further include a first intermediate electrode provided in at least one contact hole formed in an area between the first area and the second area among the contact holes, and electrically connecting the bridge pattern of the first area to the first contact electrode of the second area.

In an embodiment of the disclosure, the first intermediate electrode may be integral with the first contact electrode of the second area.

In an embodiment of the disclosure, the display device may further include a second intermediate electrode provided in at least one contact hole formed in an area between the second area and the third area among the contact holes, and electrically connecting the bridge pattern of the second area to the first contact electrode of the third area. Here, the second intermediate electrode may be integral with the first contact electrode of the third area.

In an embodiment of the disclosure, the bridge pattern of the first area may be electrically connected to each of the second sub-electrode of the first area and the first intermediate electrode. The bridge pattern of the second area may be electrically connected to each of the first intermediate electrode, the second sub-electrode of the second area, and the second intermediate electrode. The bridge pattern of the third area may be electrically connected to each of the second intermediate electrode and the second sub-electrode of the third area.

In an embodiment of the disclosure, the first light emitting elements may form a first set connected in parallel between the first and the second sub-electrodes of the first area, the second light emitting elements may form a second set connected in parallel between the first and the second sub-electrodes of the second area, and the third light emitting elements may form a third set connected in parallel between the first and the second sub-electrodes of the third area. The first set and the second set may be electrically connected through the bridge pattern of the first area and the first intermediate electrode, and the second set and the third set may be electrically connected through the bridge pattern of the second area and the second intermediate electrode.

In an embodiment of the disclosure, the display device may further include: a conductive pattern provided on the bridge pattern of each of the first to the third areas and electrically connected to the bridge pattern; a first auxiliary electrode disposed between the bridge pattern of the first area and the first intermediate electrode in the area between the first area and the second area; and a second auxiliary electrode disposed between the bridge pattern of the second area and the second intermediate electrode in the area between the second area and the third area.

In an embodiment of the disclosure, the conductive pattern of the first area may be disposed between the second sub-electrode of the first area and the bridge pattern of the first area. The conductive pattern of the second area may be disposed between the second sub-electrode of the second area and the bridge pattern of the second area. The conductive pattern of the third area may be disposed between the second sub-electrode of the third area and the bridge pattern of the third area.

In an embodiment of the disclosure, the conductive pattern of each of the first to the third areas and the first and the second auxiliary electrodes may be provided on a same layer.

A display device in accordance with an embodiment of the disclosure may include a display area including pixel areas; a non-display area; and a pixel provided in each of the pixel areas. The pixel may include a first area, a second area, and a third area divided from each other in a direction; a first sub-electrode and a second sub-electrode provided in each of the first to the third areas, and spaced apart from each other; light emitting elements provided in each of the first to the third areas, and disposed between the first and the second sub-electrodes; a first bridge pattern extending from the first area to the second area, and disposed under the second sub-electrodes of each of the first and the second areas; a second bridge pattern provided in the third area and disposed under the second sub-electrode of the third area; and a connection line provided between the first sub-electrode of the second area and the first sub-electrode of the third area, and electrically connecting the first sub-electrode of the second area with to first sub-electrode of the third area.

In an embodiment of the disclosure, the connection line may be integral with one first sub-electrode of the first sub-electrode of the second area and the first sub-electrode of the third area.

In an embodiment of the disclosure, in each of the first to third areas, one sub-electrode of the first sub-electrode and the second sub-electrode may have a circular shape, and a remaining sub-electrode of the first sub-electrode and the second sub-electrode may have a shape enclosing the one sub-electrode.

In an embodiment of the disclosure, the light emitting elements may include first light emitting elements disposed between the first and the second sub-electrodes of the first area, second light emitting elements disposed between the first and the second sub-electrodes of the second area, and third light emitting elements disposed between the first and the second sub-electrodes of the third area. The first to the third light emitting elements each may be disposed around the one sub-electrode in a corresponding one of the first to third areas in a circumferential direction between the one sub-electrode and the remaining sub-electrode.

In an embodiment of the disclosure, the first light emitting elements may form a first set connected in parallel between the first and the second sub-electrodes of the first area, the second light emitting elements may form a second set connected in parallel between the first and the second sub-electrodes of the second area, and the third light emitting elements may form a third set connected in parallel between the first and the second sub-electrodes of the third area. Here, the first set and the second set may be electrically connected to each other through the first bridge pattern, and the second set and the third set may be electrically connected to each other through the connection line.

The display device described above may be fabricated by a method including providing a pixel in a pixel area including a first area, a second area, and a third area divided from each other in a direction. Here, the providing of the pixel may include forming a pixel circuit layer, and forming a display element layer.

In an embodiment of the disclosure, the forming of the pixel circuit layer may include forming at least one transistor, and a bridge pattern corresponding to each of the first to the third areas on a substrate; and forming an insulating layer on the transistor and the bridge pattern.

In an embodiment of the disclosure, forming the display element layer may include forming, on the insulating layer, a second sub-electrode corresponding to each of the first to the third areas and having a circular shape, and a first sub-electrode having a shape enclosing a perimeter of the second sub-electrode; supplying light emitting elements to each of the first to the third areas, and aligning the light emitting elements between the first and the second sub-electrodes; and forming a contact electrode on each of the first and the second sub-electrodes, and forming a first intermediate electrode integral with the contact electrode on the first sub-electrode of the second area, and a second intermediate electrode integral with the contact electrode on the first sub-electrode of the third area.

In an embodiment of the disclosure, the bridge pattern of the first area and the contact electrode on the first sub-electrode of the second area may be electrically connected to each other through the first intermediate electrode.

In an embodiment of the disclosure, the bridge pattern of the second area and the contact electrode on the first sub-electrode of the third area may be electrically connected to each other through the second intermediate electrode.

In a display device and a method of fabricating the display device in accordance with an embodiment of the disclosure, light emitting elements distributed to each of sub-emission areas which form each pixel may be connected in a serial/parallel combination structure so that light output efficiency of the light emitting elements may be enhanced, and light output distribution of the light emitting elements in the sub-emission areas may be uniform.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 9 is a schematic cross-sectional view taken along line I-I' of FIG. 8.

FIG. 11 illustrates a display device including first to third conductive patterns connected to first to third bridge patterns illustrated in FIG. 9, and is a schematic cross-sectional view corresponding to line I-I' of FIG. 8.

FIG. 14 is a schematic cross-sectional view taken along line III-III' of FIG. 13.

FIG. 17 illustrates another embodiment of a display element layer illustrated in FIG. 15, and is a schematic cross-sectional view corresponding to line IV-IV' of FIG. 13.

FIGS. 18A to 18F are schematic plan views sequentially illustrating a method of fabricating a pixel illustrated in FIG. 13.

Figure 19A:
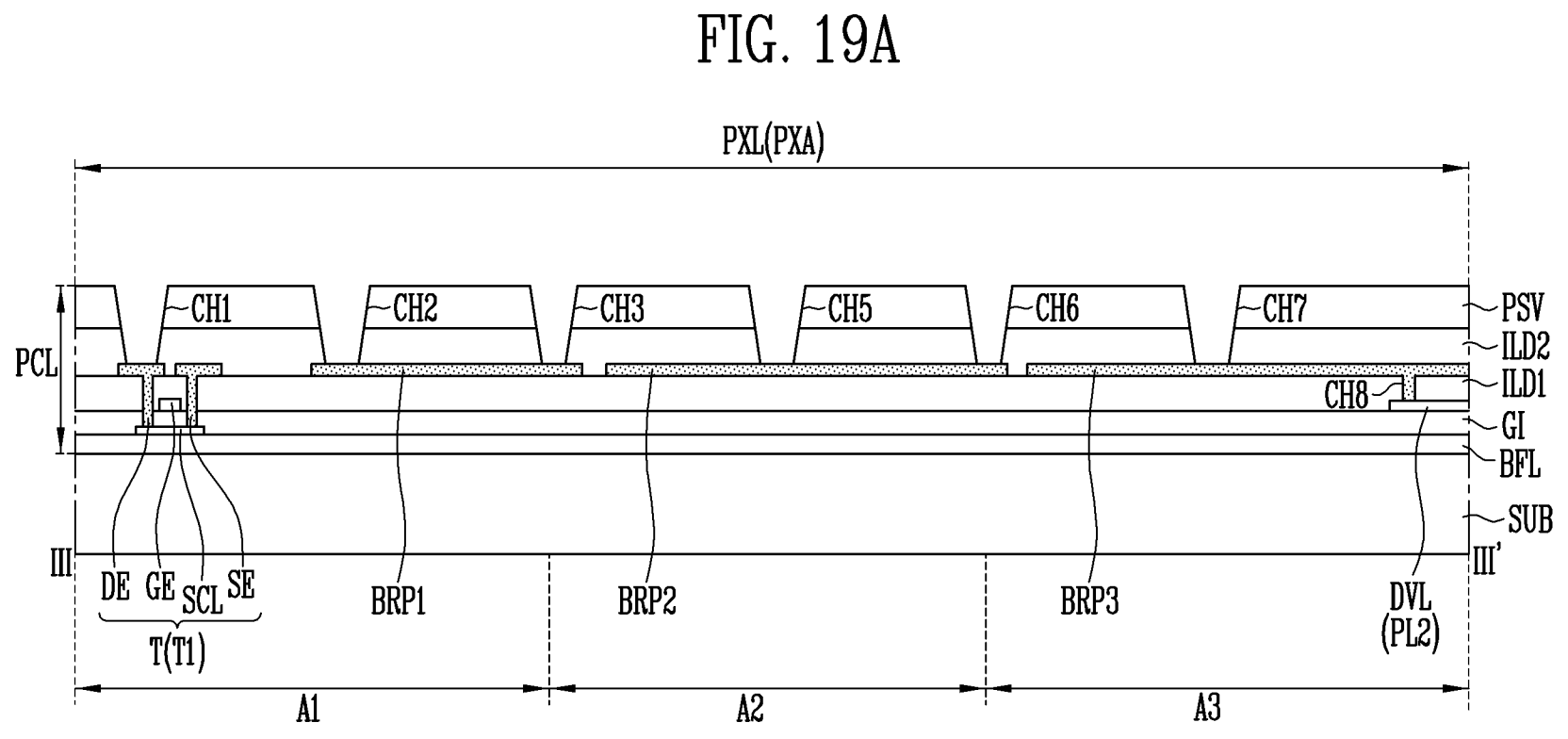
Figure 19B:
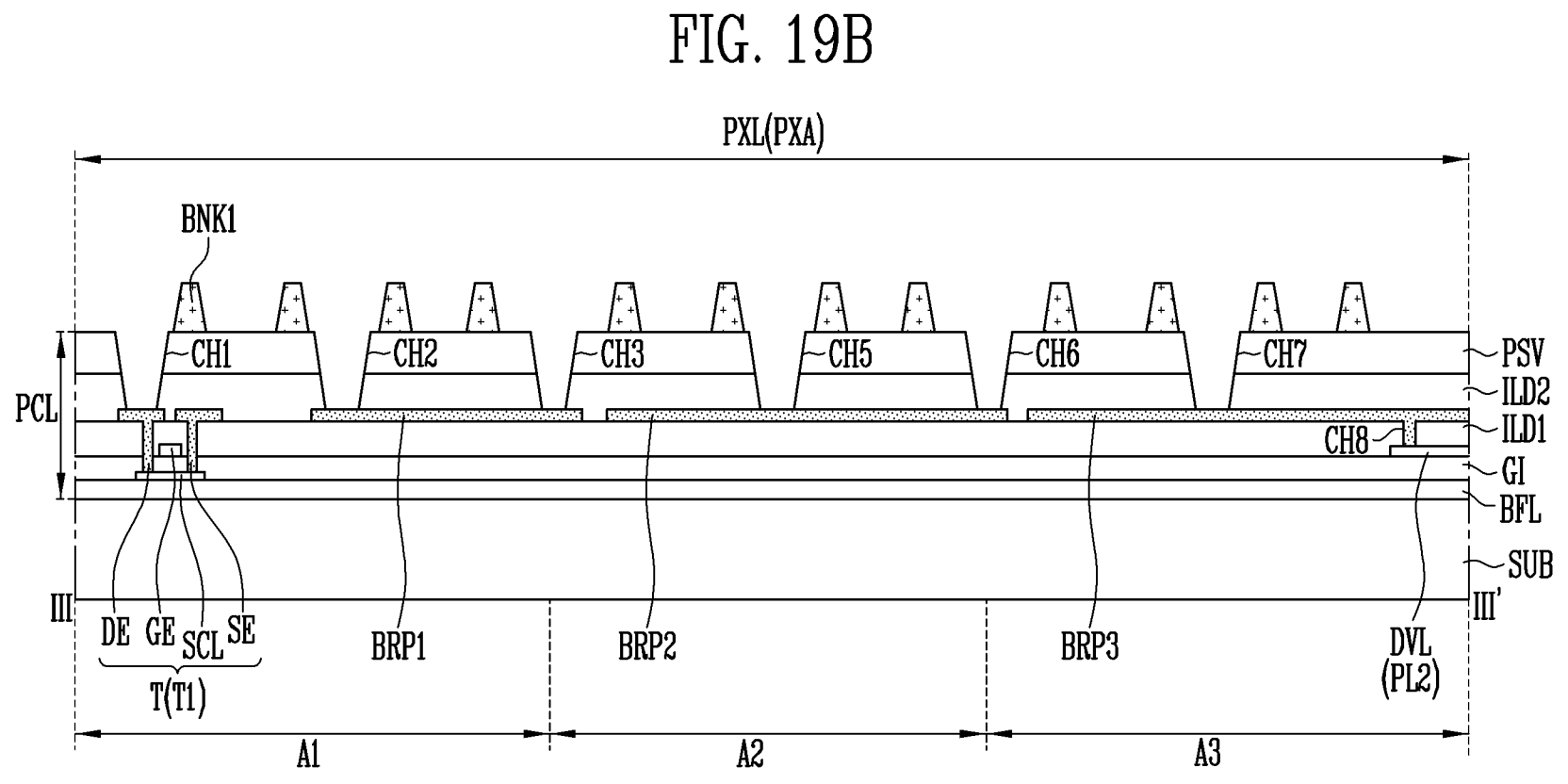

FIGS. 19A to 19H are schematic cross-sectional views sequentially illustrating a method of fabricating the pixel illustrated in FIG. 14.

FIG. 21 is a schematic cross-sectional view taken along line V-V' of FIG. 20.

DETAILED DESCRIPTION OF THE EMBODIMENTS

Figure 1A:
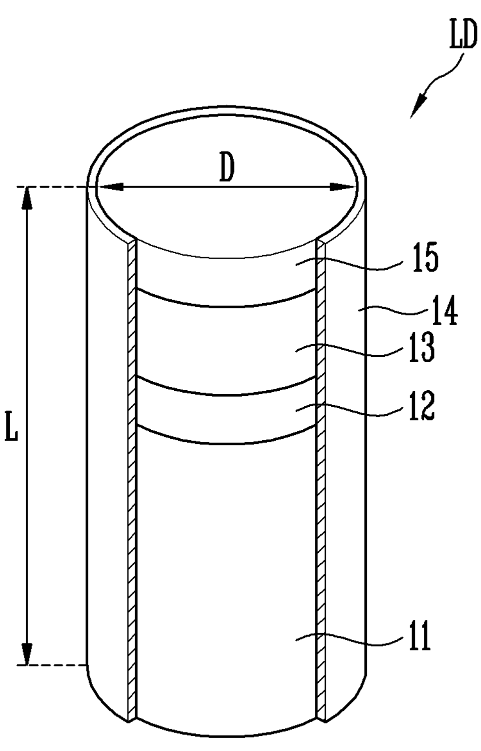
FIG. 1A is a perspective view schematically illustrating a light emitting element in accordance with an embodiment of the disclosure.

As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the technical scope of the disclosure are encompassed in the disclosure.

Throughout the disclosure, like reference numerals refer to like parts throughout the various figures and embodiments of the disclosure. The sizes of elements in the accompanying drawings may be exaggerated for clarity of illustration. It will be understood that, although the terms “first”, “second”, etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element. In the disclosure, the singular forms are intended to include the plural forms (or meanings) as well, unless the context clearly indicates otherwise.

It will be further understood that the terms “comprise”, “include”, “have”, etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, in case that a first part such as a layer, a film, a region, or a plate is disposed on a second part, the first part may be not only directly on the second part but a third part may intervene between them. In addition, in case that it is expressed that a first part such as a layer, a film, a region, or a plate is formed on a second part, the direction in which the first part is formed is not limited to an upward direction, and may include a sideway or downward direction. To the contrary, in case that a first part such as a layer, a film, a region, or a plate is under a second part, the first part may be not only directly under the second part but a third part may intervene between them.

Embodiments and required details of the disclosure are described with reference to the accompanying drawings in order to describe the disclosure in detail so that those having ordinary knowledge in the technical field to which the disclosure pertains may easily practice the disclosure. Furthermore, a singular form may include a plural form as long as it is not specifically mentioned in a sentence.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 1B:
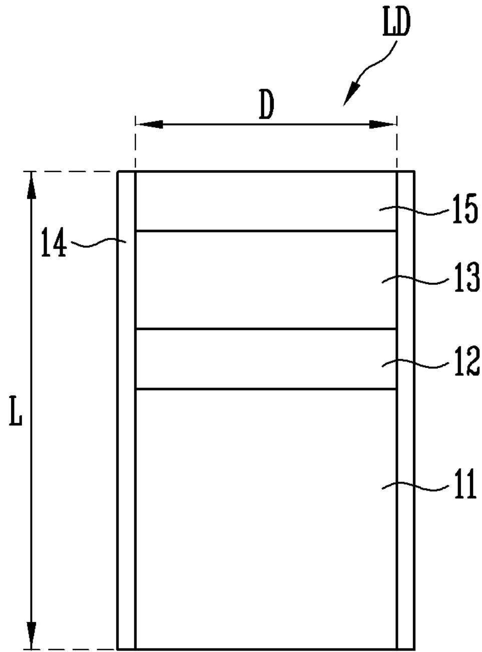
FIG. 1B is a cross-sectional view schematically illustrating the light emitting element of FIG. 1A.
Figure 2A:
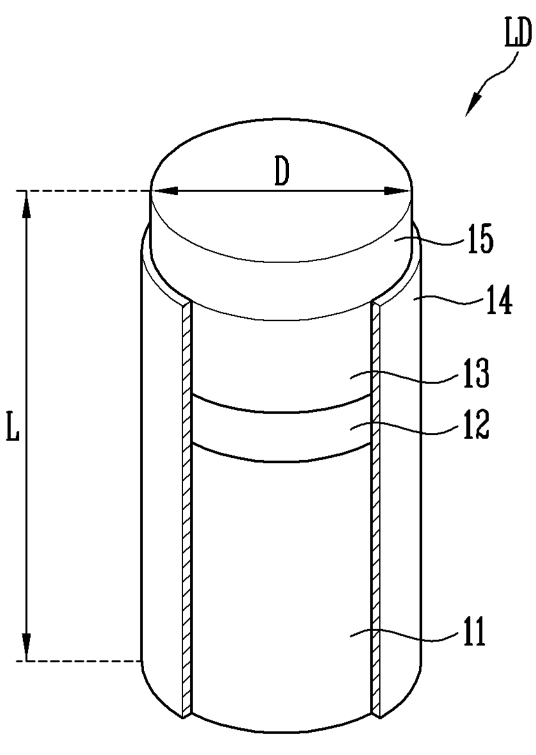
FIG. 2A is a perspective view schematically illustrating a light emitting element in accordance with an embodiment of the disclosure.
Figure 2B:
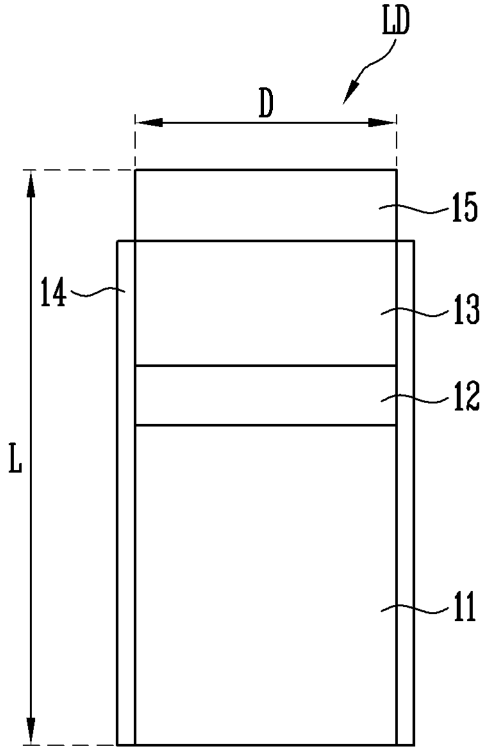
FIG. 2B is a cross-sectional view schematically illustrating the light emitting element of FIG. 2A.
Figures 3A, 3B:
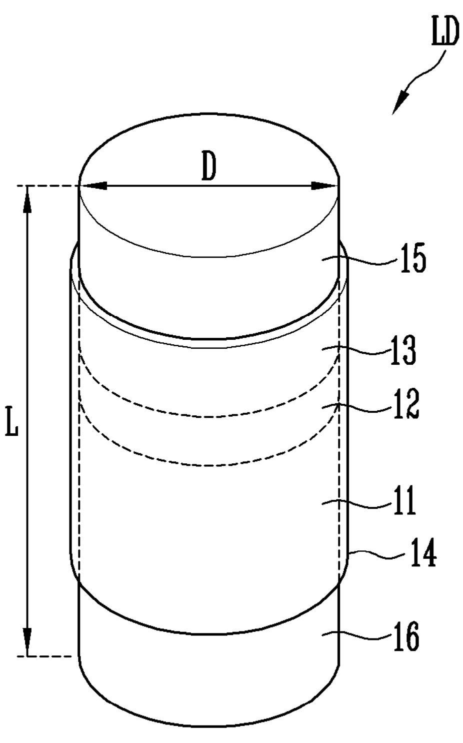
FIG. 3A is a perspective view schematically illustrating a light emitting element in accordance with an embodiment of the disclosure.
FIG. 3B is a cross-sectional view schematically illustrating the light emitting element of FIG. 3A.
Figure 4A:
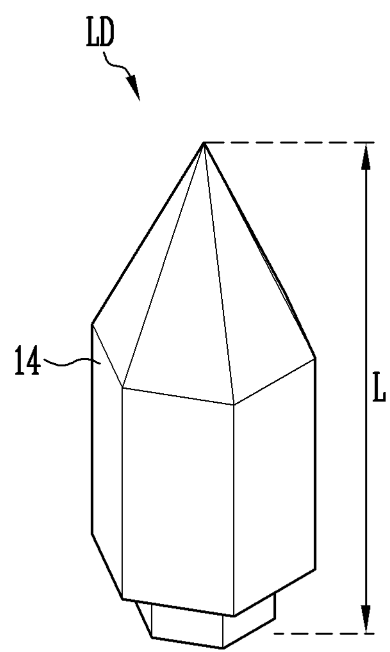
FIG. 4A is a perspective view schematically illustrating a light emitting element in accordance with an embodiment of the disclosure.
Figure 4B:
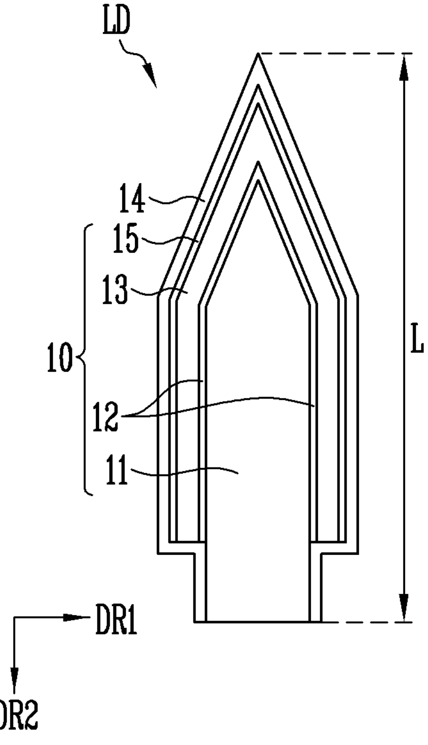
FIG. 4B is a cross-sectional view schematically illustrating the light emitting element of FIG. 4A.

FIG. 1A is a perspective view schematically illustrating a light emitting element in accordance with an embodiment. FIG. 1B is a schematic cross-sectional view illustrating the light emitting element of FIG. 1A. FIG. 2A is a perspective view schematically illustrating a light emitting element in accordance with an embodiment. FIG. 2B is a schematic cross-sectional view illustrating the light emitting element of FIG. 2A. FIG. 3A is a perspective view schematically illustrating a light emitting element in accordance with an embodiment. FIG. 3B is a schematic cross-sectional view illustrating the light emitting element of FIG. 3A. FIG. 4A is a perspective view schematically illustrating a light emitting element in accordance with an embodiment. FIG. 4B is a schematic cross-sectional view illustrating the light emitting element of FIG. 4A.

For the sake of explanation, a light emitting element fabricated by an etching method will be described with reference to FIGS. 1A, 1B, 2A, 2B, 3A, and 3B, and then a light emitting element fabricated by a growth method will be described with reference to FIGS. 4A and 4B. In an embodiment, the type and/or shape of the light emitting element LD is not limited to the embodiments illustrated in FIGS. 1A, 1B, 2A, 2B, 3A, 3B, 4A, and 4B.

Referring to FIGS. 1A, 1B, 2A, 2B, 3A, and 3B, the light emitting element LD may include a first semiconductor layer 11, a second semiconductor layer 13, and an active layer 12 interposed between the first and second semiconductor layers 11 and 13. For example, the light emitting element LD may be implemented as an emission stack formed by successively stacking the first semiconductor layer 11, the active layer 12, and the second semiconductor layer 13.

In an embodiment, the light emitting element LD may extend in a direction. If a direction in which the light emitting element LD extends is defined as a longitudinal direction, the light emitting element LD may have one end (or first end) and a remaining end (or second end) in the extension direction. Any one of the first and second semiconductor layers 11 and 13 may be disposed in the one end of the light emitting element LD, and the other of the first and second semiconductor layers 11 and 13 may be disposed in the remaining end thereof.

The light emitting element LD may have various shapes. For example, the light emitting element LD may have a rod-like shape or a bar-like shape extending in the longitudinal direction (i.e., to have an aspect ratio greater than 1). In an embodiment, the length L of the light emitting element LD in the longitudinal direction may be greater than the diameter D (or a width of a cross-section) thereof. The light emitting element LD may include a light emitting diode fabricated to have a small size, e.g., with a length L and/or a diameter D corresponding to the microscale or the nanoscale. In various embodiments, the shape and size of the light emitting element LD may be changed so as to meet requirements (or design conditions) of a lighting device or a self-light emissive display device.

The first semiconductor layer 11 may include, for example, at least one n-type semiconductor layer. For instance, the first semiconductor layer 11 may include an n-type semiconductor layer which includes at least one semiconductor material of InAlGaN, GaN, AlGaN, InGaN, AlN, and InN and is doped with a first conductive dopant such as Si, Ge, or Sn. However, the material of the first semiconductor layer 11 is not limited to thereto, and various other materials may be used to form the first semiconductor layer 11.

The active layer 12 may be disposed on the first semiconductor layer 11 and have a single or multiple quantum well structure. The location of the active layer 12 may be changed in various ways depending on the type of the light emitting element LD. The active layer 12 may emit light having a wavelength ranging from about 400 nm to about 900 nm, and use a double heterostructure. In an embodiment, a cladding layer (not shown) doped with a conductive dopant may be formed on and/or under the active layer 12. For example, the cladding layer may be formed of an AlGaN layer or an InAlGaN layer. In an embodiment, a material such as AlGaN or InAlGaN may be used to form the active layer 12, and various other materials may be used to form the active layer 12.

If an electric field of a predetermined (or selected) voltage or more is applied to the opposite ends of the light emitting element LD, the light emitting element LD emits light by coupling of electron-hole pairs in the active layer 12. Since light emission of the light emitting element LD may be controlled based on the foregoing principle, the light emitting element LD may be used as a light source of various light emitting devices including a pixel of the display device.

The second semiconductor layer 13 may be disposed on the active layer 12 and include a semiconductor layer having a type different from that of the first semiconductor layer 11. For example, the second semiconductor layer 13 may include at least one p-type semiconductor layer. For instance, the second semiconductor layer 13 may include a p-type semiconductor layer which includes at least one semiconductor material of InAlGaN, GaN, AlGaN, InGaN, AlN, and InN, and is doped with a second conductive dopant such as Mg. However, the material for forming the second semiconductor layer 13 is not limited thereto, and the second semiconductor layer 13 may be formed of various other materials.

In an embodiment, the first semiconductor layer 11 and the second semiconductor layer 13 may have different widths (or thicknesses) in the longitudinal direction (L) of the light emitting element LD. For example, the first semiconductor layer 11 may have a width (or a thickness) greater than that of the second semiconductor layer 13 in the longitudinal direction (L) of the light emitting element LD. Hence, as illustrated in FIGS. 1A to 3B, the active layer 12 of the light emitting element LD may be disposed at a position closer to an upper surface of the second semiconductor layer 13 than to a lower surface of the first semiconductor layer 11.

In an embodiment, the light emitting element LD may further include an additional electrode 15 disposed on the second semiconductor layer 13, as well as the first semiconductor layer 11, the active layer 12, and the second semiconductor layer 13. In an embodiment, as shown in FIGS. 3A and 3B, the light emitting element LD may further include an additional electrode 16 disposed on an end of the first semiconductor layer 11.

Although each of the additional electrodes 15 and 16 may be an ohmic contact electrode, the disclosure is not limited thereto, and it may be a Schottky contact electrode depending on embodiments. Furthermore, each of the additional electrodes 15 and 16 may include metal or metallic oxide. For example, chromium (Cr), titanium (Ti), aluminum (Al), gold (Au), nickel (Ni), ITO, and an oxide or alloy thereof may be used alone or in combination. However, the disclosure is not limited thereto.

Materials included in each of the additional electrodes 15 and 16 may be equal to or different from each other. The additional electrodes 15 and 16 may be transparent or semitransparent. Therefore, light generated from the light emitting element LD may pass through the additional electrodes 15 and 16 and then be emitted outside the light emitting element LD. In some embodiments, in case that light generated from the light emitting element LD is emitted outside the light emitting element LD through area portion other than the opposite ends of the light emitting element LD rather than passing through the additional electrodes 15 and 16, the additional electrodes 15 and 16 may include opaque metal.

In an embodiment, the light emitting element LD may further include an insulating layer 14. However, in some embodiments, the insulating layer 14 may be omitted, or may be provided to cover only some of the first semiconductor layer 11, the active layer 12, and the second semiconductor layer 13.

The insulating layer 14 may prevent the active layer 12 from short-circuiting due to making contact with a conductive material except the first semiconductor layer 11 and the second semiconductor layer 13. Furthermore, thanks to the insulating layer 14, occurrence of a defect on the surface of the light emitting element LD may be minimized, and thus the lifespan and efficiency of the light emitting element LD may be improved. In case that light emitting elements LD are disposed in close contact with each other, the insulating layer 14 may prevent an undesired short circuit from occurring between the light emitting elements LD. It is not limited whether the insulating layer 14 is provided, so long as the active layer 12 may be prevented from short-circuiting with external conductive material.

As illustrated in FIGS. 1A and 1B, the insulating layer 14 may be provided in a shape enclosing an outer circumferential surface of the emission stack including the first semiconductor layer 11, the active layer 12, the second semiconductor layer 13, and the additional electrode 15. For the sake of explanation, FIG. 1A illustrates the insulating layer 14 a portion of which has been removed. The first semiconductor layer 11, the active layer 12, the second semiconductor layer 13, and the additional electrode 15 that are included in the light emitting element LD may be enclosed by the insulating layer 14.

Although in the above-mentioned embodiment the insulating layer 14 has been described as enclosing the overall outer circumferential surface of the first semiconductor layer 11, the active layer 12, the second semiconductor layer 13, and the additional electrode 15, the disclosure is not limited thereto.

In some embodiments, as illustrated in FIGS. 2A and 2B, the insulating layer 14 may enclose the respective outer circumferential surfaces of the first semiconductor layer 11, the active layer 12, and the second semiconductor layer 13, and may not enclose the entirety of the outer circumferential surface of the additional electrode 15 disposed on the second semiconductor layer 13 or may enclose only a portion of the outer circumferential surface of the additional electrode 15 without enclosing the other portion of the outer circumferential surface of the additional electrode 15. The insulating layer 14 may allow at least the opposite ends of the light emitting element LD to be exposed to the outside. For example, the insulating layer 14 may allow not only the additional electrode 15 disposed on one end of the second semiconductor layer 13 but also one end of the first semiconductor layer 11 to be exposed to the outside. In an embodiment, as illustrated in FIGS. 3A and 3B, in case that the additional electrodes 15 and 16 are disposed at the respective opposite ends of the light emitting element LD, the insulating layer 14 may allow at least area portion of each of the additional electrodes 15 and 16 to be exposed to the outside. As another example, the insulating layer 14 may not be provided.

In an embodiment, the insulating layer 14 may include a transparent insulating material. For example, the insulating layer 14 may include at least one insulating material selected from the group consisting of $SiO_2$, $Si_3N_4$, $Al_2O_3$, and $TiO_2$, but the disclosure is not limited thereto. In other words, various materials having insulating properties may be employed.

If the insulating layer 14 is provided in the light emitting element LD, the active layer 12 may be prevented from short-circuiting with a first and/or second electrode, which is not illustrated in the drawings. Furthermore, thanks to the insulating layer 14, occurrence of a defect in the surface of the light emitting element LD may be minimized, whereby the lifespan and efficiency of the light emitting element LD may be improved. In case that light emitting elements LD are disposed in close contact with each other, the insulating layer 14 may prevent an undesired short circuit from occurring between the light emitting elements LD.

The light emitting element LD may be employed as a light source for various display devices. The light emitting element LD may be fabricated by a surface treatment process. For example, the light emitting element LD may be surface-treated so that, in case that light emitting elements LD are mixed with a fluidic solution (or solvent) and then supplied to each emission area (e.g., an emission area of each pixel or an emission area of each sub-pixel), the light emitting elements LD may be evenly distributed rather than unevenly aggregating in the solution.

A light emitting device including the light emitting element LD described above may be used not only in a display device but also in various devices which requires a light source. For instance, in case that light emitting elements LD are disposed in the emission area of each pixel of a display panel, the light emitting elements LD may be used as a light source of the pixel. However, the application field of the light emitting element LD is not limited to the above-mentioned examples. For example, the light emitting element LD may also be used in other types of devices such as a lighting device, which requires a light source.

A light emitting element LD fabricated by the growth method will be described with reference to FIGS. 4A and 4B.

The following description of the light emitting element LD fabricated by the growth method will be focused on differences from the above-mentioned embodiments, and components of the light emitting element LD that are not separately explained in the following description may comply with those of the preceding embodiments. The same reference numerals will be used to designate the same components, and similar reference numerals will be used to designate similar components.

Referring to FIGS. 4A and 4B, the light emitting element LD in accordance with an embodiment may include a first semiconductor layer 11, a second semiconductor layer 13, and an active layer 12 interposed between the first and second semiconductor layers 11 and 13. In some embodiments, the light emitting element LD may include an emission pattern 10 having a core-shell structure. The emission pattern 10 may include a first semiconductor layer 11 disposed in a central portion of the light emitting element LD, an active layer 12 which encloses at least one side of the first semiconductor layer 11, a second semiconductor layer 13 which encloses at least one side of the active layer 12, and an additional electrode 15 which encloses at least one side of the second semiconductor layer 13.

The light emitting element LD may be formed in a polypyramid shape extending in a direction. For example, the light emitting element LD may have a hexagonal pyramid shape. If the direction in which the light emitting element LD extends is defined as a longitudinal direction (L), the light emitting element LD may have an end (or a lower end) and a remaining end (or an upper end) in the longitudinal direction (L). A portion of any of the first and second semiconductor layers 11 and 13 on the one end (or the lower end) of the light emitting element LD may be exposed to the outside. A portion of the other one of the first and second semiconductor layers 11 and 13 on the remaining end (or the upper end) of the light emitting element LD may be exposed to the outside. For example, a portion of the first semiconductor layer 11 on the one end (or the lower end) of the light emitting element LD may be exposed, and a portion of the second semiconductor layer 13 on the remaining end (or the upper end) of the light emitting element LD may be exposed. In an embodiment, in case that the light emitting element LD includes the additional electrode 15, a portion of the additional electrode 15 that encloses at least one side of the second semiconductor layer 13 on the remaining end (or the upper end) of the light emitting element LD may be exposed.

In an embodiment, the first semiconductor layer 11 may be disposed in a core, for example, a central (or middle) portion, of the light emitting element LD. The light emitting element LD may have a shape corresponding to the shape of the first semiconductor layer 11. For instance, if the first semiconductor layer 11 has a hexagonal pyramid shape, the light emitting element LD and the emission pattern 10 each may also have a hexagonal pyramid shape.

The active layer 12 may be provided and/or formed to enclose the outer circumferential surface of the first semiconductor layer 11 in the longitudinal direction (L) of the light emitting element LD. In detail, the active layer 12 may be provided and/or formed in a shape enclosing area portion of the first semiconductor layer 11, other than a lower end of the opposite ends of the first semiconductor layer 11, in the longitudinal direction (L) of the light emitting element LD.

The second semiconductor layer 13 may be provided and/or formed in a shape enclosing the active layer 12 in the longitudinal direction (L) of the light emitting element LD, and may include a semiconductor layer having a type different from that of the first semiconductor layer 11. For example, the second semiconductor layer 13 may include at least one p-type semiconductor layer.

In an embodiment, the light emitting element LD may include the additional electrode 15 that encloses at least one side of the second semiconductor layer 13. The additional electrode 15 may be an ohmic contact electrode or a Schottky contact electrode which is electrically connected to the second semiconductor layer 13, but the disclosure is not limited thereto.

As described above, the light emitting element LD may have a hexagonal pyramid shape with the opposite ends protruding outward, and may be implemented as the emission pattern 10 with a core-shell structure including the first semiconductor layer 11 provided in the central portion thereof, the active layer 12 which encloses the first semiconductor layer 11, the second semiconductor layer 13 which encloses the active layer 12, and the additional electrode 15 which encloses the second semiconductor layer 13. The first semiconductor layer 11 may be disposed in the one end (or the lower end) of the light emitting element LD having a hexagonal pyramid shape, and the additional electrode 15 may be disposed in the remaining end (or the upper end) of the light emitting element LD.

In an embodiment, the light emitting element LD may further include an insulating layer 14 provided on the outer circumferential surface of the emission pattern 10 having a core-shell structure. The insulating layer 14 may include a transparent insulating material.

Figure 5:
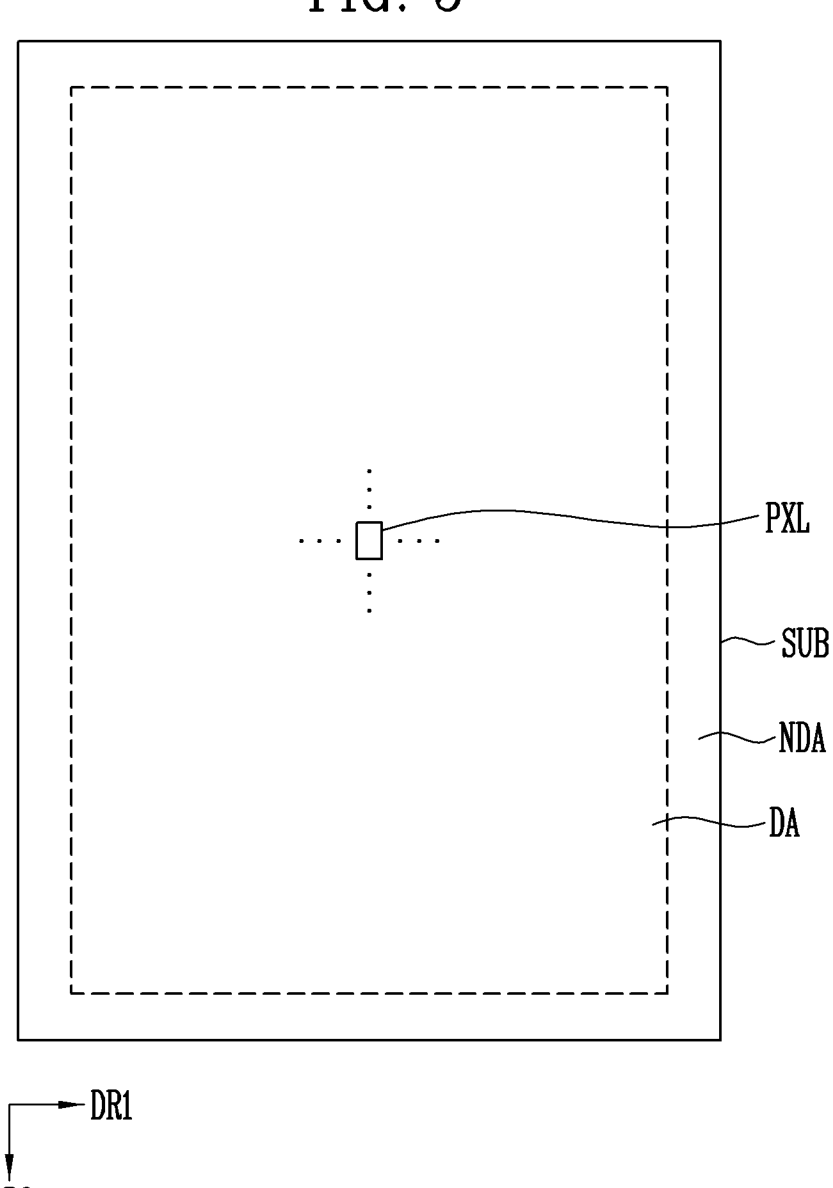
FIG. 5 illustrates a display device in accordance with an embodiment of the disclosure, and particularly, is a schematic plan view of a display device using, as a light source, any one of the light emitting elements illustrated in FIGS. 1A, 1B, 2A, 2B, 3A, 3B, 4A, and 4B.
Figure 5:
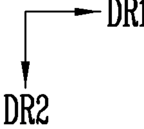

FIG. 5 illustrates a display device in accordance with an embodiment, and is a schematic plan view of a display device using, as a light source, one of the light emitting elements illustrated in FIGS. 1A, 1B, 2A, 2B, 3A, 3B, 4A, and 4B.

For the sake of explanation, FIG. 5 schematically illustrates the structure of the display device, focusing on a display area DA in which an image is displayed. In some embodiments, although not illustrated in the drawings, at least one driving circuit (e.g., a scan driver and a data driver) and/or lines may be further provided in the display device.

Referring to FIGS. 1A, 1B, 2A, 2B, 3A, 3B, 4A, 4B, and 5, the display device in accordance with an embodiment may include a substrate SUB, pixels PXL which are provided on the substrate SUB and each of which includes at least one light emitting element LD, a driver (not illustrated) which is provided on the substrate SUB and configured to drive the pixels PXL, and a line component (not illustrated) which electrically connects the pixels PXL to the driver.

The display device may be classified into a passive-matrix type display device and an active-matrix type display device according to a method of driving the light emitting element LD. For example, in case that the display device is of an active matrix type, each of the pixels PXL may include a driving transistor that controls the amount of current to be supplied to the light emitting element LD, and a switching transistor that transmits a data signal to the driving transistor.

Recently, active-matrix type display devices capable of selectively turning on each pixel PXL taking into account the resolution, the contrast, and the working speed have been mainstreamed. However, the disclosure is not limited thereto. For example, passive-matrix type display devices in which pixels PXL may be turned on by groups may also employ components (e.g., first and second electrodes) for driving the light emitting element LD.

The substrate SUB may include a display area DA and a non-display area NDA.

In an embodiment, the display area DA may be disposed in a central portion of the display device, and the non-display area NDA may be disposed in a perimetric portion of the display device in such a way as to enclose the display area DA. The locations of the display area DA and the non-display area NDA are not limited thereto, and the locations thereof may be changed.

The display area DA may be an area in which the pixels PXL for displaying an image are provided. The non-display area NDA may be an area in which the driver for driving the pixels PXL and some of the line component for electrically connecting the pixels PXL to the driver are provided.

The display area DA may have various shapes. For example, the display area DA may be provided in a closed polygonal shape including linear sides. As another example, the display area DA may be provided in a circular and/or elliptical shape including a curved side. As a still another example, the display area DA may be provided in various shapes such as a semi-circular shape and a semi-elliptical shape including a linear side and a curved side.

The non-display area NDA may be provided in at least one side of the display area DA. In an embodiment, the non-display area NDA may enclose the periphery (or the edge) of the display area DA.

The substrate SUB may include a transparent insulating material to allow light transmission.

The substrate SUB may be a rigid substrate. For example, the rigid substrate may be one of a glass substrate, a quartz substrate, a glass ceramic substrate, and a crystalline glass substrate.

The substrate SUB may be a flexible substrate. The flexible substrate may be either a film substrate or a plastic substrate which includes a polymeric organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, materials forming (or constituting) the substrate SUB may be changed, and include, for example, fiber reinforced plastic (FRP).

A portion of the substrate SUB may be provided as the display area DA in which the pixels PXL are disposed, and a remaining portion thereof may be provided in the non-display area NDA. For example, the substrate SUB may include the display area DA including pixel areas in which the respective pixels PXL are formed, and the non-display area NDA disposed around the display area DA.

The pixels PXL may be provided in the display area DA on the substrate SUB. In an embodiment, the pixels PXL may be arranged in the display area DA in a stripe or PenTile® arrangement structure, but the disclosure is not limited thereto.

Each of the pixels PXL may include at least one light emitting element LD configured to be driven in response to a corresponding scan signal and a corresponding data signal. The light emitting element LD may have a small size corresponding to the micrometer scale or the nanometer scale and be connected in parallel to light emitting elements LD disposed adjacent thereto, but the disclosure is not limited thereto. The light emitting element LD may form a light source of each pixel PXL.

Each of the pixels PXL may include at least one light source which is driven by a predetermined signal (e.g., a scan signal and a data signal) and/or a predetermined power supply (e.g., a first driving power supply and a second driving power supply). For example, each of the pixels PXL may include a light emitting element LD illustrated in each of the embodiments of FIGS. 1A to 4B, e.g., at least one subminiature light emitting element LD having a small size corresponding to the nanometer scale or the micrometer scale. However, in embodiments, the type of the light emitting element LD which may be used as a light source of each of the pixels PXL is not limited thereto.

In an embodiment, the color, the type, and/or the number of pixels PXL are not particularly limited. For example, the color of light emitted from each pixel PXL may be changed in various ways.

The driver may provide a predetermined signal and a predetermined power voltage to each of the pixels PXL through the line component and thus control the operation of the pixel PXL. For the sake of explanation, in FIG. 5, the line component is omitted.

The driver may include a scan driver configured to provide scan signals to the pixels PXL through scan lines, an emission driver configured to provide emission control signals to the pixels PXL through emission control lines, a data driver configured to provide data signals to the pixels PXL through data lines, and a timing controller. The timing controller may control the scan driver, the emission driver, and the data driver.

FIGS. 6A to 6E are schematic diagrams of equivalent circuits illustrating various embodiments of an electrical connection relationship of components included in a pixel illustrated in FIG. 5.

For example, FIGS. 6A to 6E illustrate different embodiments of the electrical connection relationship of components included in a pixel PXL which may be employed in an active display device. However, the types of the components included in the pixel PXL to which embodiments may be applied are not limited thereto.

A s illustrated in FIGS. 6A to 6E, not only the components included in each of the pixels PXL illustrated in FIG. 5 but also an area in which the components are provided is embraced in the definition of the term "pixel PXL". In an embodiment, each pixel PXL illustrated in FIGS. 6A to 6E may be any one of the pixels PXL provided in the display device of FIG. 5. The pixels PXL may have structures substantially equal or similar to each other.

Referring to FIGS. 1A to 4B, 5, and 6A to 6E, each pixel PXL may include an emission part EMU configured to generate light having a luminance corresponding to a data signal. The pixel PXL may selectively further include a pixel circuit 144 configured to drive the emission part EMU.

In an embodiment, the emission part EMU may include light emitting elements LD connected in parallel between a first power line PL1 to which a first driving power supply VDD is applied and a second power line PL2 to which a second driving power supply VSS is applied. For example, the emission part EMU may include a first electrode EL1 (or "first alignment electrode") electrically connected to the first driving power supply VDD via the pixel circuit 144 and the first power line PL1, a second electrode EL2 (or "second alignment electrode") electrically connected to the second driving power supply VSS through the second power line PL2, and light emitting elements LD electrically connected in parallel to each other in a same direction between the first and second electrodes EL1 and EL2. In an embodiment, the first electrode EL1 may be an anode electrode, and the second electrode EL2 may be a cathode electrode.

In an embodiment, each of the light emitting elements LD included in the emission part EMU may include a first end electrically connected to the first driving power supply VDD through the first electrode EL1, and a second end electrically connected to the second driving power supply VSS through the second electrode EL2. The first driving power supply VDD and the second driving power supply VSS may have different potentials. For example, the first driving power supply VDD may be set as a high-potential power supply, and the second driving power supply VSS may be set as a low-potential power supply. A difference in potential between the first and second driving power supplies VDD and VSS may be set to a value equal to or greater than a threshold voltage of the light emitting elements LD during a light emission period of the pixel PXL.

As described above, the light emitting elements LD that are electrically connected in parallel to each other in the same direction (e.g., in a forward direction) between the first electrode EL1 and the second electrode EL2 to which voltages having different potentials are respectively supplied, may form respective valid light sources. The valid light sources may collectively to form the emission part EMU of the pixel PXL.

The light emitting elements LD of the emission part EMU may emit light having a luminance corresponding to driving current supplied thereto through the pixel circuit 144. For example, during each frame period, the pixel circuit 144 may supply driving current corresponding to a grayscale value of corresponding frame data to the emission part EMU. The driving current supplied to the emission part EMU may be divided and flow into the light emitting elements LD electrically connected to each other in the same direction. Hence, each of the light emitting elements LD may emit light having a luminance corresponding to current applied thereto, so that the emission part EMU may emit light having a luminance corresponding to the driving current.

Figure 6A:
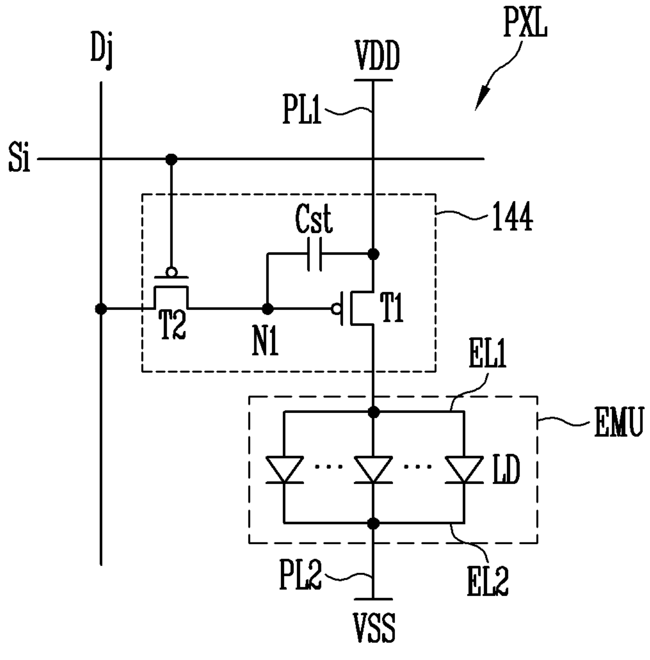
FIGS. 6A to 6E are schematic diagrams of equivalent circuits illustrating various embodiments of an electrical connection relationship of components included in a pixel illustrated in FIG. 5.
Figure 6B:
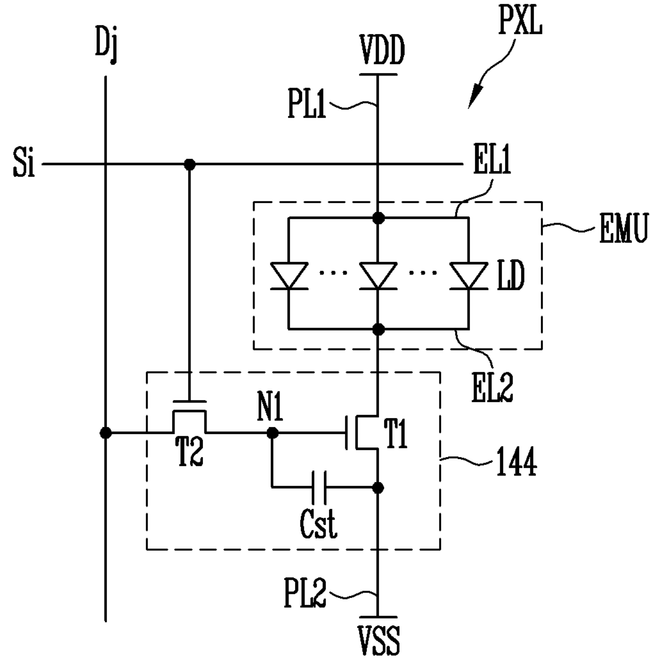
Figure 6C:
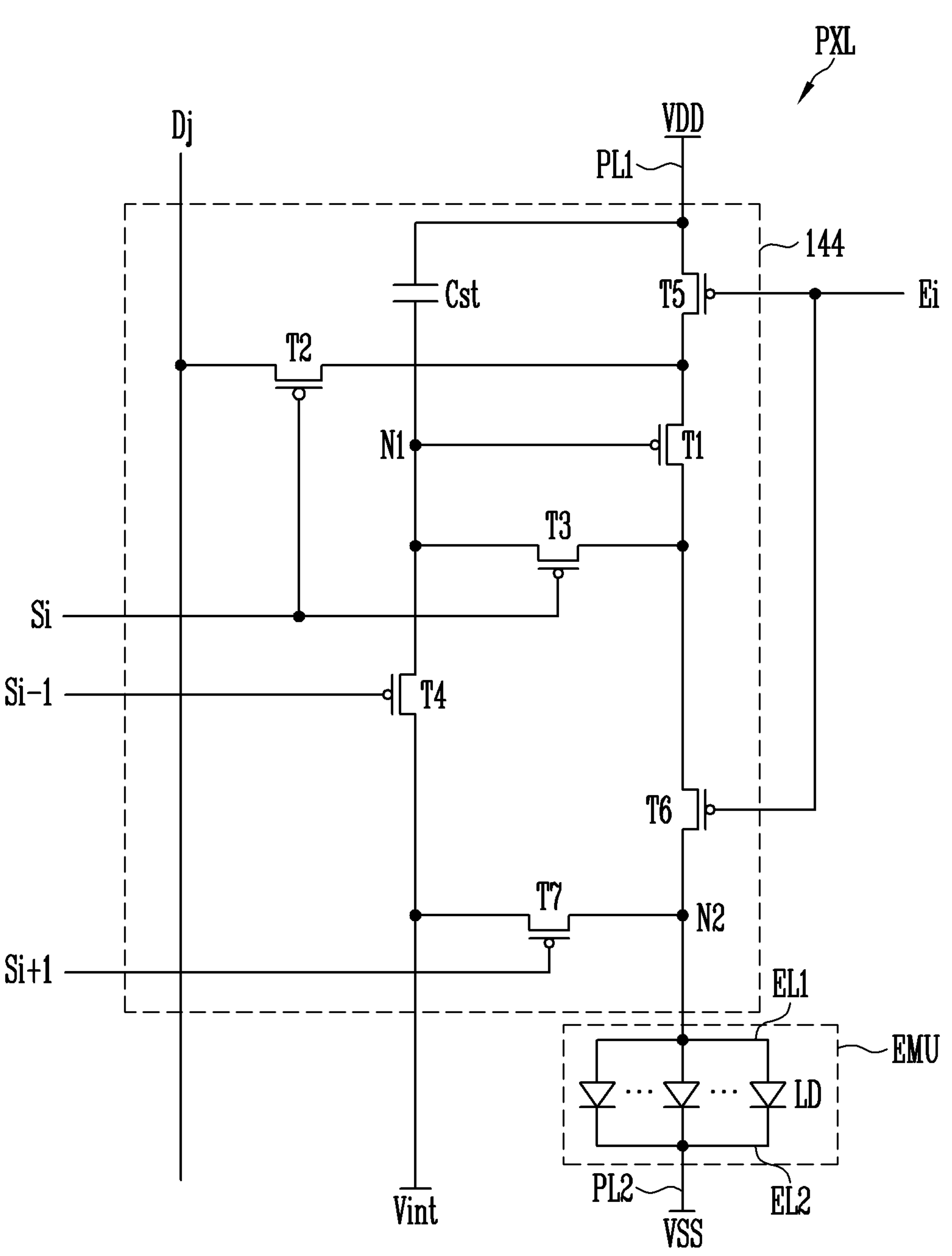
Figure 6D:
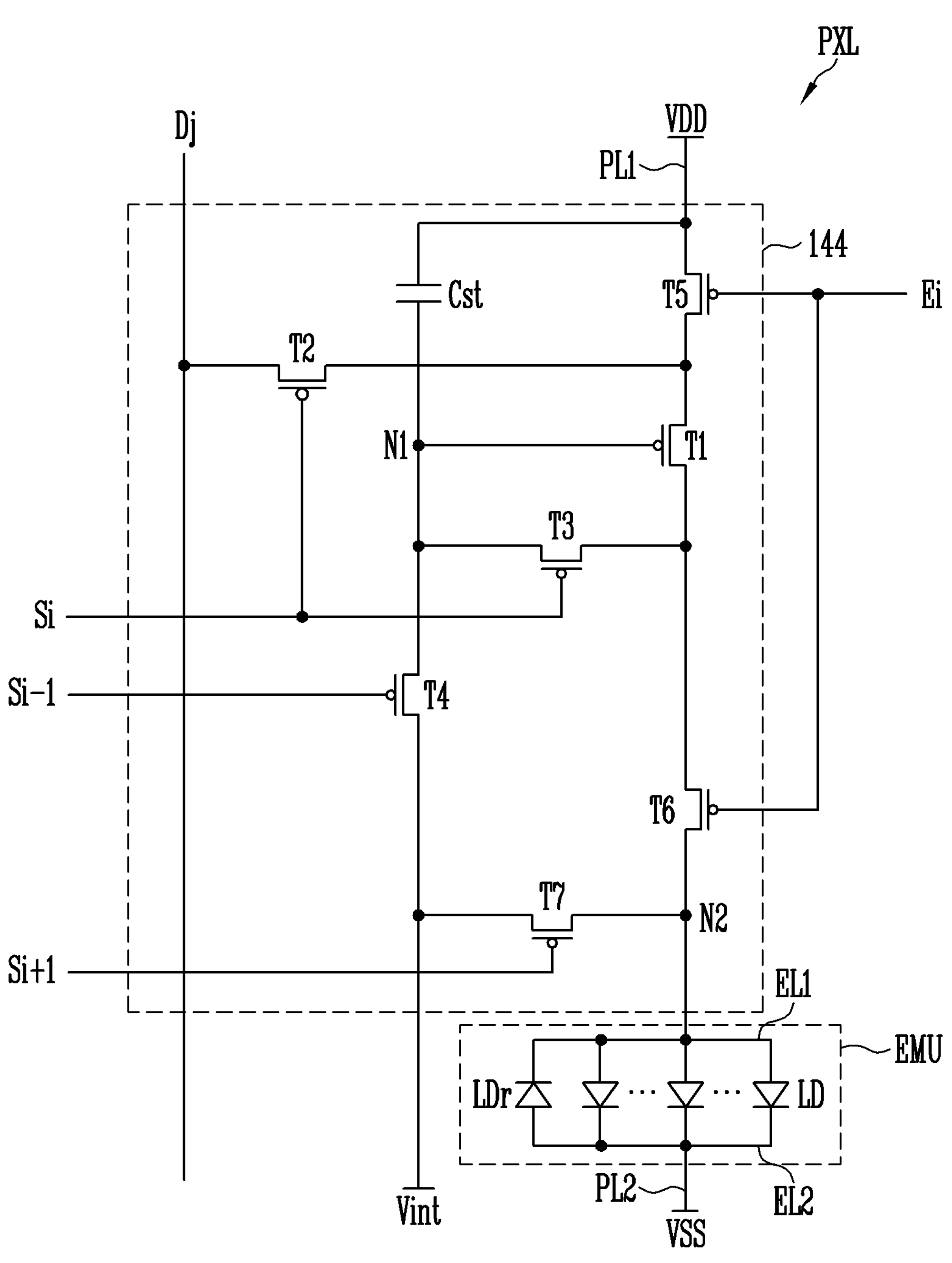
Figure 6E:
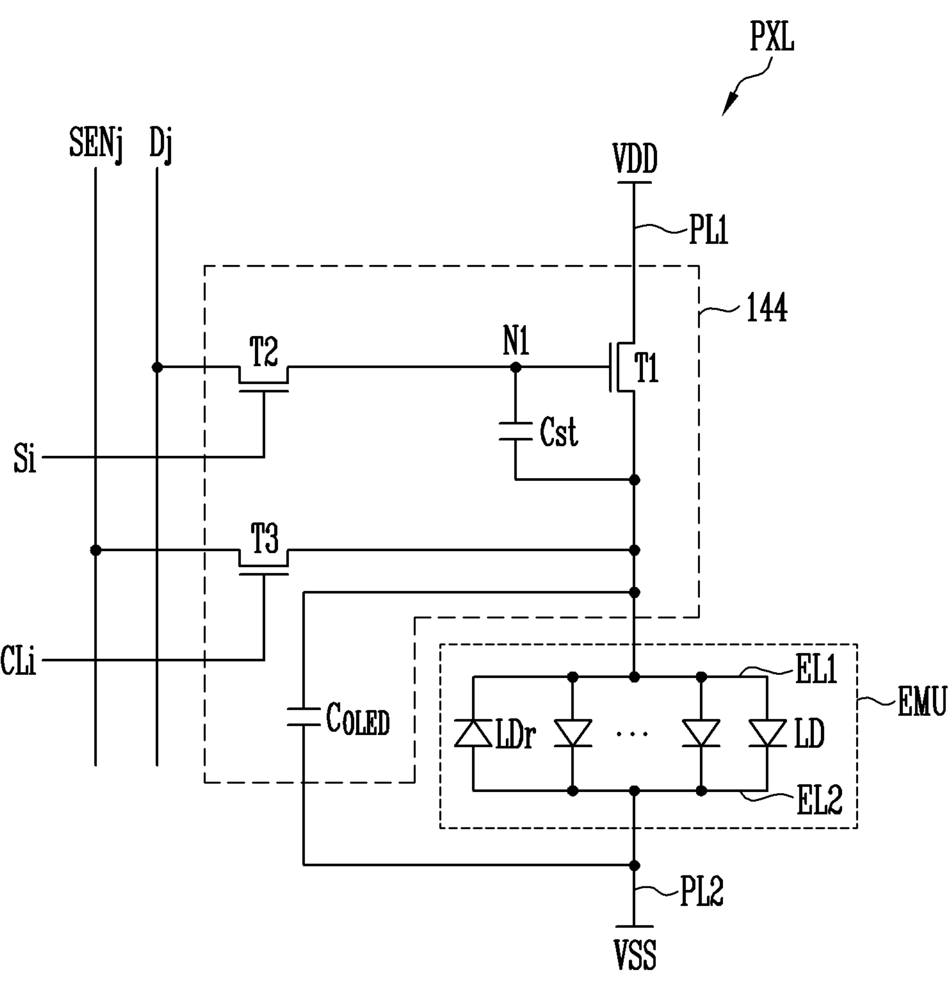

Although FIGS. 6A to 6E illustrate embodiments in which the light emitting elements LD are electrically connected to each other in the same direction between the first and second driving power supplies VDD and VSS, the disclosure is not limited thereto. In an embodiment, the emission part EMU may further include at least one invalid light source, as well as the light emitting elements LD that form the respective valid light sources. For example, as illustrated in FIGS. 6D and 6E, at least one reverse light emitting element LDr may be further electrically connected between the first and second electrodes EL1 and EL2 of the emission part EMU. The reverse light emitting element LDr may be connected in parallel to the light emitting elements LD that form the valid light sources, between the first and second electrodes EL1 and EL2. The reverse light emitting element LDr may be electrically connected between the first and second electrodes EL1 and EL2 in a direction opposite to that of the light emitting elements LD. Even in case that a predetermined driving voltage (e.g., a normal directional driving voltage) is applied between the first and second electrodes EL1 and EL2, the reverse light emitting element LDr remains disabled. Hence, current substantially does not flow through the reverse light emitting element LDr.

The pixel circuit 144 may be electrically connected to a scan line Si and a data line Dj of the corresponding pixel PXL. For example, if the pixel PXL is disposed in an i-th row (where i is a natural number) and a j-th column (where j is a natural number) of the display area DA, the pixel circuit 144 of the pixel PXL may be electrically connected to an i-th scan line Si and a j-th data line Dj of the display area DA. In an embodiment, the pixel circuit 144 may include first and second transistors T1 and T2, and a storage capacitor Cst, as illustrated in FIGS. 6A and 6B. The structure of the pixel circuit 144 is not limited to the embodiments illustrated in FIGS. 6A and 6B.

First, referring to FIG. 6A, the pixel circuit 144 may include first and second transistors T1 and T2 and a storage capacitor Cst.

A first terminal of the second transistor T2 (a switching transistor) may be electrically connected to the data line Dj, and a second terminal thereof may be electrically connected to a first node N1. The first terminal and the second terminal of the second transistor T2 are different terminals, and, for example, if the first terminal is a source electrode, the second terminal is a drain electrode. A gate electrode of the second transistor T2 may be electrically connected to a scan line Si.

In case that a scan signal having a voltage (e.g., a low-level voltage) capable of turning on the second transistor T2 is supplied from the scan line Si, the second transistor T2 is turned on to electrically connect the data line Dj with the first node N1. A data signal of a corresponding frame is supplied to the data line Dj, whereby the data signal is transmitted to the first node N1. The data signal transmitted to the first node N1 may be charged to the storage capacitor Cst.

A first terminal of the first transistor T1 (a driving transistor) may be electrically connected to the first driving power supply VDD, and a second terminal thereof may be electrically connected to the first electrode EL1 for the light emitting elements LD. A gate electrode of the first transistor T1 may be electrically connected to the first node N1. Thus, the first transistor T1 may control the amount of driving current to be supplied to the light emitting elements LD in response to the voltage of the first node N1.

An electrode of the storage capacitor Cst may be electrically connected to the first driving power supply VDD, and a remaining electrode thereof may be electrically connected to the first node N1. The storage capacitor Cst is charged with a voltage corresponding to a data signal supplied to the first node N1, and maintains the charged voltage until a data signal of a subsequent frame is supplied thereto.

FIGS. 6A and 6B each illustrate the pixel circuit 144 including the second transistor T2 configured to transmit a data signal to the pixel PXL, the storage capacitor Cst configured to store the data signal, and the first transistor T1 configured to supply driving current corresponding to the data signal to the light emitting elements LD.

However, the disclosure is not limited thereto, and the structure of the pixel circuit 144 may be changed in various ways. For example, the pixel circuit 144 may further include at least one transistor element such as a transistor element configured to compensate for the threshold voltage of the first transistor T1, a transistor element configured to initialize the first node N1, and/or a transistor element configured to control a light emission time of the light emitting elements LD, or other circuit elements such as a boosting capacitor for boosting the voltage of the first node N1.

Furthermore, although FIG. 6A illustrates that the transistors, e.g., the first and second transistors T1 and T2, included in the pixel circuit 144 have been illustrated as being formed of P-type transistors, the disclosure is not limited thereto. In other words, at least one of the first and second transistors T1 and T2 included in the pixel circuit 144 may be changed to an N-type transistor.

Referring to FIGS. 1A to 4B, 5, and 6B, the first and second transistors T1 and T2 in accordance with an embodiment may be formed of N-type transistors. The configuration and operation of the pixel circuit 144 illustrated in FIG. 6B, other than a change in connection positions of some components due to a change in the type of transistor, are similar to those of the pixel circuit 144 of FIG. 6A. Therefore, descriptions thereof will be simplified.

In an embodiment, the pixel circuit 144 illustrated in FIG. 6B may include first and second transistors T1 and T2 formed of N-type transistors, and a storage capacitor Cst. In case that the first and second transistors T1 and T2 are formed of N-type transistors, the emission part EMU may be electrically connected between the first driving power supply VDD and the pixel circuit 144 to secure stabilization of the storage capacitor Cst configured to be charged with a voltage corresponding to a data signal supplied to the first node N1. However, the disclosure is not limited thereto. In an embodiment, the emission part EMU illustrated in FIG. 6B may be electrically connected between the pixel circuit 144 and the second driving power supply VSS. In an embodiment, the configuration of the pixel circuit 144 is not limited to the embodiments illustrated in FIGS. 6A and 6B. For example, the pixel circuit 144 may be configured in the same manner as that of the embodiments illustrated in FIGS. 6C and 6D.

As illustrated in FIGS. 6C and 6D, the pixel circuit 144 may be electrically connected to a scan line Si and a data line Dj of the pixel PXL. For example, if the pixel PXL is disposed in an i-th row and a j-th column of the display area DA, the pixel circuit 144 of the pixel PXL may be electrically connected to an i-th scan line Si and a j-th data line Dj of the display area DA.

In an embodiment, the pixel circuit 144 may be further electrically connected to at least another scan line. For example, the pixel PXL disposed in the i-th row of the display area DA may be further electrically connected to an i−1-th scan line Si−1 and/or an i+1-th scan line Si+1. In an embodiment, the pixel circuit 144 may be electrically connected not only to the first and second driving power supplies VDD and VSS but also to a third power supply. For example, the pixel circuit 144 may also be electrically connected to an initialization power supply Vint.

The pixel circuit 144 may include first to seventh transistors T1 to T7, and a storage capacitor Cst.

An electrode, e.g., a source electrode, of the first transistor T1 (the driving transistor) may be electrically connected to the first driving power supply VDD via the fifth transistor T5, and another electrode thereof, e.g., a drain electrode, may be electrically connected to one ends of light emitting elements LD via the sixth transistor T6. A gate electrode of the first transistor T1 may be electrically connected to a first node N1. The first transistor T1 may control driving current flowing between the first driving power supply VDD and the second driving power supply VSS via the light emitting elements LD in response to the voltage of the first node N1.

The second transistor T2 (the switching transistor) may be electrically connected between the j-th data line Dj electrically connected to the pixel PXL and the source electrode of the first transistor T1. A gate electrode of the second transistor T2 may be electrically connected to the i-th scan line Si electrically connected to the pixel PXL. In case that a scan signal having a gate-on voltage (e.g., a low-level voltage) is supplied from the i-th scan line Si, the second transistor T2 may be turned on to electrically connect the j-th data line Dj to the source electrode of the first transistor T1. Hence, if the second transistor T2 is turned on, a data signal supplied from the j-th data line Dj may be transmitted to the first transistor T1.

The third transistor T3 may be electrically connected between the drain electrode of the first transistor T1 and the first node N1. A gate electrode of the third transistor T3 may be electrically connected to the i-th scan line Si. In case that a scan signal having a gate-on voltage is supplied from the i-th scan line Si, the third transistor T3 may be turned on to electrically connect the drain electrode of the first transistor T1 to the first node N1.

The fourth transistor T4 may be electrically connected between the first node N1 and an initialization power line to which the initialization power supply Vint is to be applied. A gate electrode of the fourth transistor T4 may be electrically connected to a preceding scan line, e.g., the i−1-th scan line Si−1. In case that a scan signal having a gate-on voltage is supplied to the i−1-th scan line Si−1, the fourth transistor T4 may be turned on so that the voltage of the initialization power supply Vint may be transmitted to the first node N1. The initialization power supply Vint may have a voltage equal to or less than the minimum voltage of the data signal.

The fifth transistor T5 may be electrically connected between the first driving power supply VDD and the first transistor T1. A gate electrode of the fifth transistor T5 may be electrically connected to a corresponding emission control line, e.g., an i-th emission control line Ei. The fifth transistor T5 may be turned off in case that an emission control signal having a gate-off voltage is supplied to the i-th emission control line Ei, and may be turned on in other cases.

The sixth transistor T6 may be electrically connected between the first transistor T1 and the first ends of the light emitting elements LD. A gate electrode of the sixth transistor T6 may be electrically connected to the i-th emission control line Ei. The sixth transistor T6 may be turned off in case that an emission control signal having a gate-off voltage is supplied to the i-th emission control line Ei, and may be turned on in other cases.

The seventh transistor T7 may be electrically connected between the initialization power line and a second node N2, which is electrically connected to the first ends of the light emitting elements LD. A gate electrode of the seventh transistor T7 may be electrically connected to one of scan lines of a subsequent set, e.g., to the i+1-th scan line Si+1. In case that a scan signal having a gate-on voltage is supplied to the i+1-th scan line Si+1, the seventh transistor T7 may be turned on so that the voltage of the initialization power supply Vint may be supplied to the first ends of light emitting elements LD.

The storage capacitor Cst may be electrically connected between the first driving power supply VDD and the first node N1. The storage capacitor Cst may store a voltage corresponding both to the data signal applied to the first node N1 during each frame period and to the threshold voltage of the first transistor T1.

Although in FIGS. 6C and 6D illustrate that the transistors, e.g., the first to seventh transistors T1 to T7, included in the pixel circuit 144 are formed of P-type transistors, the disclosure is not limited thereto. For example, at least one of the first to seventh transistors T1 to T7 may be changed to an N-type transistor.

In an embodiment, the configuration of the pixel circuit 144 is not limited to the embodiments illustrated in FIGS. 6A to 6D. For example, the pixel circuit 144 may be configured in the same manner as that of the embodiment shown in FIG. 6E.

As illustrated in FIG. 6E, the pixel circuit 144 may be further electrically connected to a control line CLi and a sensing line SENj. For example, the pixel circuit 144 of the pixel PXL disposed in the i-th row and the j-th column of the display area DA may be electrically connected to an i-th control line CLi and a j-th sensing line SENj of the display area DA. The pixel circuit 144 described above may further include a third transistor T3 as well as the first and second transistors T1 and T2 illustrated in FIGS. 6A and 6B.

The third transistor T3 is electrically connected between the first transistor T1 and the sensing line SENj. For example, an electrode of the third transistor T3 may be electrically connected to a terminal (e.g., a source electrode) of the first transistor T1 connected to the first electrode ELL and another electrode of the third transistor T3 may be electrically connected to the sensing line SENj. In case that the sensing line SENj is omitted, the other electrode of the third transistor T3 may be electrically connected to the data line Dj. A capacitor $C_{OLED}$ may be electrically connected between the first electrode EL1 and the second electrode EL2.

In an embodiment, the gate electrode of the third transistor T3 is electrically connected to the control line CLi. In case that the control line CLi is omitted, the gate electrode of the third transistor T3 may be electrically connected to the scan line Si. The third transistor T3 may be turned on by a control signal that has a gate-on voltage (e.g., a high-level voltage) and is supplied to the control cline CLi during a predetermined sensing period, so that the sensing line SENj and the second transistor T2 may be electrically connected to each other.

In an embodiment, the sensing period may be a period in which characteristic information of each of the pixels PXL disposed in the display area DA (e.g., a threshold voltage, etc. of the first transistor T1) are extracted. During the above-mentioned sensing period, the first transistor T1 may be turned on by supplying a predetermined reference voltage capable of turning on the first transistor T1 to the first node N1 through the data line Dj and the second transistor T2, or electrically connecting each pixel PXL to a current source or the like. Furthermore, the third transistor T3 may be turned on by supplying a control signal having a gate-on voltage to the third transistor T3, so that the first transistor T1 may be electrically connected to the sensing line SENj. Hence, the characteristic information of each pixel PXL that includes the threshold voltage, etc. of the first transistor T1 may be extracted through the sensing line SENj. The extracted characteristic information may be used to convert image data to compensate for a deviation in characteristics between the pixels PXL.

Although FIG. 6E illustrates an embodiment where all of the first to third transistors T1 to T3 are N-type transistors, the disclosure is not limited thereto. For example, at least one of the first to third transistors T1 to T3 may be changed to a P-type transistor. Furthermore, although FIG. 6E illustrates an embodiment where the emission part EMU is electrically connected between the pixel circuit 144 and the second driving power supply VSS, the emission part EMU may be electrically connected between the first driving power supply VDD and the pixel circuit 144.

Although FIGS. 6A to 6E illustrate embodiments in which all light emitting elements LD of each emission part EMU are electrically connected in parallel to each other, the disclosure is not limited thereto. In an embodiment, the emission part EMU may include at least one serial set including light emitting elements LD electrically connected in parallel to each other. In other words, the emission part EMU may be formed of a serial/parallel combination structure. The foregoing configuration will be described below with reference to FIGS. 7A to 7C.

The structure of the pixel PXL which may be applied to the disclosure is not limited to the embodiments illustrated in FIGS. 6A to 6E, and the corresponding pixel PXL may have various structures. In an embodiment, each pixel PXL may be configured in a passive light emitting display device, or the like. In this case, the pixel circuit 144 may be omitted, and the opposite ends of the light emitting elements LD included in the emission part EMU may be directly electrically connected to the scan lines Si−1, Si, and Si+1, the data line Dj, the first power line PL1 to which the first driving power supply VDD is to be applied, the second power line PL2 to which the second driving power supply VSS is to be applied, and/or a predetermined control line.

Figure 7A:
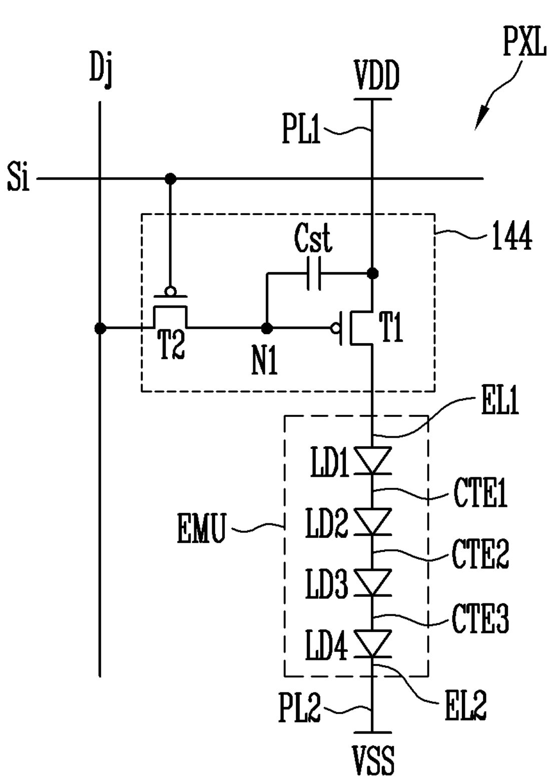
FIGS. 7A to 7C are schematic diagrams of equivalent circuits illustrating different embodiments of an electrical connection relationship of components included in a pixel illustrated in FIG. 5.
Figure 7B:
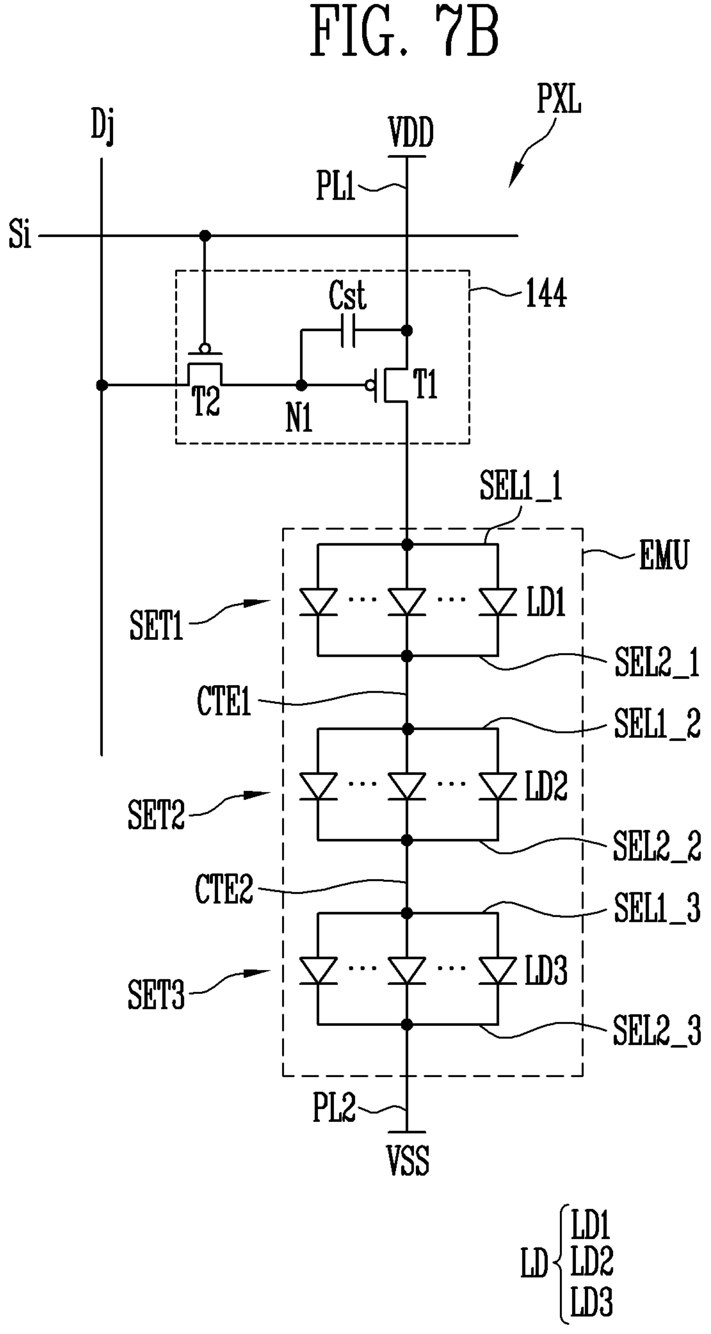
Figure 7C:
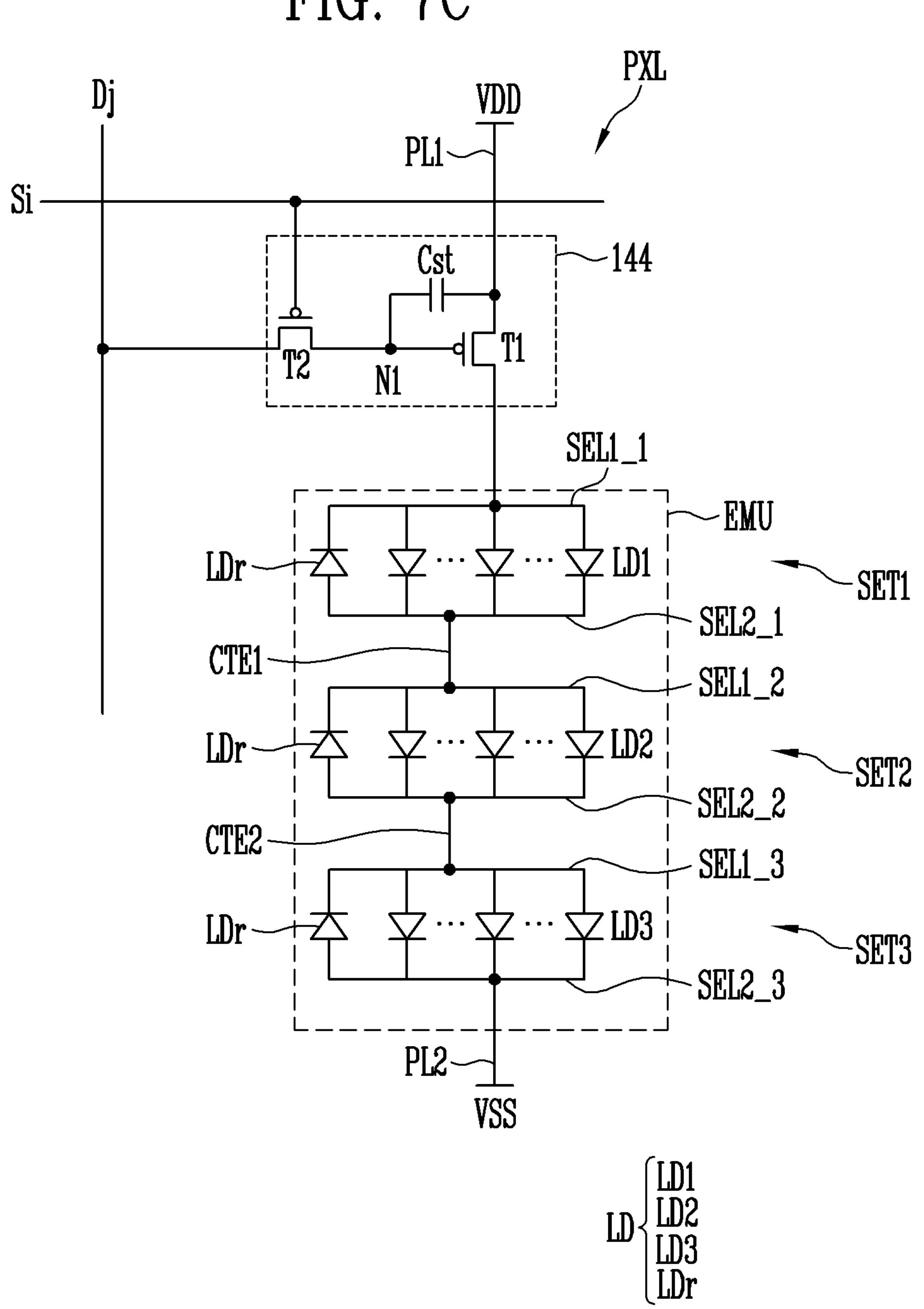

FIGS. 7A to 7C are schematic diagrams of equivalent circuits illustrating different embodiments of an electrical connection relationship of components included in a pixel illustrated in FIG. 5. As illustrated in FIGS. 7A to 7C, the emission part EMU of each pixel PXL may be configured to include serial sets which are successively electrically connected to each other. In the following descriptions of embodiments of FIGS. 7A to 7C, detailed explanations of components similar or equal to those of the embodiments of FIGS. 6A to 6E, e.g., detailed explanations of the pixel circuit 144, will be omitted to avoid redundant explanation.

First, referring to FIG. 7A, the emission part EMU may include light emitting elements LD electrically connected in series to each other. For example, the emission part EMU may include a first light emitting element LD1, a second light emitting element LD2, a third light emitting element LD3, and a fourth light emitting element LD4 which are electrically connected in series in a forward direction between the first driving power supply VDD and the second driving power supply VSS and thus form a valid light source. In the following embodiment, the term "light emitting element LD" or "light emitting elements LD" will be used to arbitrarily designate at least one light emitting element of the first to fourth light emitting elements LD1 to LD4 or collectively designate the first to fourth light emitting elements LD1 to LD4.

One end (e.g., a second semiconductor layer) of the first light emitting element LD1 may be electrically connected to the first driving power supply VDD by a first electrode ELL and a remaining end (e.g., a first semiconductor layer) of the first light emitting element LD1 may be electrically connected to one end (e.g., a second semiconductor layer) of the second light emitting element LD2 by a first intermediate electrode CTE1 electrically connected between first and second serial sets.

The one end of the second light emitting element LD2 may be electrically connected to the first intermediate electrode CTE1, and a remaining end thereof (e.g., a first semiconductor layer) may be electrically connected to one end (e.g., a second semiconductor layer) of the third light emitting element LD3 by a second intermediate electrode CTE2 electrically connected between the second serial set and a third serial set.

The one end of the third light emitting element LD3 may be electrically connected to the second intermediate electrode CTE2, and a remaining end thereof (e.g., a first semiconductor layer) may be electrically connected to one end (e.g., a second semiconductor layer) of the fourth light emitting element LD4 by a third intermediate electrode CTE3 connected between the third serial set and a fourth serial set.

The one end of the fourth light emitting element LD4 may be electrically connected to the third intermediate electrode CTE3, and a remaining end thereof (e.g., a first semiconductor layer) may be electrically connected to the second driving power supply VSS by a second electrode EL2.

As described above, the first to fourth light emitting elements LD1 to LD4 may be electrically connected in series between the first and second electrodes EL1 and EL2 of the emission part EMU of the pixel PXL.

In the case of the emission part EMU having a structure in which the light emitting elements LD are electrically connected in series to each other, a voltage to be applied between the first and second electrodes EL1 and EL2 may be increased, and the amount of driving current flowing through the emission part EMU may be reduced, compared to those of the emission part EMU having a structure in which the light emitting elements LD are electrically connected in parallel to each other. Therefore, in case that the emission part EMU of each pixel PXL has a serial structure, the power consumption of the display device may be reduced.

In an embodiment, at least one serial set may be provided in the form of including light emitting elements LD electrically connected in parallel to each other. In this case, the emission part EMU of each pixel PXL may be formed of a serial/parallel combination structure. For example, the emission part EMU may be configured as illustrated in FIGS. 7B and 7C.

Referring to FIGS. 7B and 7C, the emission part EMU of the pixel PXL may include serial sets which are successively electrically connected to each other between the first and second driving power supplies VDD and VSS. Each of the serial sets may include one or more light emitting elements LD which are electrically connected in the forward direction between two sub-electrodes of the corresponding serial set.

The emission part EMU may include first to third serial sets SET1 to SET3 which are successively electrically connected between the first and second driving power supplies VDD and VSS.

The first serial set SET1 may include at least one first light emitting element LD1 electrically connected between a 1-1-th sub-electrode SEL1_1 and a 2-1-th sub-electrode SEL2_1. For example, the first serial set SET1 may include the 1-1-th sub-electrode SEL1_1 electrically connected to the first driving power supply VDD via the pixel circuit 144, the 2-1-th sub-electrode SEL2_1 electrically connected to the second driving power supply VSS, and first light emitting elements LD1 electrically connected between the 1-1-th sub-electrode SEL1_1 and the 2-1-th sub-electrode SEL2_1. One end (e.g., a second semiconductor layer) of each first light emitting element LD1 may be electrically connected to the 1-1-th sub-electrode SEL1_1 of the first serial set SET1, and a remaining end (e.g., a first semiconductor layer) thereof may be electrically connected to the 2-1-th sub-electrode SEL2_1 of the first serial set SET1. The first light emitting elements LD1 may be connected in parallel between the 1-1-th and 2-1-th sub-electrodes SEL1_1 and SEL2_1 of the first serial set SET1 and electrically connected in an identical direction (e.g., in the forward direction) between the first and second driving power supplies VDD and VSS through the 1-1-th and 2-1-th sub-electrodes SEL1_1 and SEL2_1. In an embodiment, as illustrated in FIG. 7C, at least reverse light emitting element LDr may be further electrically connected between the 1-1-th and 2-1-th sub-electrodes SEL1_1 and SEL2_1. The reverse light emitting element LDr, along with the first light emitting elements LD1 that form valid light sources, may be electrically connected in parallel between the 1-1-th and 2-1-th sub-electrodes SEL1_1 and SEL2_1. The reverse light emitting element LDr may be electrically connected to the first light emitting elements LD1 between the 1-1-th and 2-1-th sub-electrodes SEL1_1 and SEL2_1 in a direction opposite to that of the first light emitting elements LD1. For example, a first semiconductor layer of the reverse light emitting element LDr may be electrically connected to the 1-1-th sub-electrode SEL1_1, and a second semiconductor layer thereof may be electrically connected to the 2-1-th sub-electrode SEL2_1. Even if a predetermined driving voltage (e.g., a forward driving voltage) is applied between the 1-1-th and 2-1-th sub-electrodes SEL1_1 and SEL2_1, the reverse light emitting element LDr remains disabled. Hence, current substantially does not flow through the reverse light emitting element LDr.

The second serial set SET2 may include at least one second light emitting element LD2 electrically connected between a 1-2-th sub-electrode SEL1_2 and a 2-2-th sub-electrode SEL2_2. For example, the second serial set SET2 may include the 1-2-th sub-electrode SEL1_2 electrically connected to the first driving power supply VDD via the pixel circuit 144 and the first serial set SET1, the 2-2-th sub-electrode SEL2_2 electrically connected to the second driving power supply VSS, and second light emitting elements LD2 connected between the 1-2-th sub-electrode SEL1_2 and the 2-2-th sub-electrode SEL2_2. One end (e.g., a second semiconductor layer) of each second light emitting element LD2 may be electrically connected to the 1-2-th sub-electrode SEL1_2 of the second serial set SET2, and a remaining end (e.g., a first semiconductor layer) thereof may be electrically connected to the 2-2-th sub-electrode SEL2_2 of the second serial set SET2. The second light emitting elements LD2 may be electrically connected in parallel between the 1-2-th and 2-2-th sub-electrodes SEL1_2 and SEL2_2 of the second serial set SET2 and be electrically connected in an identical direction (e.g., in the forward direction) between the first and second driving power supplies VDD and VSS through the 1-2-th and 2-2-th sub-electrodes SEL1_2 and SEL2_2. In an embodiment, as illustrated in FIG. 7C, at least one reverse light emitting element LDr may be further electrically connected between the 1-2-th and 2-2-th sub-electrodes SEL1_2 and SEL2_2. The reverse light emitting element LDr, along with the second light emitting elements LD2 that form valid light sources, may be connected in parallel between the 1-2-th and 2-2-th sub-electrodes SEL1_2 and SEL2_2. The reverse light emitting element LDr may be connected between the 1-2-th and 2-2-th sub-electrodes SEL1_2 and SEL2_2 in a direction opposite to that of the second light emitting elements LD2. For example, a first semiconductor layer of the reverse light emitting element LDr may be electrically connected to the 1-2-th sub-electrode SEL1_2, and a second semiconductor layer thereof may be electrically connected to the 2-2-th sub-electrode SEL2_2.

The third serial set SET3 may include at least one third light emitting element LD3 electrically connected between a 1-3-th sub-electrode SEL1_3 and a 2-3-th sub-electrode SEL2_3. For example, the third serial set SET3 may include the 1-3-th sub-electrode SEL1_3 electrically connected to the first driving power supply VDD via the pixel circuit 144 and the previous serial sets, e.g., the first and second serial sets SET1 and SET2, the 2-3-th sub-electrode SEL2_3 electrically connected to the second driving power supply VSS, and third light emitting elements LD3 electrically connected between the 1-3-th sub-electrode SEL1_3 and the 2-3-th sub-electrode SEL2_3. One end (e.g., a second semiconductor layer) of each third light emitting element LD3 may be electrically connected to the 1-3-th sub-electrode SEL1_3 of the third serial set SET3, and a remaining end (e.g., a first semiconductor layer) thereof may be electrically connected to the 2-3-th sub-electrode SEL2_3 of the third serial set SET3. The third light emitting elements LD3 may be electrically connected in parallel between the 1-3-th and 2-3-th sub-electrodes SEL1_3 and SEL2_3 of the third serial set SET3 and electrically connected in an identical direction (e.g., in the forward direction) between the first and second driving power supplies VDD and VSS through the 1-3-th and 2-3-th sub-electrodes SEL1_3 and SEL2_3. In an embodiment, as illustrated in FIG. 7C, at least reverse light emitting element LDr may be further electrically connected between the 1-3-th and 2-3-th sub-electrodes SEL1_3 and SEL2_3. The reverse light emitting element LDr, along with the third light emitting elements LD3 that form valid light sources, may be connected in parallel between the 1-3-th and 2-3-th sub-electrodes SEL1_3 and SEL2_3. The reverse light emitting element LDr may be electrically connected between the 1-3-th and 2-3-th sub-electrodes SEL1_2 and SEL2_3 in a direction opposite to that of the third light emitting elements LD3. For example, a first semiconductor layer of the reverse light emitting element LDr may be electrically connected to the 1-3-th sub-electrode SEL1_3, and a second semiconductor layer thereof may be electrically connected to the 2-3-th sub-electrode SEL2_3.

In the foregoing embodiment, the 1-1-th sub-electrode SEL1_1 of the first serial set SET1 may be an anode electrode of the emission part EMU of each pixel PXL. The 2-3-th sub-electrode SEL2_3 of the third serial set SET3 may be a cathode electrode of the emission part EMU.

Furthermore, the emission part EMU may include intermediate electrodes configured to electrically connect successive serial sets of the first to third serial sets SET1 to SET3. For example, the emission part EMU may include a first intermediate electrode CTE1 disposed between the first serial set SET1 and the second serial set SET2, and a second intermediate electrode CTE2 disposed between the second serial set SET2 and the third serial set SET3.

The first serial set SET1 and the second serial set SET2 may be electrically connected to each other through the first intermediate electrode CTE1. For example, the 2-1-th sub-electrode SEL2_1 of the first serial set SET1 may be electrically connected to the first intermediate electrode CTE1, and the 1-2-th sub-electrode SEL1_2 of the second serial set SET2 may be electrically connected to the first intermediate electrode CTE1. The second serial set SET2 and the third serial set SET3 may be electrically connected to each other through the second intermediate electrode CTE2. For example, the 2-2-th sub-electrode SEL2_2 of the second serial set SET2 may be electrically connected to the second intermediate electrode CTE2, and the 1-3-th sub-electrode SEL1_3 of the third serial set SET3 may be electrically connected to the second intermediate electrode CTE2.

As described above, in the emission part EMU of the pixel PXL including the light emitting elements LD electrically connected to each other in a serial or parallel combination structure, driving current/voltage conditions may be readily adjusted in response to specifications of a product to which the emission part EMU is applied.

Particularly, in the emission part EMU of the pixel PXL including the light emitting elements LD electrically connected to each other in a serial/parallel combination structure, the driving current thereof may be reduced, compared to that of the emission part EMU including the light emitting elements LD electrically connected in parallel to each other. Furthermore, in the emission part EMU of the pixel PXL including the light emitting elements LD electrically connected to each other in the serial/parallel combination structure, driving voltages to be applied to the opposite ends of the emission part EMU may be reduced, compared to that of the emission part EMU including the light emitting elements LD all electrically connected in series to each other. In case that all of the light emitting elements LD are connected only in series, if at least one of the light emitting elements LD electrically connected in series to each other is not completely oriented in the forward direction (or a reverse light emitting element LDr is included), a dark spot defect may be caused in case that a path along which the driving current is able to flow in the pixel PXL is be blocked. On the other hand, in case that the light emitting elements LD are electrically connected to each other in the serial/parallel combination structure, even if some light emitting elements LD in each serial set are not correctly connected in the forward direction (or a reverse light emitting element LDr is included) or defects occur in some light emitting elements LD, the driving current is allowed to flow through the other light emitting elements LD of the corresponding serial set. Therefore, defects of the pixel PXL may be prevented or reduced.

Figure 8:
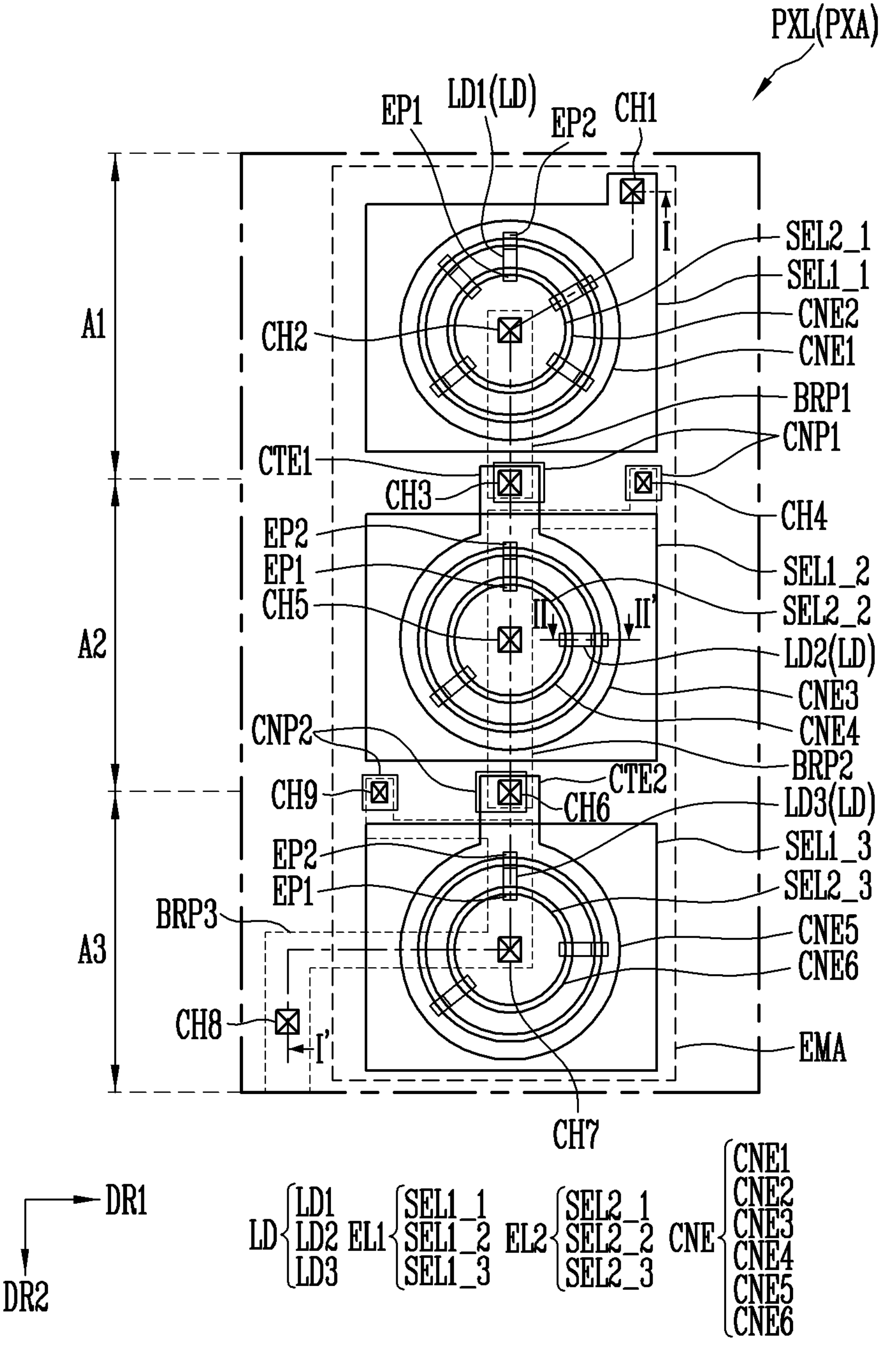
FIG. 8 is a plan view schematically illustrating a pixel of the pixels illustrated in FIG. 5.
Figure 9:
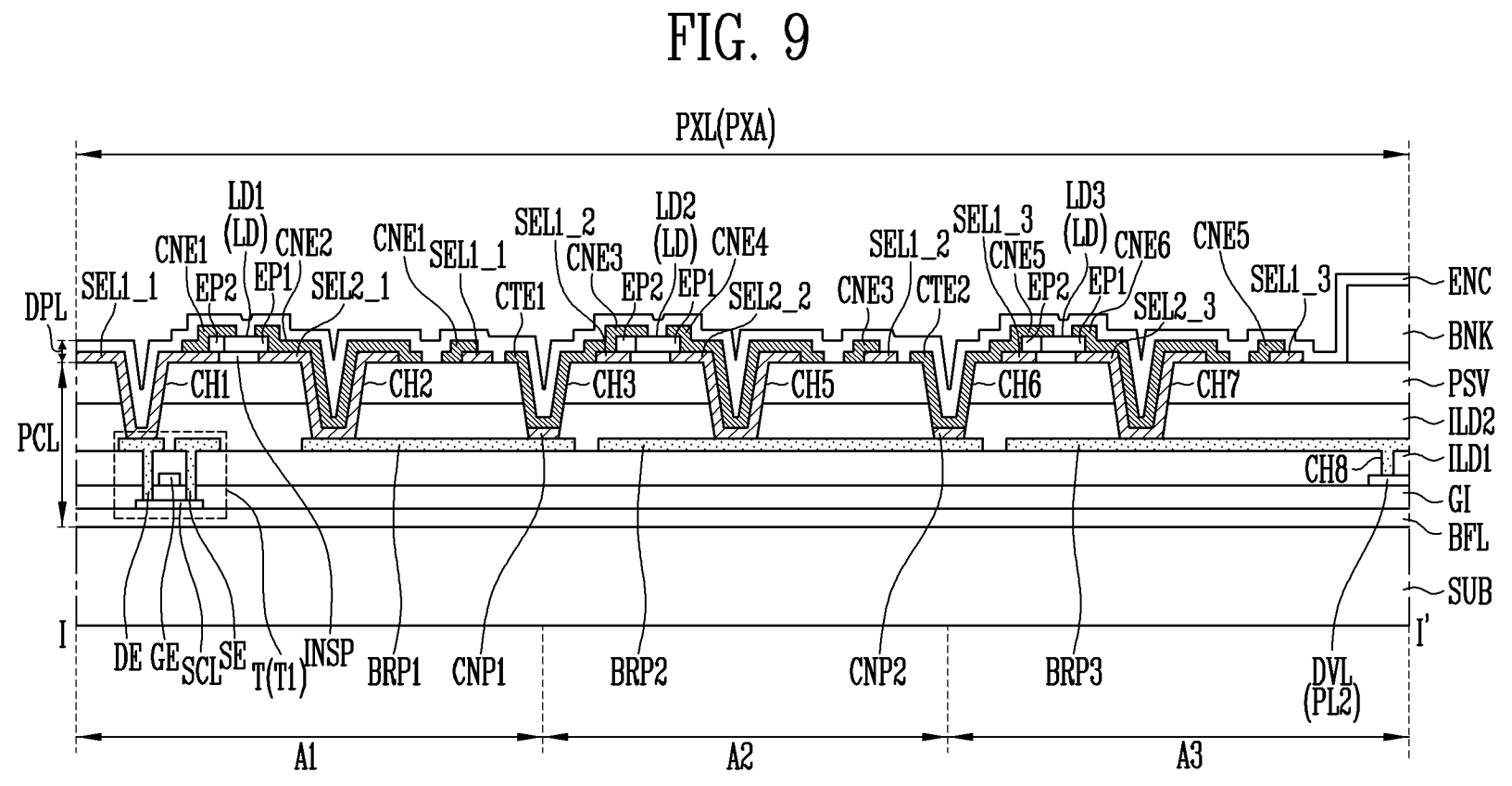
Figure 10:
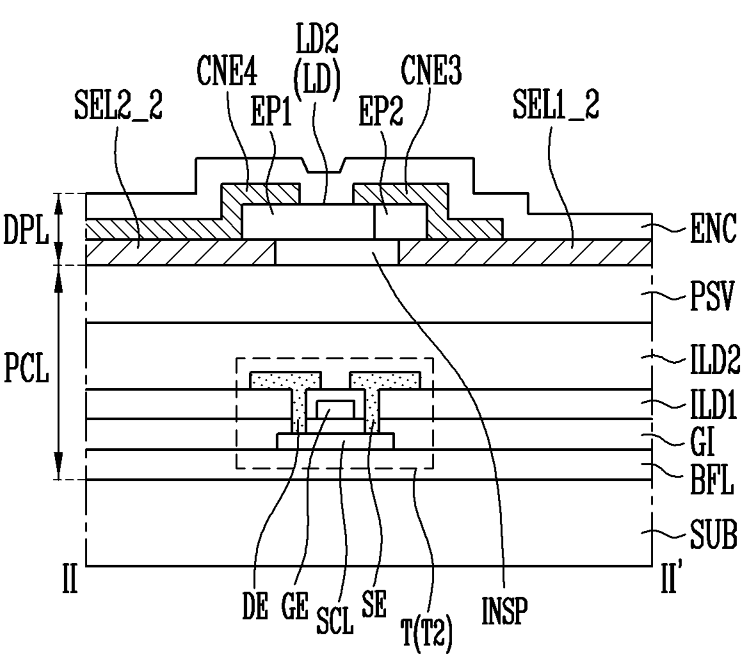
FIG. 10 is a schematic cross-sectional view taken along line II-II' of FIG. 8.

FIG. 8 is a plan view schematically illustrating one of the pixels illustrated in FIG. 5. FIG. 9 is a schematic cross-sectional view taken along line I-I' of FIG. 8. FIG. 10 is a schematic cross-sectional view taken along line II-II' of FIG. 8. FIG. 11 illustrates a display device including first to third conductive patterns electrically connected to first to third bridge patterns illustrated in FIG. 9, and is a schematic cross-sectional view corresponding to line I-I' of FIG. 8.

The pixel PXL illustrated in FIG. 8 may be any one of the pixels PXL respectively illustrated in FIGS. 6A to 6E, and 7A to 7C. For example, the pixel PXL illustrated in FIG. 8 may be the pixel PXL illustrated in FIGS. 7B and/or 7C.

For the sake of explanation, illustration of transistors electrically connected to the light emitting elements LD and signal lines electrically connected to the transistors is omitted in FIG. 8.

Although FIGS. 8 to 11 simply illustrate the structure of a pixel PXL, e.g., illustrate that each electrode is formed of a single electrode layer and each insulating layer is formed of a single insulating layer, the disclosure is not limited thereto.

In the description of embodiments, "components are provided and/or formed on a same layer" may mean that the components are formed by a same process, and "components are provided and/or formed on different layers" may mean that the components are formed by different processes.

Referring to FIGS. 1A to 4B, 5, 7B, 7C, and 8 to 11, the display device in accordance with an embodiment may include a substrate SUB, a line component, and pixels PXL.

The substrate SUB may include a transparent insulating material to allow light transmission. The substrate SUB may be a rigid substrate or a flexible substrate. Material applied to the substrate SUB may have resistance (thermal resistance) to high treatment temperatures during a process of fabricating the display device. The substrate SUB may include a display area DA including at least one pixel area PXA in which the pixel PXL is disposed, and a non-display area NDA disposed around the display area DA.

In an embodiment, pixels PXL may be arranged in the display area DA in a matrix shape and/or a stripe shape along pixel rows extending in a first direction DR1 and pixel columns extending in a second direction DR2 intersecting the first direction DR1, but the disclosure is not limited thereto. In an embodiment, the pixels PXL may be disposed in the display area DA on the substrate SUB in various arrangement manners.

The pixel area PXA in which each pixel PXL is disposed may include an emission area EMA from which light is emitted, and a peripheral area which encloses a perimeter of the emission area EMA. In an embodiment, the term "peripheral area" may include a non-emission area from which no light is emitted. In an embodiment, the pixel area PXA in which each pixel PXL is disposed may include first to third areas A1, A2, and A3 which are divided from each other in a direction, e.g., the second direction DR2. Each of the first to third areas A1, A2, and A3 may include an emission area EMA, and a peripheral area which encloses a perimeter of the emission area EMA.

Each pixel PXL may include a substrate SUB, a pixel circuit layer PCL in which a pixel circuit 144 is provided (or formed), and a display element layer DPL in which at least one light emitting element LD is provided. The display element layer DPL may be disposed in the emission area EMA of each of the first to third areas A1, A2, and A3 of the pixel area PXA.

The pixel circuit layer PCL may include a buffer layer BFL, the pixel circuit 144 including at least one transistor T, a driving voltage line DVL, and a passivation layer PSV.

The buffer layer BFL may prevent impurities from diffusing into the transistor T. The buffer layer BFL may include an inorganic insulating layer formed of an inorganic material. For example, the buffer layer BFL may include at least one of silicon nitride ($SiN_x$), silicon oxide ($SiO_x$), silicon oxynitride (SiON), and metallic oxide such as $AlO_x$. Although the buffer layer BFL may be provided in a single-layer structure, the buffer layer BFL may be provided in a multi-layer structure having at least two or more layers. In case that the buffer layer BFL has a multi-layer structure, the respective layers may be formed of an identical material or different materials. The buffer layer BFL may be omitted depending on the material of the substrate SUB or processing conditions.

The transistor T may include a first transistor T1, which is a driving transistor for controlling the amount of driving current to be supplied to the light emitting elements LD, and a second transistor T2, which is a switching transistor. In an embodiment, the first transistor T1 may be the first transistor T1 of the pixel circuit 144 described with reference to FIGS. 6A, 7B, and 7C. The second transistor T2 may be the second transistor T2 of the pixel circuit 144 described with reference to FIGS. 6A, 7B, and 7C.

Each of the first transistor T1 (T) and the second transistor T2 (T) may include a transistor semiconductor pattern SCL, a gate electrode GE, a first terminal SE, and a second terminal DE. The first terminal SE may be either a source electrode or a drain electrode, and the second terminal DE may be the other electrode. For example, in case that the first terminal SE is a source electrode, the second terminal DE may be a drain electrode.

The transistor semiconductor pattern SCL may be provided and/or formed on the buffer layer BFL. The transistor semiconductor pattern SCL may include a first contact area which contacts the first terminal SE, and a second contact area which contacts the second terminal DE. An area between the first contact area and the second contact area may be a channel area. The transistor semiconductor pattern SCL may be a semiconductor panel formed of polysilicon, amorphous silicon, an oxide semiconductor, etc. The channel area may be an intrinsic semiconductor, which is an undoped semiconductor pattern. Each of the first contact area and the second contact area may be a semiconductor pattern doped with impurities.

The gate electrode GE may be provided and/or formed on the transistor semiconductor pattern SCL with a gate insulating layer GI interposed therebetween. The gate insulating layer GI may be an inorganic insulating layer including an inorganic material. For example, the gate insulating layer GI may include at least one of silicon nitride ($SiN_x$), silicon oxide ($SiO_x$), silicon oxynitride (SiON), and metallic oxide such as $AlO_x$. However, the material of the gate insulating layer GI is not limited to that of the foregoing embodiments. In an embodiment, the gate insulating layer GI may be formed of an organic insulating layer including an organic material. Although the gate insulating layer GI may be provided in a single-layer structure, the gate insulating layer GI may be provided in a multi-layer structure having at least two or more layers. The first terminal SE and the second terminal DE may respectively contact the first contact area and the second contact area of the transistor semiconductor pattern SCL through corresponding contact holes that pass through a first interlayer insulating layer ILD1 and the gate insulating layer GI. The first interlayer insulating layer ILD1 may be an inorganic insulating layer including an inorganic material. For example, the first interlayer insulating layer ILD1 may include at least one of silicon nitride ($SiN_x$), silicon oxide ($SiO_x$), silicon oxynitride (SiON), and metallic oxide such as $AlO_x$. The first interlayer insulating layer ILD1 and the gate insulating layer GI may have a same material, but the disclosure is not limited thereto. Although the first interlayer insulating layer ILD1 may be provided in a single-layer structure, the first interlayer insulating layer ILD1 may be provided in a multi-layer structure having at least two or more layers.

Although in the foregoing embodiment there has been described that the first and second terminals SE and DE of each of the first transistor T1 (T) and the second transistor T2 (T) are separate electrodes electrically connected with the transistor semiconductor pattern SCL, the disclosure is not limited thereto. In an embodiment, the first terminal SE of each of the first transistor T1 (T) and the second transistor T2 (T) may be one of the first and second contact areas adjacent to the channel area of the corresponding transistor semiconductor pattern SCL. The second terminal DE of each of the first transistor T1 (T) and the second transistor T2 (T) may be the other of the first and second contact areas adjacent to the channel area of the corresponding transistor semiconductor pattern SCL. In this case, the second terminal DE of each of the first transistor T1 (T) and the second transistor T2 (T) may be electrically connected to the light emitting elements LD of the corresponding pixel PXL through a bridge electrode, a contact electrode, or the like.

In an embodiment, the transistor T included in the pixel circuit 144 may be formed of a low-temperature polycrystalline silicon (LTPS) thin-film transistor, but the disclosure is not limited thereto. In some embodiments, the transistor T may be formed of an oxide semiconductor thin-film transistor. Furthermore, there has been illustrated the case where the transistor T is a thin-film transistor having a top gate structure, but the disclosure is not limited thereto. In an embodiment, the transistor T may be a thin-film transistor having a bottom gate structure.

The driving voltage line DVL may be provided on the gate insulating layer GI, but the disclosure is not limited thereto. In some embodiments, the driving voltage line DVL may be provided on any of insulating layers included in the pixel circuit layer PCL. A voltage of the second driving power supply VSS may be applied to the driving voltage line DVL. In an embodiment, the driving voltage line DVL may be the second power line PL2 to which the second driving power supply VSS is applied, in the pixel PXL illustrated in FIGS. 7B and 7C.

The second interlayer insulating layer ILD2 may be disposed on the transistor T. The second interlayer insulating layer ILD2 may cover the transistor T. The second interlayer insulating layer ILD2 may be an inorganic insulating layer including an inorganic material or an organic insulating layer including an organic material. In an embodiment, the second interlayer insulating layer ILD2 and the first interlayer insulating layer ILD1 may include a same material, but the disclosure is not limited thereto. Although the second interlayer insulating layer ILD2 may be provided in a single-layer structure, the first interlayer insulating layer ILD1 may be provided in a multi-layer structure having at least two or more layers.

The passivation layer PSV may be disposed on the second interlayer insulating layer ILD2. The passivation layer PSV may be provided in the form of an organic insulating layer, an inorganic insulating layer, or a structure including the organic insulating layer disposed on an inorganic insulating layer. The inorganic insulating layer may include at least one of silicon oxide ($SiO_x$), silicon nitride ($SiN_x$), silicon oxynitride (SiON), and metallic oxide such as $AlO_x$. The organic insulating layer may include an organic insulating material allowing light to pass therethrough. The organic insulating layer may include, for example, at least one of polyacrylates resin, epoxy resin, phenolic resin, polyamides resin, polyimides rein, unsaturated polyesters resin, poly-phenylen ethers resin, poly-phenylene sulfides resin, and benzocyclobutene resin.

Each of the second interlayer insulating layer ILD2 and the passivation layer PSV may include a first contact hole CH1 which exposes a portion of the second terminal DE of the first transistor T1 (T).

The pixel circuit layer PCL may include a first bridge pattern BRP1 provided (or formed) in the first area A1, a second bridge pattern BRP2 provided (or formed) in the second area A2, and a third bridge pattern BRP3 provided (or formed) in the third area A3.

The first bridge pattern BRP1 may be disposed in the first area A1 of each pixel PXL and have a bar shape extending in the second direction DR2. The first bridge pattern BRP1 may extend to an area (or a boundary area) between the first area A1 and the second area A2. In an embodiment, the first bridge pattern BRP1 may extend from the first area A1 of the pixel area PXA to a portion of the second area A2 of the pixel area PXA. In an embodiment, the first bridge pattern BRP1 and the first and second terminals SE and DE of the first transistor T1 (T) may be provided on a same layer, and may include a same material. For example, the first bridge pattern BRP1 may be provided and/or formed on the first interlayer insulating layer ILD1.

The first bridge pattern BRP1 may be electrically connected to some components, e.g., the 2-1-th sub-electrode SEL2_1, included in the display element layer DPL provided in the first area A1, through a second contact hole CH2 that successively passes through the second interlayer insulating layer ILD2 and the passivation layer PSV. Furthermore, the first bridge pattern BRP1 may be electrically connected to some components, e.g., the first intermediate electrode CTE1, included in the display element layer DPL provided in an area between the first area A1 and the second area A2, through a third contact hole CH3 that successively passes through the second interlayer insulating layer ILD2 and the passivation layer PSV. A connection relationship between the first bridge pattern BRP1, the 2-1-th sub-electrode SEL2_1, and the first intermediate electrode CTE1 will be described below.

The second bridge pattern BRP2 may be disposed in the second area A2 of each pixel PXL, and have a shape, extending in the second direction DR2 and bent in the first direction DR1, but the shape of the second bridge pattern BRP2 is not limited thereto. The second bridge pattern BRP2 may extend to an area (or a boundary area) between the second area A2 and the third area A3. In an embodiment, the second bridge pattern BRP2 may extend from the second area A2 of the pixel area PXA to a portion of the third area A3 of the pixel area PXA. In an embodiment, the second bridge pattern BRP2 and the first bridge pattern BRP1 may be provided on a same layer, and may include a same material. For example, the second bridge pattern BRP2 may be provided and/or formed on the first interlayer insulating layer ILD1.

The second bridge pattern BRP2 may be electrically connected to the 2-2-th sub-electrode SEL2_2, included in the display element layer DPL provided in the second area A2, through a fifth contact hole CH5 that successively passes through the second interlayer insulating layer ILD2 and the passivation layer PSV. Furthermore, the second bridge pattern BRP2 may be electrically connected to some components, e.g., the second intermediate electrode CTE2, included in the display element layer DPL provided in an area between the second area A2 and the third area A3, through a sixth contact hole CH6 that successively passes through the second interlayer insulating layer ILD2 and the passivation layer PSV. A connection relationship between the second bridge pattern BRP2, the 2-2-th sub-electrode SEL2_2, and the second intermediate electrode CTE2 will be described below.

The third bridge pattern BRP3 may be disposed in the third area A3 of the pixel area PXA and have a shape extending in the second direction DR2 and bent in the first direction DR1. However, the shape of the third bridge pattern BRP3 is not limited to the foregoing embodiment. The third bridge pattern BRP3 may extend from the emission area EMA of the third area A3 to the peripheral area formed around the emission area EMA. The third bridge pattern BRP3 may be electrically connected to the 2-3-th sub-electrode SEL2_3, included in the display element layer DPL provided in the third area A3, through a seventh contact hole CH7 that successively passes through the second interlayer insulating layer ILD2 and the passivation layer PSV. Furthermore, the third bridge pattern BRP3 may be electrically connected to the driving voltage line DVL (PL2) through an eighth contact hole CH8 passing through the first interlayer insulating layer ILD1. Since the third bridge pattern BRP3 is electrically connected to the driving voltage line DVL (PL2), a voltage of the second power supply VSS applied to the driving voltage line DVL (PL2) may be transmitted to the third bridge pattern BRP3. A connection relationship between the third bridge pattern BRP3, the 2-3-th sub-electrode SEL2_3, and the driving voltage line DVL (PL2) will be described below.

In an embodiment, the first bridge pattern BRP1, the second bridge pattern BRP2, and the third bridge pattern BRP3 may be disposed in the corresponding respective areas at positions spaced apart from each other. For example, the first bridge pattern BRP1 may be spaced apart from the second bridge pattern BRP2 by a predetermined distance therebetween. The second bridge pattern BRP2 may be spaced apart from the third bridge pattern BRP3 by a predetermined distance therebetween.

In an embodiment, the pixel circuit layer PCL of each pixel PXL may further include first to third conductive patterns CP1, CP2, and CP3, and first and second auxiliary electrodes AUX1 and AUX2 which are provided between the second interlayer insulating layer ILD2 and the passivation layer PSV, as illustrated in FIG. 11.

The first conductive pattern CP1 may be disposed in the first area A1 between the first bridge pattern BRP1 and the 2-1-th sub-electrode SEL2_1. For example, the first conductive pattern CP1 may be provided and/or formed on the first bridge pattern BRP1 with the second interlayer insulating layer ILD2 interposed therebetween. In other words, the first conductive pattern CP1 may be provided on the second interlayer insulating layer ILD2 and overlap the first bridge pattern BRP1. The first conductive pattern CP1 may be electrically connected to the first bridge pattern BRP1 through the second contact hole CH2 passing through the second interlayer insulating layer ILD2. The first conductive pattern CP1 may be electrically connected to the 2-1-th sub-electrode SEL2_1 through the second contact hole CH2 passing through the passivation layer PSV. The first bridge pattern BRP1, the first conductive pattern CP1, and the 2-1-th sub-electrode SEL2_1 may be electrically connected to each other. In an embodiment, the second contact hole CH2 of the second interlayer insulating layer ILD2 and the second contact hole CH2 of the passivation layer PSV may be located in the first area A1 and correspond to each other.

In case that the first bridge pattern BRP1 is electrically connected to the first conductive pattern CP1 disposed thereover, line resistance of the first bridge pattern BRP1 may be reduced so that distortion of a signal transmitted to the first bridge pattern BRP1 may be prevented.

The second conductive pattern CP2 may be disposed in the second area A2 between the second bridge pattern BRP2 and the 2-2-th sub-electrode SEL2_2. For example, the second conductive pattern CP2 may be provided and/or formed on the second bridge pattern BRP2 with the second interlayer insulating layer ILD2 interposed therebetween. In other words, the second conductive pattern CP2 may be disposed on the second interlayer insulating layer ILD2 and overlap the second bridge pattern BRP2. The second conductive pattern CP2 may be electrically connected to the second bridge pattern BRP2 through the fifth contact hole CH5 passing through the second interlayer insulating layer ILD2. The second conductive pattern CP2 may be electrically connected to the 2-2-th sub-electrode SEL2_2 through the fifth contact hole CH5 passing through the passivation layer PSV. The second bridge pattern BRP2, the second conductive pattern CP2, and the 2-2-th sub-electrode SEL2_2 may be electrically connected to each other. In an embodiment, the fifth contact hole CH5 of the second interlayer insulating layer ILD2 and the fifth contact hole CH5 of the passivation layer PSV may be located in the second area A2 and correspond to each other.

In case that the second bridge pattern BRP2 is electrically connected to the second conductive pattern CP2 disposed thereover, line resistance of the second bridge pattern BRP2 may be reduced so that distortion of a signal transmitted to the second bridge pattern BRP2 may be prevented.

The third conductive pattern CP3 may be disposed in the third area A3 between the third bridge pattern BRP3 and the 2-3-th sub-electrode SEL2_3. For example, the third conductive pattern CP3 may be provided and/or formed on the third bridge pattern BRP3 with the second interlayer insulating layer ILD2 interposed therebetween. In other words, the third conductive pattern CP3 may be provided on the second interlayer insulating layer ILD2 and overlap the third bridge pattern BRP3. The third conductive pattern CP3 may be electrically connected to the third bridge pattern BRP3 through a seventh contact hole CH7 passing through the second interlayer insulating layer ILD2. The third conductive pattern CP3 may be electrically connected to the 2-3-th sub-electrode SEL2_3 through the seventh contact hole CH7 passing through the passivation layer PSV. The third bridge pattern BRP3, the third conductive pattern CP3, and the 2-3-th sub-electrode SEL2_3 may be electrically connected to each other. In an embodiment, the seventh contact hole CH7 of the second interlayer insulating layer ILD2 and the seventh contact hole CH7 of the passivation layer PSV may be located in the third area A3 and correspond to each other.

In case that the third bridge pattern BRP3 is electrically connected to the third conductive pattern CP3 disposed thereover, line resistance of the third bridge pattern BRP3 may be reduced so that distortion of a signal transmitted to the third bridge pattern BRP3 may be prevented.

The first auxiliary electrode AUX1 may be provided on the second interlayer insulating layer ILD2 and correspond to the area between the first area A1 and the second area A2. The first auxiliary electrode AUX1 may be electrically connected to the first bridge pattern BRP1 that extends from the first area A1 to at least a portion of the second area A2 through the third contact hole CH3 passing through the second interlayer insulating layer ILD2. The first auxiliary electrode AUX1 may be electrically connected to the first intermediate electrode CTE1 through the third contact hole CH3 passing through the passivation layer PSV. In an embodiment, the third contact hole CH3 of the second interlayer insulating layer ILD2 and the third contact hole CH3 of the passivation layer PSV may be located in the area between the first area A1 and the second area A2 and correspond to each other.

The second auxiliary electrode AUX2 may be provided on the second interlayer insulating layer ILD2 and correspond to the area between the second area A2 and the third area A3. The second auxiliary electrode AUX2 may be electrically connected to the second bridge pattern BRP2 that extends from the second area A2 to at least a portion of the third area A3 through the sixth contact hole CH6 passing through the second interlayer insulating layer ILD2. The second auxiliary electrode AUX2 may be electrically connected to the second intermediate electrode CTE2 through the sixth contact hole CH6 passing through the passivation layer PSV. The sixth contact hole CH6 of the second interlayer insulating layer ILD2 and the sixth contact hole CH6 of the passivation layer PSV may be located in the area between the second area A2 and the third area A3 and correspond to each other.

The first to third conductive patterns CP1, CP2, and CP3, and the first and second auxiliary electrodes AUX1 and AUX2 may be provided on a same layer and include a same material. The first to third conductive patterns CP1, CP2, and CP3 and the first and second auxiliary electrodes AUX1 and AUX2 may be disposed on the second interlayer insulating layer ILD2 and spaced apart from each other by a constant distance. In a sectional view, the first auxiliary electrode AUX1 may be disposed between the first conductive pattern CP1 and the second conductive pattern CP2, and the second auxiliary electrode AUX2 may be disposed between the second conductive pattern CP2 and the third conductive pattern CP3.

Hereinbelow, the display element layer DPL will be described.

The display element layer DPL of each pixel PXL may include the first and second electrodes EL1 and EL2, first and second connection patterns CNP1 and CNP2, a contact electrode CNE, the first and second intermediate electrodes CTE1 and CTE2, and the light emitting elements LD that are provided in the emission area EMA. Furthermore, the display element layer DPL of each pixel PXL may include a bank BNK provided in the peripheral area.

The bank BNK may enclose at least one side of the emission area EMA of each pixel PXL. The bank BNK may be a structure configured to define (or partition) the respective emission areas EMA of each pixel PXL and pixels PXL adjacent thereto and, for example, may be a pixel defining layer. The bank BNK may include at least one light block material and/or reflective material, thus preventing a light leakage defect in which light (or rays) leaks between each pixel PXL and the pixels PXL adjacent thereto. In an embodiment, a reflective material layer (or reflective layer) may be formed on the bank BNK so as to further enhance the efficiency of light emitted from each pixel PXL. The bank BNK may be provided and/or formed on the passivation layer PSV, but the disclosure is not limited thereto. In an embodiment, the bank BNK may be provided and/or formed on any one insulating layer of the insulating layers included in the display element layer DPL.

The first electrode EL1 and the second electrode EL2 may be spaced apart from each other. The first electrode EL1 may include a 1-1-th sub-electrode SEL1_1 provided in the first area A1, a 1-2-th sub-electrode SEL1_2 provided in the second area A2, and a 1-3-th sub-electrode SEL1_3 provided in the third area A3. The 1-1-th sub-electrode SEL1_1, the 1-2-th sub-electrode SEL1_2, and the 1-3-th sub-electrode SEL1_3 may be spaced apart from each other, in a plan view. The second electrode EL2 may include a 2-1-th sub-electrode SEL2_1 provided in the first area A1, a 2-2-th sub-electrode SEL2_2 provided in the second area A2, and a 2-3-th sub-electrode SEL2_3 provided in the third area A3. The 2-1-th sub-electrode SEL2_1, the 2-2-th sub-electrode SEL2_2, and the 2-3-th sub-electrode SEL2_3 may be spaced apart from each other, in a plan view.

The 2-1-th sub-electrode SEL2_1 may be disposed in a central portion of the first area A1 and have a circular shape, in a plan view. The 1-1-th sub-electrode SEL1_1 may have a shape enclosing the perimeter of the 2-1-th sub-electrode SEL2_1 in a circumferential direction. The 2-1-th sub-electrode SEL2_1 may be provided in a shape of an isolated circular island enclosed by the 1-1-th sub-electrode SEL1_1, but the disclosure is not limited thereto. The 1-1-th sub-electrode SEL1_1 and the 2-1-th sub-electrode SEL2_1 may be disposed on the passivation layer PSV and spaced apart from each other by a predetermined distance.

The 2-2-th sub-electrode SEL2_2 may be disposed in a central portion of the second area A2 and have a circular shape, in a plan view. The 1-2-th sub-electrode SEL1_2 may have a shape enclosing the perimeter of the 2-2-th sub-electrode SEL2_2 in a circumferential direction. The 2-2-th sub-electrode SEL2_2 may be provided in a shape of an isolated circular island enclosed by the 1-2-th sub-electrode SEL1_2, but the disclosure is not limited thereto. The 1-2-th sub-electrode SEL1_2 and the 2-2-th sub-electrode SEL2_2 may be disposed on the passivation layer PSV and spaced apart from each other by a predetermined distance.

The 2-3-th sub-electrode SEL2_3 may be disposed in a central portion of the third area A3 and have a circular shape, in a plan view. The 1-3-th sub-electrode SEL1_3 may have a shape enclosing the perimeter of the 2-3-th sub-electrode SEL2_3 in a circumferential direction. The 2-3-th sub-electrode SEL2_3 may be provided in a shape of an isolated circular island enclosed by the 1-3-th sub-electrode SEL1_3, but the disclosure is not limited thereto. The 1-3-th sub-electrode SEL1_3 and the 2-3-th sub-electrode SEL2_3 may be disposed on the passivation layer PSV and spaced apart from each other by a predetermined distance.

In an embodiment, the distance between the 1-1-th sub-electrode SEL1_1 and the 2-1-th sub-electrode SEL2_1, the distance between the 1-2-th sub-electrode SEL1_2 and the 2-2-th sub-electrode SEL2_2, and the distance between the 1-3-th sub-electrode SEL1_3 and the 2-3-th sub-electrode SEL2_3 may be the same as each other. Hence, the light emitting elements LD may be more regularly aligned in the first to third areas A1, A2, and A3. However, the disclosure is not limited thereto. In an embodiment, the distance between the 1-1-th sub-electrode SEL1_1 and the 2-1-th sub-electrode SEL2_1, the distance between the 1-2-th sub-electrode SEL1_2 and the 2-2-th sub-electrode SEL2_2, and the distance between the 1-3-th sub-electrode SEL1_3 and the 2-3-th sub-electrode SEL2_3 may differ from each other.

Each of the 1-1-th to 1-3-th sub-electrodes SEL1_1, SEL1_2, and SEL1_3 and the 2-1-th to 2-3-th sub-electrodes SEL2_1, SEL2_2, and SEL2_3 may be formed of material having a predetermined reflectivity to allow light emitted from each of the light emitting elements LD provided in the corresponding area to travel in the image display direction of the display device.

Each of the 1-1-th to 1-3-th sub-electrodes SEL1_1, SEL1_2, and SEL1_3 and the 2-1-th to 2-3-th sub-electrodes SEL2_1, SEL2_2, and SEL2_3 may be formed of a conductive material having a predetermined reflectivity. The conductive material may include opaque metal that has an advantage in reflecting, in the image display direction of the display device, light emitted from the light emitting elements LD. The opaque metal may include metal, for example, Ag, Mg, Al, Pt, Pd, Au, Ni, Nd, Ir, Cr, Ti, and an alloy thereof. In an embodiment, each of the 1-1-th to 1-3-th sub-electrodes SEL1_1, SEL1_2, and SEL1_3 and the 2-1-th to 2-3-th sub-electrodes SEL2_1, SEL2_2, and SEL2_3 may include a transparent conductive material. The transparent conductive material may include conductive oxide such as indium tin oxide (ITO), indium zinc oxide (IZO), zinc oxide (ZnO), or indium tin zinc oxide (ITZO), or a conductive polymer such as poly(3,4-ethylenedioxythiophen) (PEDOT). In case that each of the 1-1-th to 1-3-th sub-electrodes SEL1_1, SEL1_2, and SEL1_3 and the 2-1-th to 2-3-th sub-electrodes SEL2_1, SEL2_2, and SEL2_3 includes a transparent conductive material, a separate additional conductive layer made of opaque metal for reflecting light emitted from the light emitting elements LD in the image display direction of the display device may be included. However, the material of each of the 1-1-th to 1-3-th sub-electrodes SEL1_1, SEL1_2, and SEL1_3, and the 2-1-th to 2-3-th sub-electrodes SEL2_1, SEL2_2, and SEL2_3 is not limited to the foregoing materials.

Furthermore, each of the 1-1-th to 1-3-th sub-electrodes SEL1_1, SEL1_2, and SEL1_3, and the 2-1-th to 2-3-th sub-electrodes SEL2_1, SEL2_2, and SEL2_3 may be provided and/or formed of a single layer, but the disclosure is not limited thereto. In an embodiment, each of the 1-1-th to 1-3-th sub-electrodes SEL1_1, SEL1_2, and SEL1_3, and the 2-1-th to 2-3-th sub-electrodes SEL2_1, SEL2_2, and SEL2_3 may be provided and/or formed of a multi-layer structure by stacking two or more materials among metals, alloys, conductive oxides, and conductive polymers. Each of the 1-1-th to 1-3-th sub-electrodes SEL1_1, SEL1_2, and SEL1_3, and the 2-1-th to 2-3-th sub-electrodes SEL2_1, SEL2_2, and SEL2_3 may have a multi-layer structure including at least two layers to minimize distortion resulting from a signal delay in case that signals (or voltages) are transmitted to opposite ends of each of the light emitting elements LD. For example, each of the 1-1-th to 1-3-th sub-electrodes SEL1_1, SEL1_2, and SEL1_3, and the 2-1-th to 2-3-th sub-electrodes SEL2_1, SEL2_2, and SEL2_3 may have a multi-layer structure in which layers are stacked in a sequence of ITO/Ag/ITO.

As described above, since each of the 1-1-th to 1-3-th sub-electrodes SEL1_1, SEL1_2, and SEL1_3, and the 2-1-th to 2-3-th sub-electrodes SEL2_1, SEL2_2, and SEL2_3 is formed of a conductive material having a predetermined reflectivity, light emitted from each of the light emitting elements LD may be reflected by each of the 1-1-th to 1-3-th sub-electrodes SEL1_1, SEL1_2, and SEL1_3 and the 2-1-th to 2-3-th sub-electrodes SEL2_1, SEL2_2, and SEL2_3 and travel in the image display direction of the display device.

In the first area A1 of each pixel PXL, the 2-1-th sub-electrode SEL2_1 and the 1-1-th sub-electrode SEL1_1 that enclose the perimeter of the 2-1-th sub-electrode SEL2_1, along with light emitting elements LD connected in parallel therebetween, may form a first serial set SET1. In the second area A2 of each pixel PXL, the 2-2-th sub-electrode SEL2_2 and the 1-2-th sub-electrode SEL1_2 that enclose the perimeter of the 2-2-th sub-electrode SEL2_2, along with light emitting elements LD connected in parallel therebetween, may form a second serial set SET2. In the third area A3 of each pixel PXL, the 2-3-th sub-electrode SEL2_3 and the 1-3-th sub-electrode SEL1_3 that enclose the perimeter of the 2-3-th sub-electrode SEL2_3, along with light emitting elements LD connected in parallel therebetween, may form a third serial set SET3.

In an embodiment, the first to third serial sets SET1 to SET3 are disposed in the emission area EMA of each pixel PXL. The first to third serial sets SET1 to SET3 may form an emission part EMU of the pixel PXL.

The 1-1-th sub-electrode SEL1_1 included in the first serial set SET1 of each pixel PXL may be an anode electrode of the emission part EMU of the pixel PXL. The 2-3-th sub-electrode SEL2_3 included in the third serial set SET3 may be a cathode electrode of the emission part EMU.

In an embodiment, the 1-1-th sub-electrode SEL1_1 of each pixel PXL may be electrically connected to the pixel circuit 144 included in the pixel circuit layer PCL of the pixel PXL through the first contact hole CH1. For example, the 1-1-th sub-electrode SEL1_1 may be electrically connected with the first transistor T1 (T) of the pixel circuit 144 through the first contact hole CH1.

In the foregoing embodiment, each of the light emitting elements LD may be formed of a light emitting element which is made of material having an inorganic crystal structure and has a subminiature size, e.g., ranging from the nanoscale to the microscale. For example, each of the light emitting elements LD may be a subminiature light emitting element fabricated by an etching method, or a subminiature light emitting element fabricated by a growth method. The type, the size, the shape, etc. of the light emitting elements LD may be changed in various ways. Although at least two to several tens of light emitting elements LD may be aligned and/or provided in the emission area EMA of each pixel PXL, the number of light emitting elements LD is not limited thereto. In an embodiment, the number of light emitting elements LD aligned and/or provided in the emission area EMA of each pixel PXL may be changed in various ways.

In the first area A1, the light emitting elements LD may be aligned along the perimeter of the 2-1-th sub-electrode SEL2_1. For example, the light emitting elements LD may be radially aligned around the 2-1-th sub-electrode SEL2_1 having a circular shape between the 1-1-th sub-electrode SEL1_1 and the 2-1-th sub-electrode SEL2_1. In the second area A2, the light emitting elements LD may be aligned along the perimeter of the 2-2-th sub-electrode SEL2_2. For example, the light emitting elements LD may be radially aligned around the 2-2-th sub-electrode SEL2_2 having a circular shape between the 1-2-th sub-electrode SEL1_2 and the 2-2-th sub-electrode SEL2_2. In the third area A3, the light emitting elements LD may be aligned along the perimeter of the 2-3-th sub-electrode SEL2_3. For example, the light emitting elements LD may be radially aligned around the 2-3-th sub-electrode SEL2_3 having a circular shape between the 1-3-th sub-electrode SEL1_3 and the 2-3-th sub-electrode SEL2_3.

In an embodiment, at least one reverse light emitting element LDr electrically connected in a reverse direction between two adjacent sub-electrodes in each serial set may be further disposed, or at least one defective light emitting element, e.g., an invalid light source, which is not electrically connected to two adjacent sub-electrodes in each serial set may be further disposed between the two sub-electrodes.

The light emitting elements LD may be diffused or dispersed in a solution and supplied into the emission area EMA of the pixel PXL.

In an embodiment, the light emitting elements LD may be supplied to the emission area EMA of each pixel PXL by an inkjet printing method, a slit coating method, or other various methods. For example, the light emitting elements LD may be mixed with a volatile solvent and then supplied to the emission area EMA of each pixel PXL by an inkjet printing method or a slit coating method. In case that the first and second electrodes EL1 and EL2 disposed in the emission area EMA of each pixel PXL are supplied with corresponding alignment signals (or alignment voltages), an electric field may be formed between the first and second electrodes EL1 and EL2, so that the light emitting elements LD may be aligned between the first and second electrodes EL1 and EL2. After the light emitting elements LD are aligned, the solvent may be removed by a volatilization method or other methods. In this way, the light emitting elements LD may be provided between the first and second electrodes EL1 and EL2.

Figure 18A:
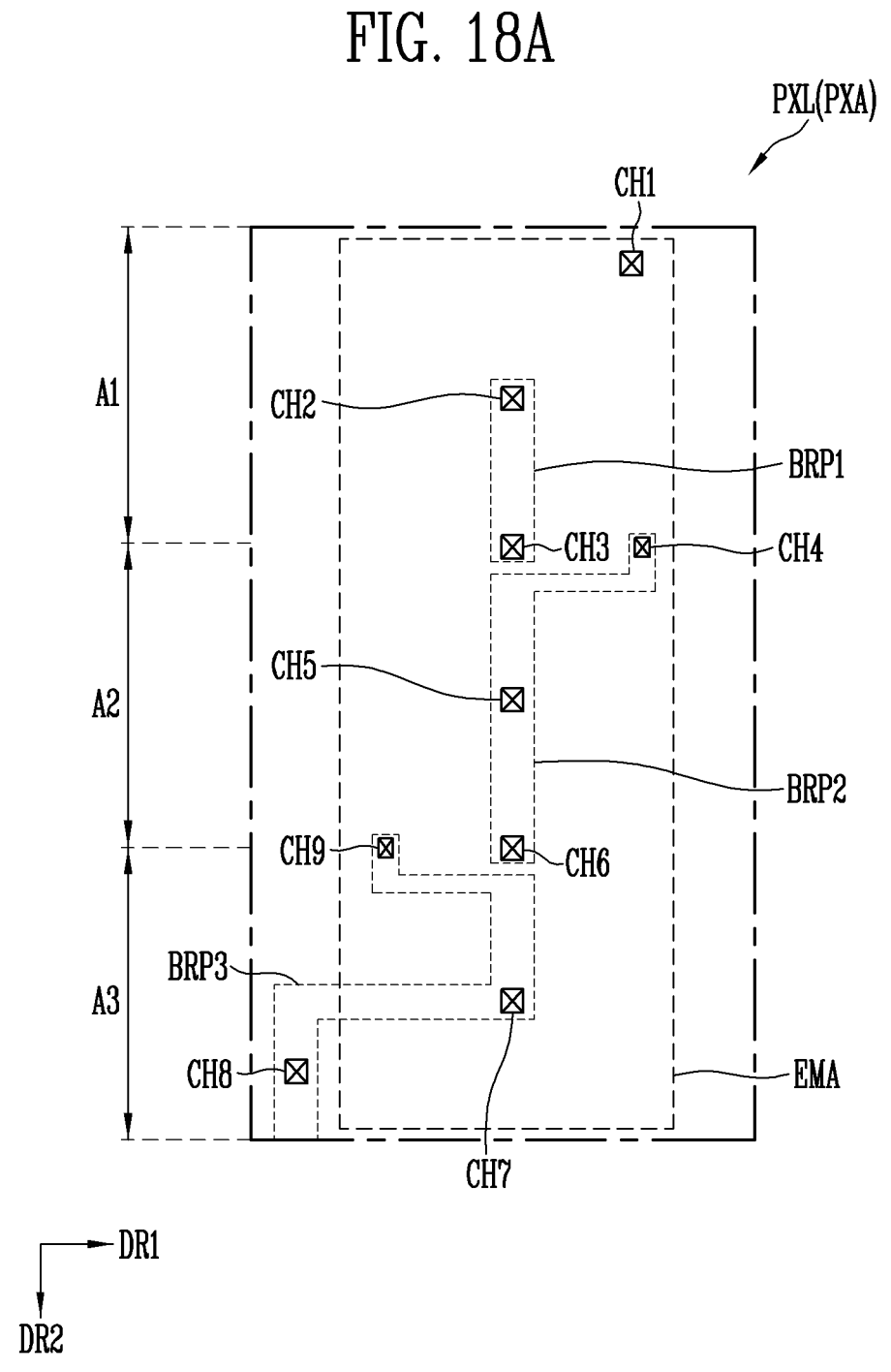
Figure 18B:
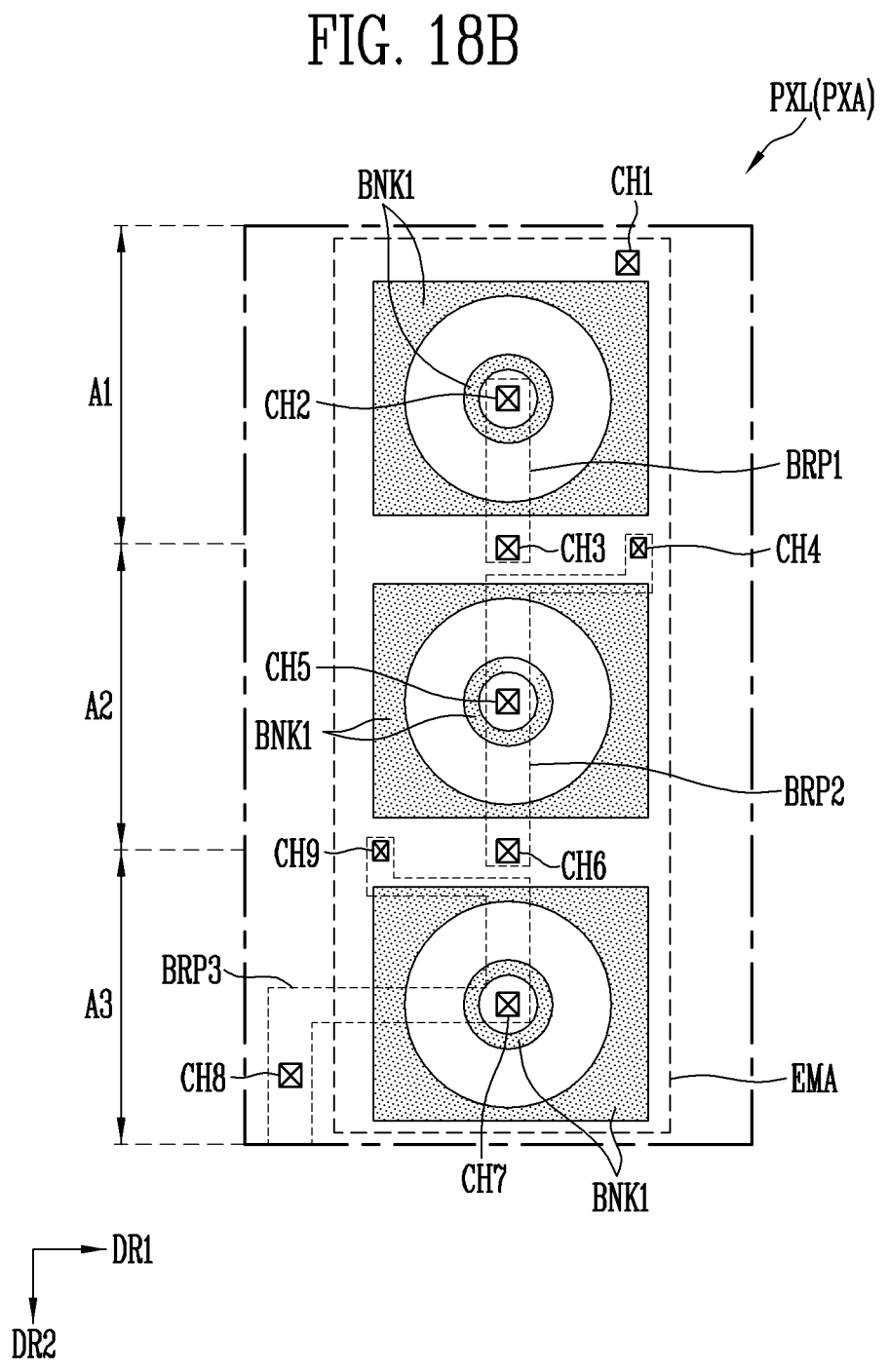
Figure 18C:
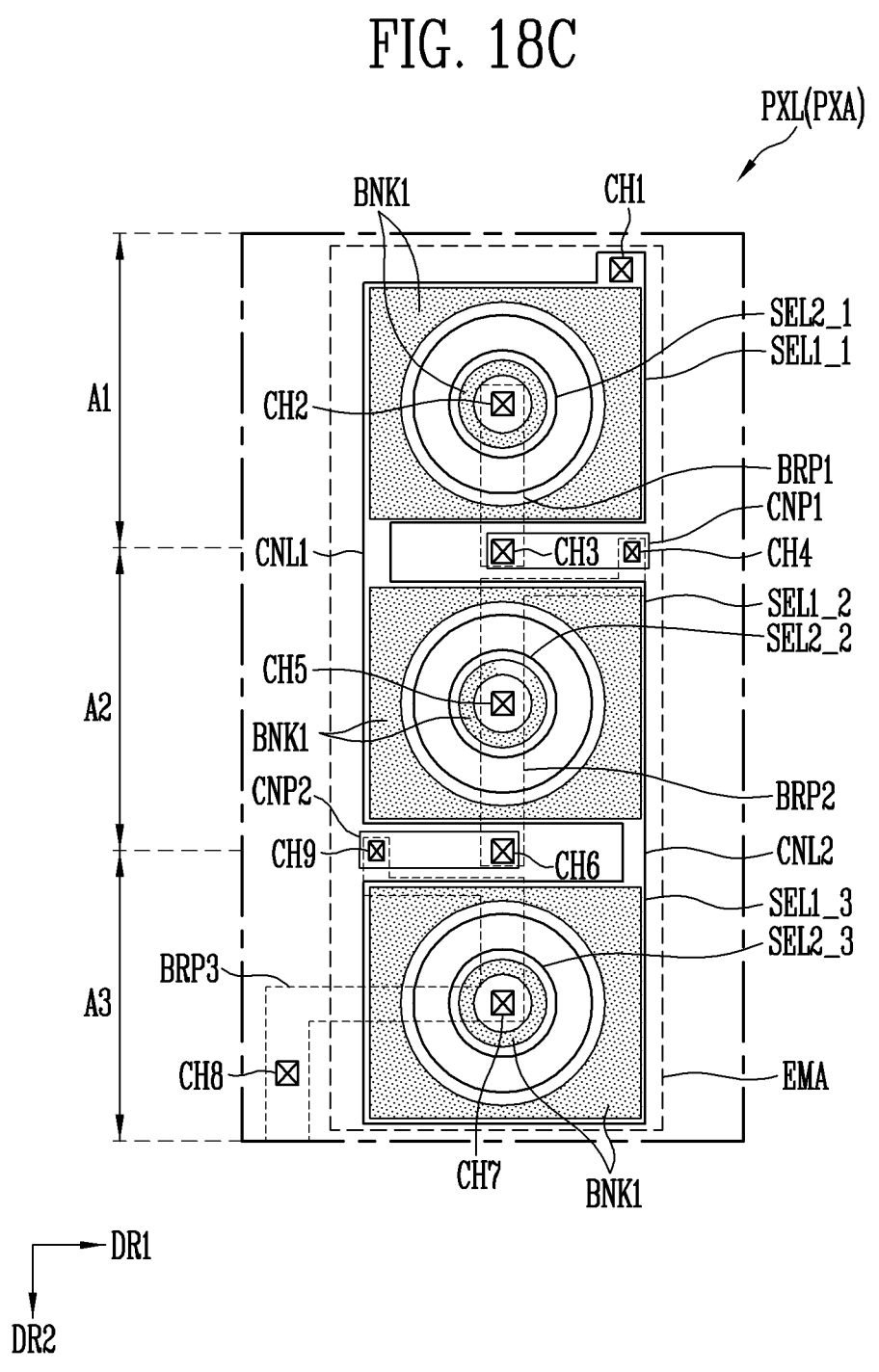
Figure 18D:
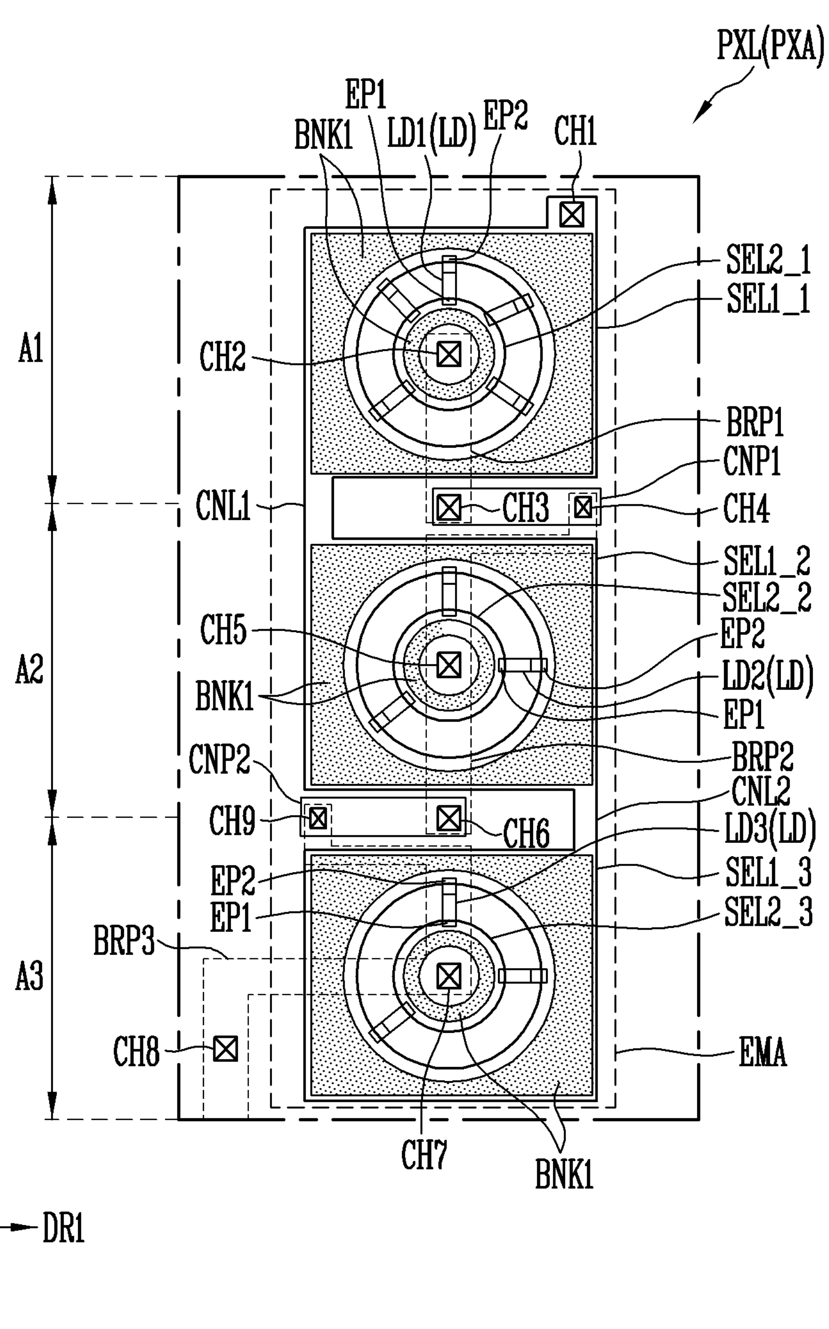
Figure 18E:
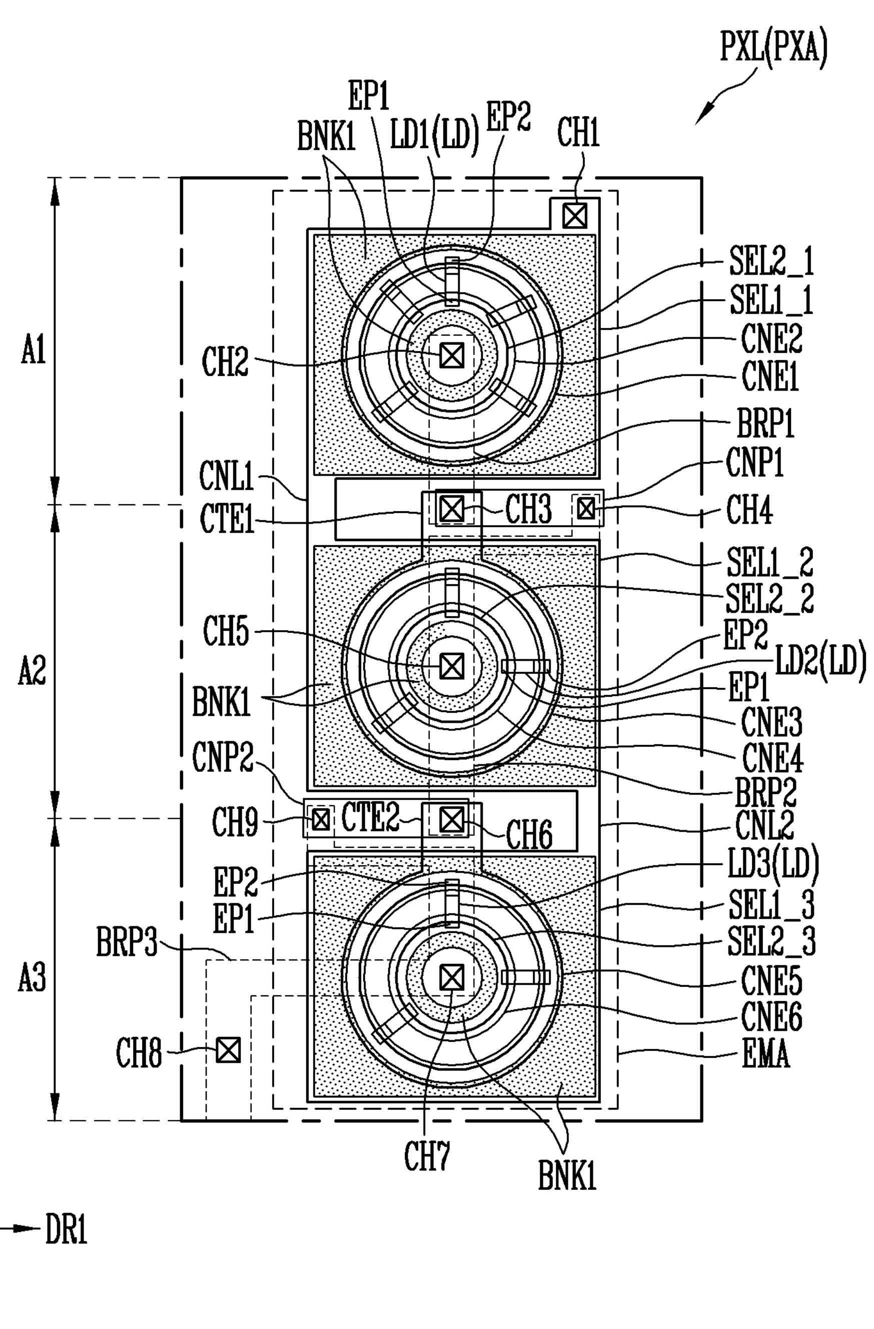
Figure 18F:
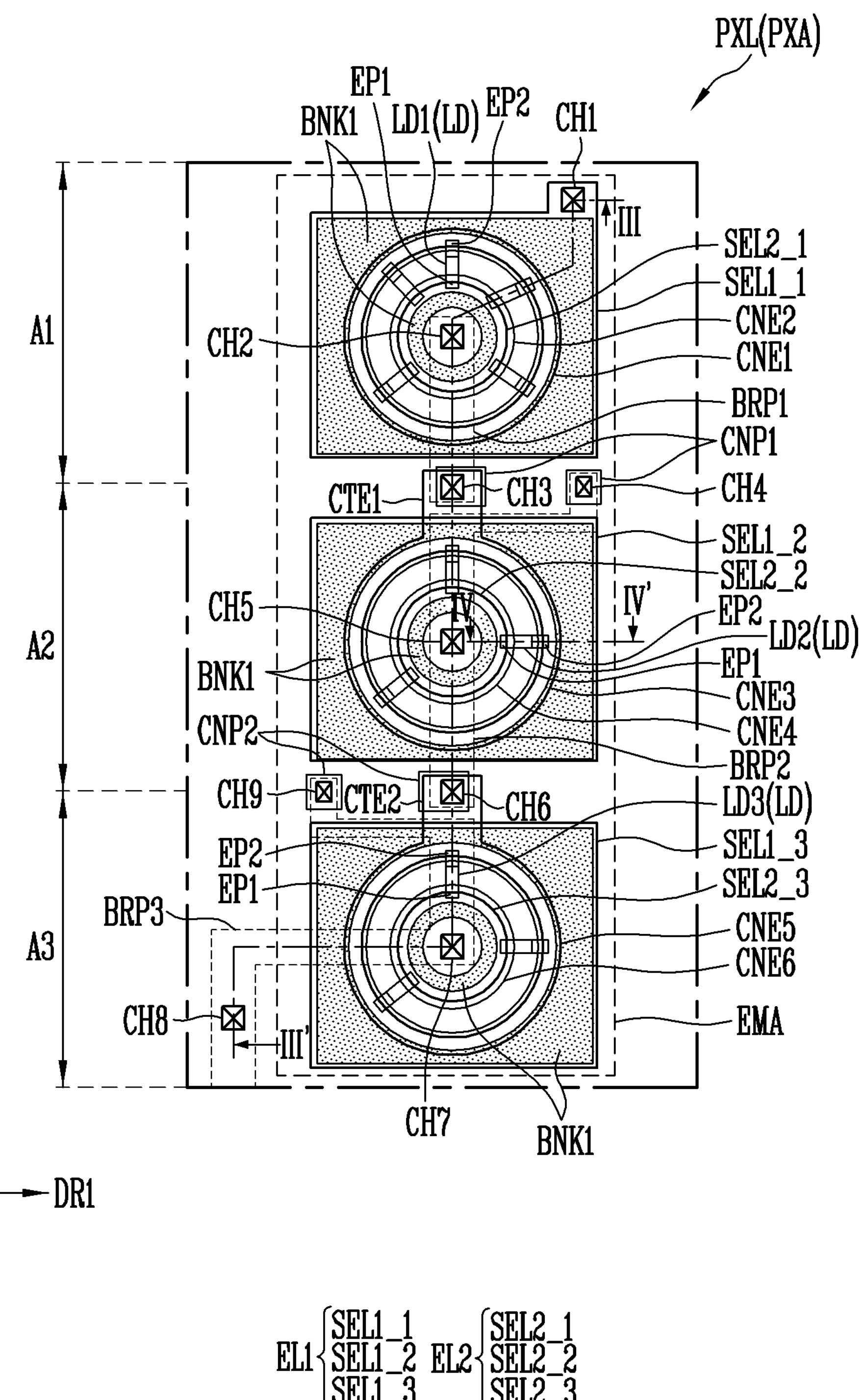
Figure 19D:
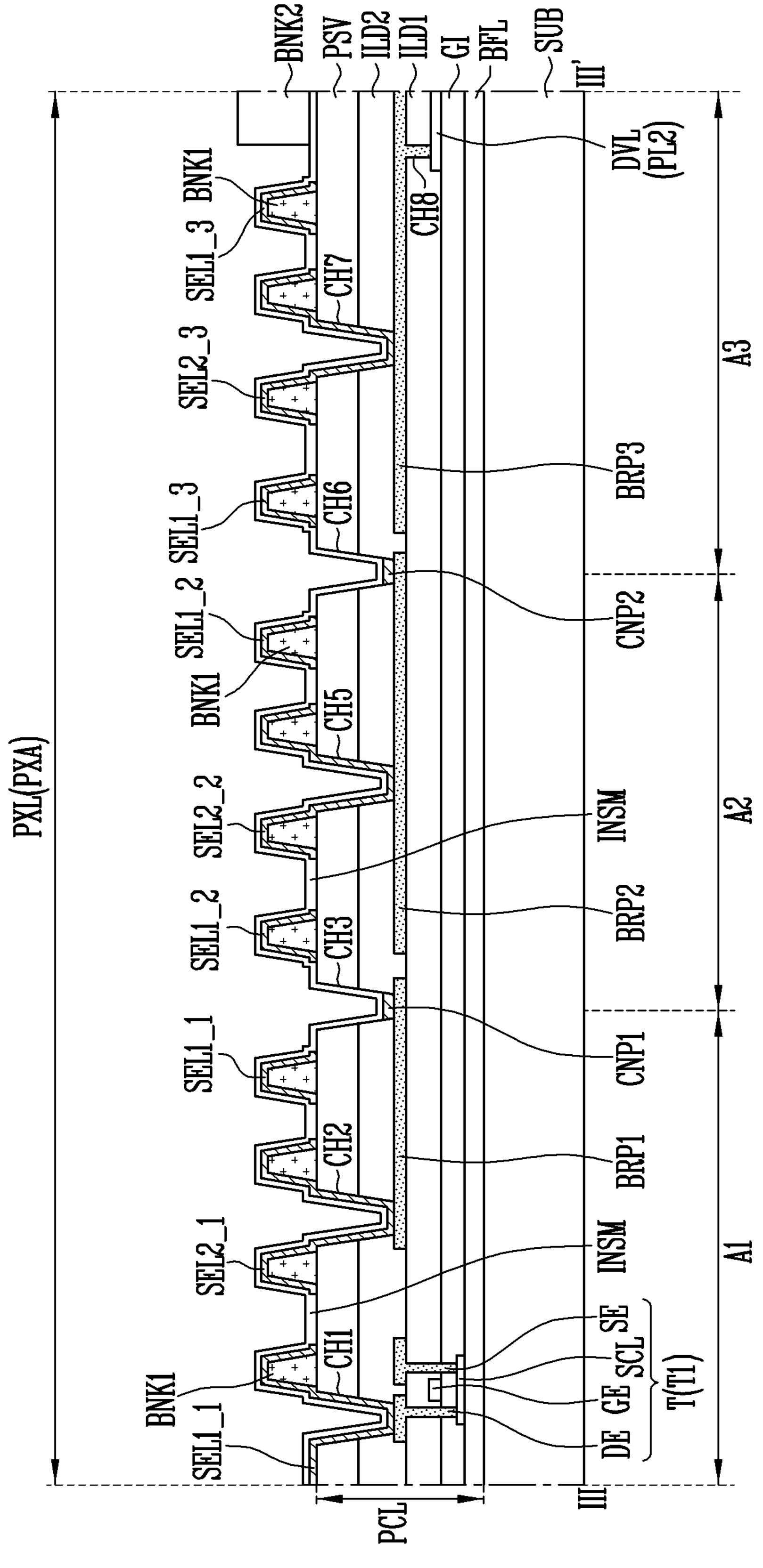
Figure 19E:
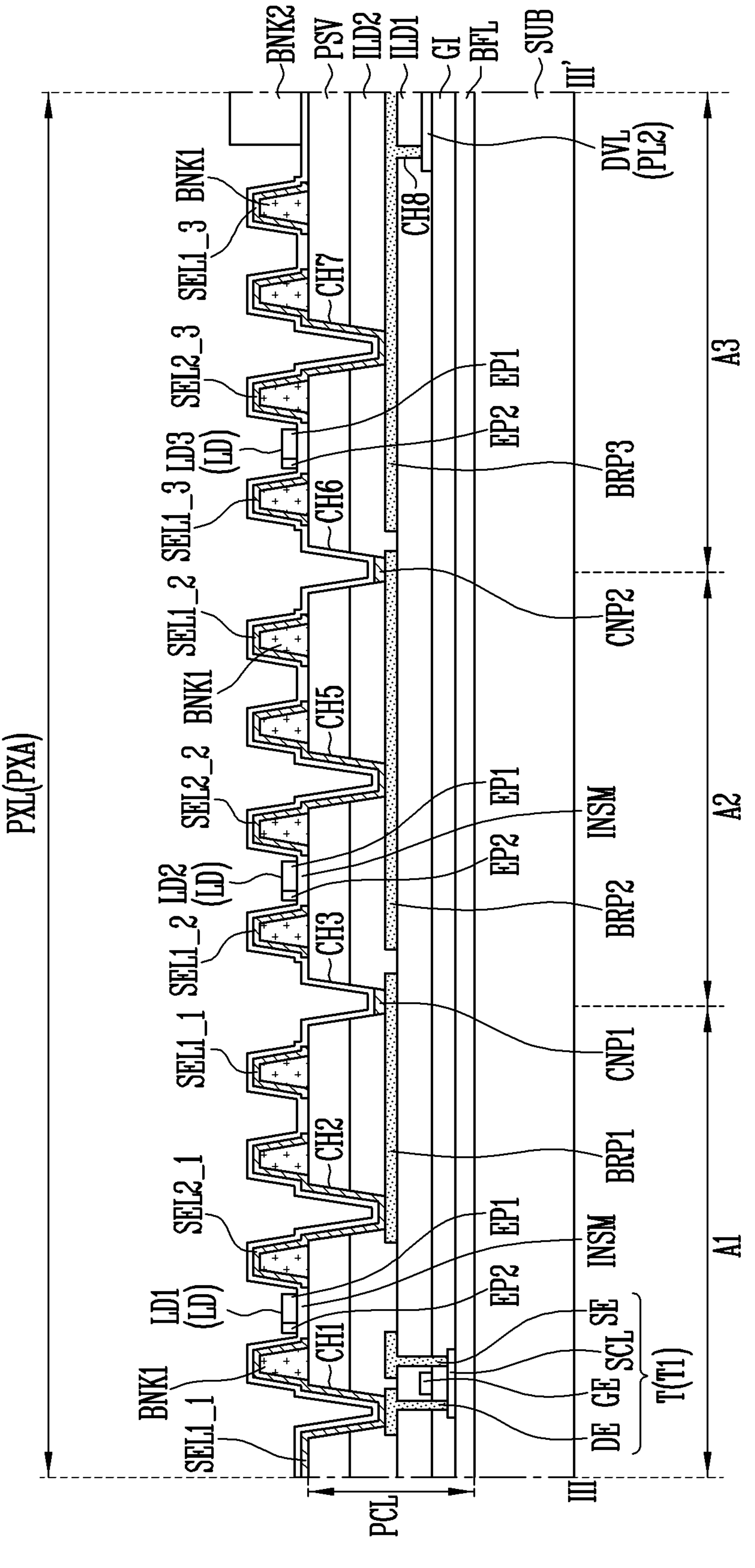
Figure 19F:
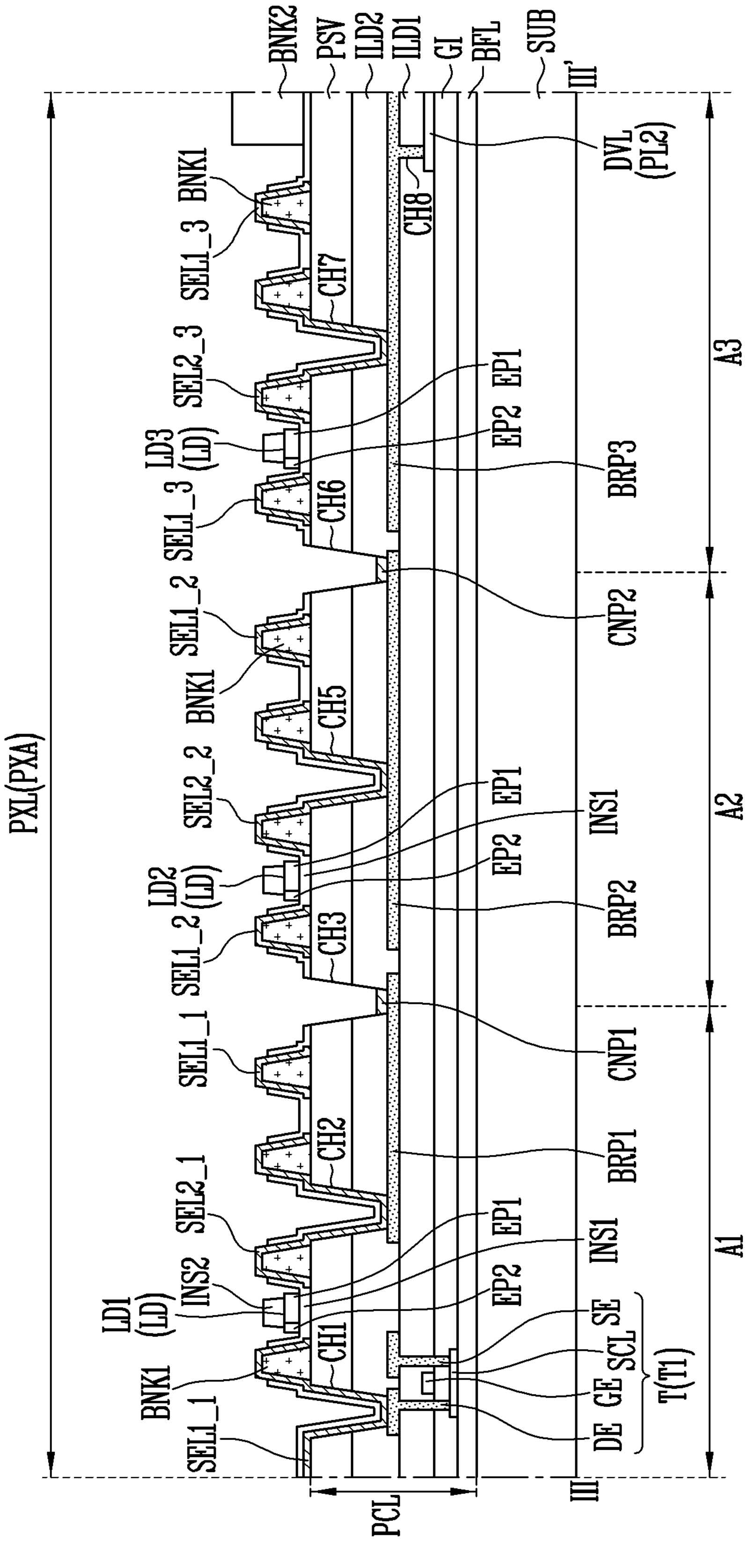
Figure 19G:
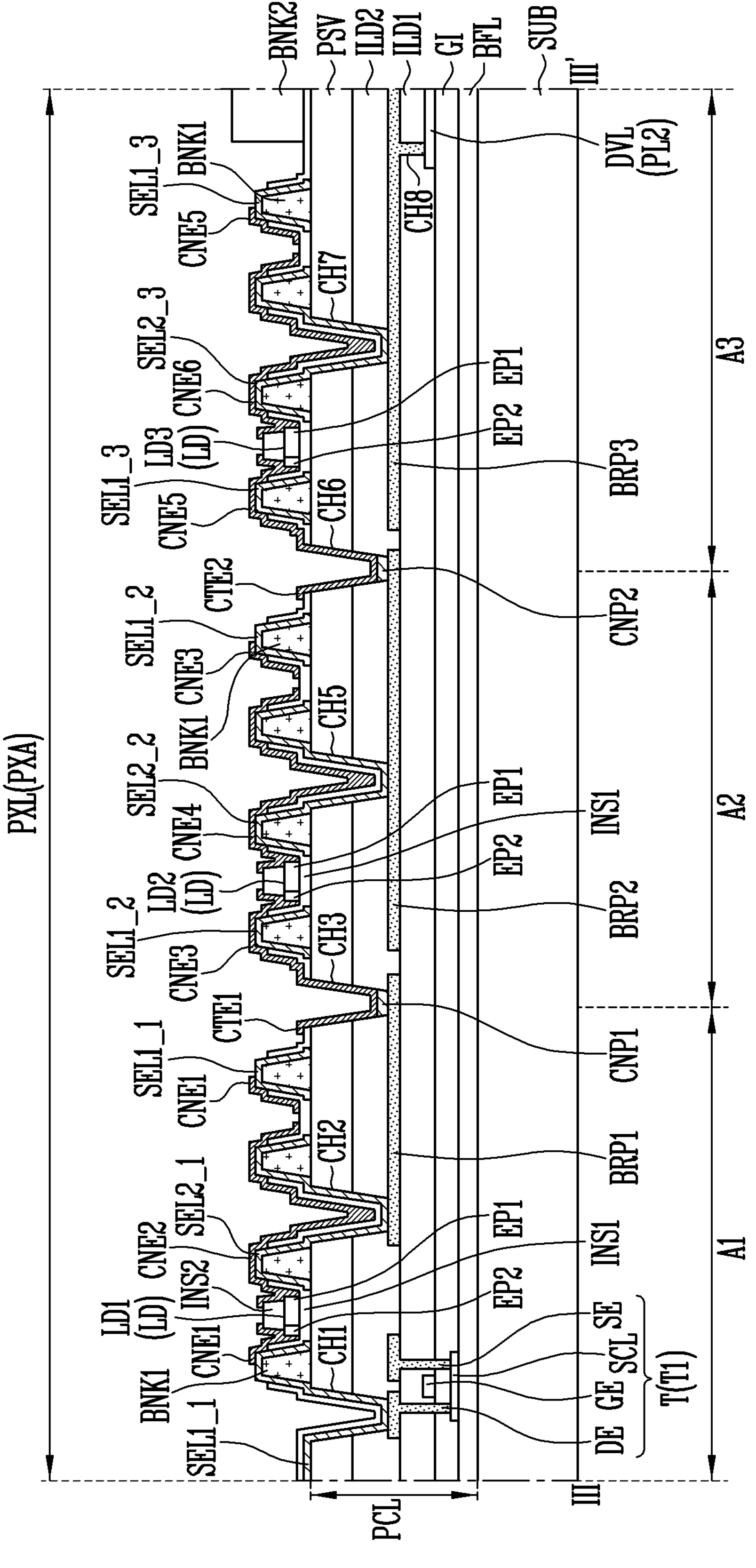
Figure 19H:
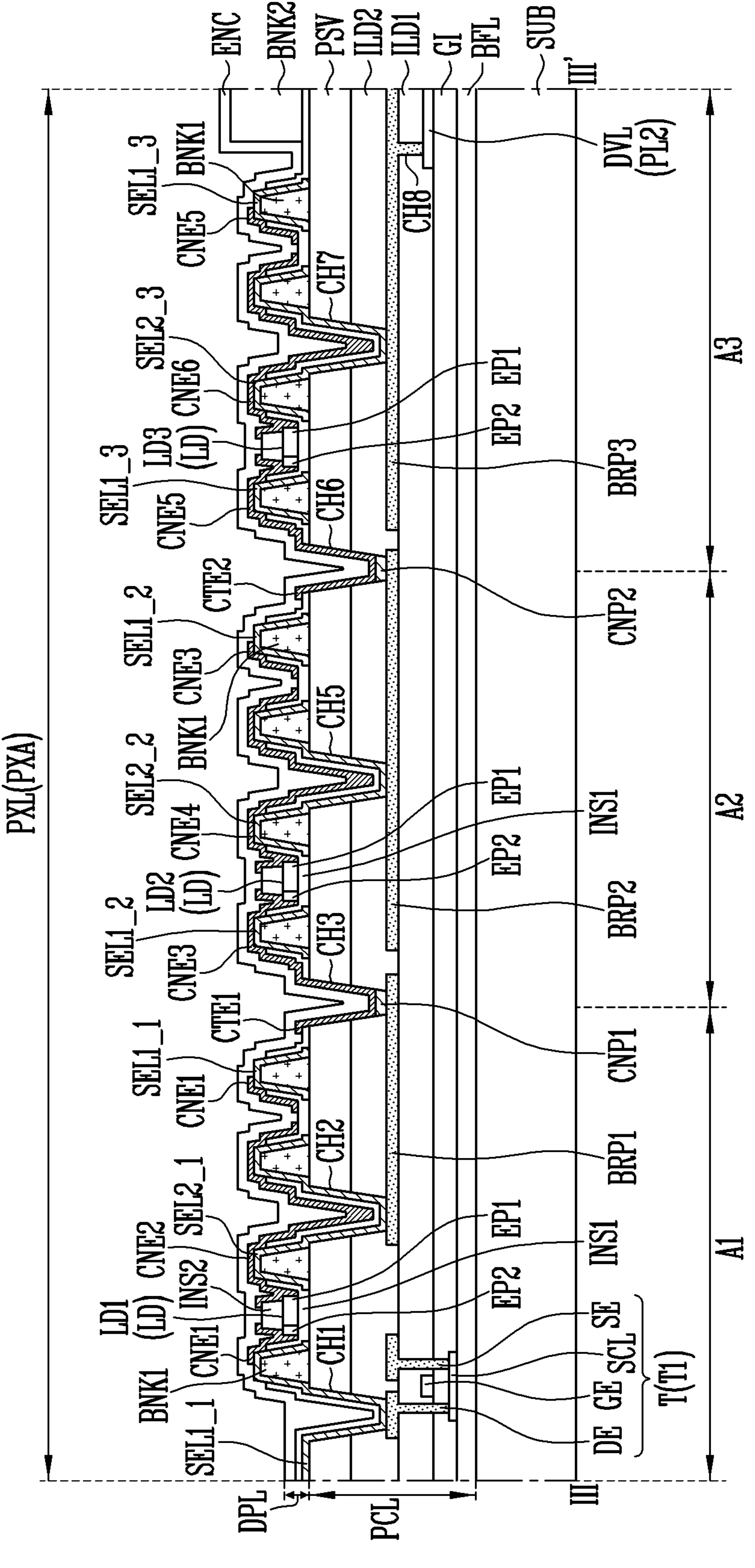

Before the light emitting elements LD are aligned in the emission area EMA of each pixel PXL, the 1-1-th sub-electrode SEL1_1, the 1-2-th sub-electrode SEL1_2, and the 1-3-th sub-electrode SEL1_3 that are included in the first electrode EL1 may be electrically and/or physically connected to each other. Furthermore, the 2-1-th sub-electrode SEL2_1, the 2-2-th sub-electrode SEL2_2, and the 2-3-th sub-electrode SEL2_3 that are included in the second electrode EL2 may be electrically connected to each other through the first to third bridge patterns BRP1, BRP2, and BRP3 and the first and second connection patterns CNP1 and CNP2. A disposition relationship of the 1-1-th to 1-3-th sub-electrodes SEL1_1 to SEL1_3 and the 2-1-th to 2-3-th sub-electrodes SEL2_1 to SEL2_3 before the light emitting elements LD are aligned will be described below with reference to FIG. 18C.

After the light emitting elements LD are aligned in the emission area EMA of each of the first to third areas A1, A2, and A3, the 1-1-th sub-electrode SEL1_1, the 1-2-th sub-electrode SEL1_2, and the 1-3-th sub-electrode SEL1_3 may be separated from each other, and located on a same column, and spaced apart from each other. The first electrode EL1 may be provided in the form of including the 1-1-th, 1-2-th, and 1-3-th sub-electrodes SEL1_2, SEL1_2, and SEL1_3, disposed on a same column and spaced apart from each other, by removing or disconnecting a portion of the first electrode EL1 after the light emitting elements LD are aligned.

As described above, in case that the light emitting elements LD are aligned in the emission area EMA of each pixel PXL, the first and second electrodes EL1 and EL2 may function as alignment electrodes (or alignment lines) for alignment of the light emitting elements LD. For example, the first electrode EL1 may be a first alignment electrode to which a first alignment signal (or a first alignment voltage) is to be applied, and the second electrode EL2 may be a second alignment electrode to which a second alignment signal (or a second alignment voltage) is to be applied. In other words, the 1-1-th to 1-3-th sub-electrodes SEL1_1, SEL1_2, and SEL1_3 each may be the first alignment electrode, and the 2-1-th to 2-3-th sub-electrodes SEL2_1, SEL2_2, and SEL2_3 each may be the second alignment electrode. The first alignment signal and the second alignment signal may have different voltage levels. If the first and second electrodes EL1 and EL2 are supplied with corresponding alignment signals, each electric field may be formed between the first and second electrodes EL1 and EL2. In other words, each electric field may be formed between the 1-1-th sub-electrode SEL1_1 and the 2-1-th sub-electrode SEL2_1, between the 2-1-th sub-electrode SEL2_1 and the 2-2-th sub-electrode SEL2_2, and between the 1-3-th sub-electrode SEL1_3 and the 2-3-th sub-electrode SEL2_3. The light emitting elements LD may be aligned in the emission area EMA of the pixels PXL by the electric field formed between two adjacent sub-electrodes.

After the light emitting elements LD are aligned in the emission area EMA of each of the first to third areas A1, A2, and A3 of each pixel PXL, the 1-1-th to 1-3-th sub-electrodes SEL1_1, SEL1_2, and SEL1_3 and the 2-1-th to 2-3-th sub-electrodes SEL2_1, SEL2_2, and SEL2_3 may function as driving electrodes configured to drive the light emitting elements LD.

In an embodiment, at a step of aligning the light emitting elements LD in the emission area EMA of each pixel PXL, the light emitting elements LD to be supplied to the emission area EMA may be controlled to be relatively biased and aligned by controlling alignment signals (or alignment voltages) to be respectively applied to the first and second electrodes EL1 and EL2 or by forming a magnetic field. For example, at the alignment step of the light emitting elements LD, as the waveforms of the alignment signals are adjusted or a magnetic field is formed in the emission area EMA, the number of light emitting elements LD oriented in the forward direction such that one end of the opposite ends EP1 and EP2 of each of the light emitting elements LD is oriented toward the first alignment electrode and the other end thereof is oriented toward the second alignment electrode may be controlled to be greater than the number of reverse light emitting elements LDr oriented in a direction opposite thereto.

Each of the light emitting elements LD may include a light emitting element fabricated by an etching method, or a core-shell light emitting element fabricated by a growth method. In case that each of the light emitting elements LD is a light emitting element fabricated by the etching method, each light emitting element LD may include an emission stack (or a stacked pattern) formed by successively stacking a first semiconductor layer 11, an active layer 12, a second semiconductor layer 13, and an additional electrode 15 in the longitudinal direction (L) of each light emitting element LD. In case that each of the light emitting elements LD is a light emitting element that has a core-shell structure and is fabricated by the growth method, each light emitting element LD may include an emission pattern 10 having a first semiconductor layer 11 disposed in a central portion of the light emitting element LD, an active layer 12 which encloses at least one side of the first semiconductor layer 11, a second semiconductor layer 13 which encloses at least one side of the active layer 12, and an additional electrode 15 which encloses at least one side of the second semiconductor layer 13.

Each of the light emitting elements LD may include a first end EP1 electrically connected to one sub-electrode of two sub-electrodes adjacent to each other in each of the first to third areas A1, A2, and A3, and a second end EP2 electrically connected to a remaining sub-electrode of the two adjacent sub-electrodes. In an embodiment, the first end EP1 of each light emitting element LD may be a first semiconductor layer 11 including a n-type semiconductor layer, and the second end EP2 thereof may be a second semiconductor layer 13 including a p-type semiconductor layer. In other words, in the emission area EMA of the pixel PXL, each light emitting element LD may be electrically connected in the forward direction between two sub-electrodes adjacent to each other in the first direction DR1. As described above, the light emitting elements LD electrically connected in the forward direction between the two adjacent sub-electrodes may form valid light sources of each of the first to third serial sets SET1 to SET3.

The first end EP1 of each of the light emitting elements LD may be directly electrically connected to one sub-electrode of two sub-electrodes adjacent to each other in the first direction DR1, or may be electrically connected to the one sub-electrode through a contact electrode CNE. Furthermore, the second end EP2 of each of the light emitting elements LD may be directly connected to the remaining sub-electrode of the two adjacent sub-electrodes, or may be electrically connected to the remaining sub-electrode through a contact electrode CNE.

The light emitting elements LD may be disposed between two adjacent sub-electrodes on the passivation layer PSV of each of the first to third areas A1, A2, and A3. To stably support the light emitting elements LD, an insulating pattern INSP may be provided between the passivation layer PSV and each light emitting element LD. The insulating pattern INSP may be formed as an inorganic insulating layer including an inorganic material, or as an organic insulating layer including an organic material. The insulating pattern INSP may be provided on the passivation layer PSV to fill space between the passivation layer PSV and each light emitting element LD therewith. The insulating pattern INSP may stably support the light emitting elements LD so that the light emitting elements LD aligned between two adjacent sub-electrodes may be prevented from being removed from the aligned positions. The insulating pattern INSP and the two adjacent sub-electrodes, e.g., the 1-1-th and 2-1-th sub-electrodes SEL1_1 and SEL2_1, may have a same height, but the disclosure is not limited thereto. In an embodiment, the insulating pattern INSP and the 1-1-th and 2-1-th sub-electrodes SEL1_1 and SEL2_1 may have different heights. Furthermore, the insulating pattern INSP may be omitted depending on processing conditions of the display element layer DPL.

The light emitting elements LD of each pixel PXL may include first light emitting elements LD1 (LD) included in the first serial set SET1, second light emitting elements LD2 (LD) included in the second serial set SET2, and third light emitting elements LD3 (LD) included in the third serial set SET3. In an embodiment, the light emitting elements LD of each pixel PXL may include at least one reverse light emitting element LDr electrically connected between two adjacent sub-electrodes in a direction (e.g., a reverse direction) opposite to the forward direction.

Contact electrodes CNE may be respectively disposed on the 1-1-th to 1-3-th sub-electrodes SEL1_1, SEL1_2, and SEL1_3 and the 2-1-th to 2-3-th sub-electrodes SEL2_1, SEL2_2, and SEL2_3.

Each contact electrode CNE may be formed of various transparent conductive materials. For example, the contact electrode CNE may include at least one of various conductive materials, e.g., ITO, IZO, and ITZO, and may be substantially transparent or semi-transparent to satisfy a predetermined transmittancy. However, the material of the contact electrode CNE is not limited to those of the foregoing embodiments. In some embodiments, the contact electrode CNE may be formed of various opaque conductive materials. In an embodiment, the contact electrodes CNE may include a first contact electrode CNE1 disposed on the 1-1-th sub-electrode SEL1_1, a second contact electrode CNE2 disposed on the 2-1-th sub-electrode SEL2_1, a third contact electrode CNE3 disposed on the 1-2-th sub-electrode SEL1_2, a fourth contact electrode CNE4 disposed on the 2-2-th sub-electrode SEL2_2, a fifth contact electrode CNE5 disposed on the 1-3-th sub-electrode SEL1_3, and a sixth contact electrode CNE6 disposed on the 2-3-th sub-electrode SEL2_3.

The first contact electrode CNE1 may electrically connect the 1-1-th sub-electrode SEL1_1 with one end of the opposite ends EP1 and EP2 of each of the first light emitting elements LD1 (LD) in the first area A1 of each pixel PXL. In a plan view, the first contact electrode CNE1 may overlap both the one end of each of the first light emitting elements LD1 (LD) and the 1-1-th sub-electrode SEL1_1.

The second contact electrode CNE2 may electrically connect the 2-1-th sub-electrode SEL2_1 with a remaining end of the opposite ends EP1 and EP2 of each of the first light emitting elements LD1 (LD) in the first area A1. In a plan view, the second contact electrode CNE2 may overlap the remaining end of each of the first light emitting elements LD1 (LD) and the 2-1-th sub-electrode SEL2_1.

The third contact electrode CNE3 may electrically connect the 1-2-th sub-electrode SEL1_2 with one end of the opposite ends EP1 and EP2 of each of the second light emitting elements LD2 (LD) in the second area A2 of each pixel PXL. In a plan view, the third contact electrode CNE3 may overlap both the one end of each of the second light emitting elements LD2 (LD) and the 1-2-th sub-electrode SEL1_2. In an embodiment, the third contact electrode CNE3 may extend from the second area A2 to at least a portion of the first area A1.

The fourth contact electrode CNE4 may electrically connect the 2-2-th sub-electrode SEL2_2 with a remaining end of the opposite ends EP1 and EP2 of each of the second light emitting elements LD2 (LD) in the second area A2. In a plan view, the fourth contact electrode CNE4 may overlap both the remaining end of each of the second light emitting elements LD2 (LD) and the 2-2-th sub-electrode SEL2_2.

The fifth contact electrode CNE5 may electrically connect the 1-3-th sub-electrode SEL1_3 with one end of the opposite ends EP1 and EP2 of each of the third light emitting elements LD3 (LD) in the third area A3 of each pixel PXL. In a plan view, the fifth contact electrode CNE5 may overlap both the one end of each of the third light emitting elements LD3 (LD) and the 1-3-th sub-electrode SEL1_3. In an embodiment, the fifth contact electrode CNE5 may extend from the third area A3 to at least a portion of the second area A2.

The sixth contact electrode CNE6 may electrically connect the 2-3-th sub-electrode SEL2_3 with a remaining end of the opposite ends EP1 and EP2 of each of the third light emitting elements LD3 (LD) in the third area A3. In a plan view, the sixth contact electrode CNE6 may overlap the remaining end of each of the third light emitting elements LD3 (LD) and the 2-3-th sub-electrode SEL2_3.

The first bridge pattern BRP1 disposed in the first area A1 may be electrically and/or physically connected with the third contact electrode CNE3 disposed in the second area A2 through the first intermediate electrode CTE1.

The first intermediate electrode CTE1 may be disposed in the area between the first area A1 and the second area A2 and be integrally formed with (or integral with) the third contact electrode CNE3. In case that the first intermediate electrode CTE1 is integral with the third contact electrode CNE3, the first intermediate electrode CTE1 may be regarded as a portion of the third contact electrode CNE3. For example, in a plan view, a portion of the third contact electrode CNE3 that extends (or protrudes) from the second area A2 to at least a portion of the first area A1 may be the first intermediate electrode CTE1. Since the first intermediate electrode CTE1 is a portion of the third contact electrode CNE3, the first intermediate electrode CTE1 and the third contact electrode CNE3 may include a same material.

In a plan view, the first intermediate electrode CTE1 may overlap the first bridge pattern BRP1 provided in the first area A1. Furthermore, the first intermediate electrode CTE1 may overlap a portion of the first connection pattern CNP1 disposed in the area between the first area A1 and the second area A2. The first intermediate electrode CTE1 may be electrically and/or physically connected with the first bridge pattern BRP1 through the third contact hole CH3. A portion of the first connection pattern CNP1 may be disposed between the first intermediate electrode CTE1 and the first bridge pattern BRP1.

As described above, since the first bridge pattern BRP1, the first intermediate electrode CTE1, and the third contact electrode CNE3 are electrically connected to each other, the first serial set SET1 and the second serial set SET2 that are included in the emission part EMU of each pixel PXL may be electrically and/or physically connected to each other.

The second bridge pattern BRP2 disposed in the second area A2 may be electrically and/or physically connected with the fifth contact electrode CNE5 disposed in the third area A3 through the second intermediate electrode CTE2.

The second intermediate electrode CTE2 may be disposed in the area between the second area A2 and the third area A3 and be integral with the fifth contact electrode CNE5. In case that the second intermediate electrode CTE2 is integral with the fifth contact electrode CNE5, the second intermediate electrode CTE2 may be regarded as a portion of the fifth contact electrode CNE5. For example, in a plan view, a portion of the fifth contact electrode CNE5 that extends (or protrudes) from the third area A3 to at least a portion of the second area A2 may be the second intermediate electrode CTE2. Since the second intermediate electrode CTE2 is a portion of the fifth contact electrode CNE5, the second intermediate electrode CTE2 and the fifth contact electrode CNE5 may include a same material.

In a plan view, the second intermediate electrode CTE2 may overlap the second bridge pattern BRP2 provided in the second area A2. Furthermore, the second intermediate electrode CTE2 may overlap a portion of the second connection pattern CNP2 disposed in the portion between the second area A2 and the third area A3. The second intermediate electrode CTE2 may be electrically and/or physically connected with the second bridge pattern BRP2 through the sixth contact hole CH6. A portion of the second connection pattern CNP2 may be disposed between the second intermediate electrode CTE2 and the second bridge pattern BRP2.

As described above, since the second bridge pattern BRP2, the second intermediate electrode CTE2, and the fifth contact electrode CNE5 are electrically connected to each other, the second serial set SET2 and the third serial set SET3 that are included in the emission part EMU of each pixel PXL may be electrically and/or physically connected to each other.

The display element layer DPL of each pixel PXL may include the first connection pattern CNP1 disposed in the area between the first area A1 and the second area A2, and the second connection pattern CNP2 disposed in the area between the second area A2 and the third area A3.

A portion of the first connection pattern CNP1 may correspond to the third contact hole CH3 and be disposed between the first bridge pattern BRP1 and the first intermediate electrode CTE1. Furthermore, another portion of the first connection pattern CNP1 may overlap the second bridge pattern BRP2, in a plan view, and be electrically connected with the second bridge pattern BRP2 through a fourth contact hole CH4.

A portion of the second connection pattern CNP2 may correspond to the sixth contact hole CH6 and be disposed between the second bridge pattern BRP2 and the second intermediate electrode CTE2. Furthermore, another portion of the second connection pattern CNP2 may overlap the third bridge pattern BRP3, in a plan view, and be electrically connected with the third bridge pattern BRP3 through a ninth contact hole CH9.

In an embodiment, the first and second connection patterns CNP1 and CNP2 may be provided on a same layer and include a same material. For example, the first and second connection patterns CNP1 and CNP2, the 1-1-th to 1-3-th sub-electrodes SEL1_1, SEL1_2, and SEL1_3, and the 2-1-th to 2-3-th sub-electrodes SEL2_1, SEL2_2, and SEL2_3 may be provided on a same layer and include a same material.

Each of the first to sixth contact electrodes CNE1 to CNE6 may have a circular shape, but the disclosure is not limited thereto, and for example, it may be changed in various shapes so long as it may reliably electrically and/or physically connect a sub-electrode disposed thereunder with one of the opposite ends EP1 and EP2 of each of the light emitting elements LD.

An encapsulation layer ENC may be provided and/or formed on the first to sixth contact electrodes CNE1 to CNE6. The encapsulation layer ENC may cover the pixel circuit layer PCL and the display element layer DPL that are provided in each pixel PXL. The encapsulation layer ENC may be an inorganic insulating layer including an inorganic material or an organic insulating layer including an organic material. For example, the encapsulation layer ENC may have a structure formed by alternately stacking at least one inorganic layer and at least one organic layer.

According to the foregoing embodiment, the emission area EMA of each pixel PXL is divided into first to third areas A1, A2, and A3 in the second direction DR2. In each of the first to third areas A1, A2, and A3, two sub-electrodes spaced apart from each other, and light emitting elements LD electrically connected in parallel to each other between the sub-electrodes, may be provided. In an embodiment, the light emitting elements LD disposed in each of the first to third areas A1, A2, and A3 may be disposed (or aligned) in various directions in the circumferential direction of one sub-electrode of two sub-electrodes disposed in the corresponding area, the one sub-electrode having an isolated circular island shape enclosed by the other sub-electrode. In this case, the light emitting elements LD may not be disposed (or aligned) to be biased in a specific direction in the emission area EMA of each pixel PXL. Therefore, light emitted from each of the light emitting elements LD may be prevented from being concentrated in a specific direction. Hence, the amount (or the intensity) of light emitted from the emission area EMA of each pixel PXL may be similar to or substantially equal to the amount (or intensity) of light emitted from the emission area EMA of an adjacent pixel PXL. Therefore, the display device in accordance with an embodiment may have uniform emission distribution over the overall area thereof.

According to the foregoing embodiment, in each of the first to third areas A1, A2, and A3, two sub-electrodes spaced apart from each other and light emitting elements LD electrically connected in parallel to each other between the sub-electrodes may form a serial set of the corresponding area. A bridge pattern disposed in each of the first to third areas A1, A2, and A3 and an intermediate electrode which is disposed between two successive areas thereof and integral with a contact electrode in a subsequent area of the two successive areas may be used to electrically connect light emitting elements LD located in each of the two successive areas. In other words, the bridge pattern of each of the first to third areas A1, A2, and A3 and the intermediate electrode disposed between two successive areas may be electrically connected to each other so that the first serial set SET1 of the first area A1 and the second serial set SET2 of the second area A2 may be electrically connected to each other, and the second serial set SET2 of the second area A2 and the third serial set SET3 of the third area A3 may be electrically connected to each other. In this way, the light emitting elements LD provided in each of the first to third areas A1, A2, and A3 may be connected in a serial/parallel combination structure so that the emission part EMU of each pixel PXL may be formed.

According to the foregoing embodiment, the emission part EMU has a serial/parallel combination structure. Hence, each pixel PXL may be reliably driven, so that driving current flowing to the display panel of the display device may be reduced, whereby the power consumption efficiency may be improved.

In the foregoing embodiment, in a cross-sectional view, the pixel circuit layer PCL included in each pixel PXL is illustrated as being disposed under the display element layer DPL and overlapping the display element layer DPL. However, the disclosure is not limited thereto. In an embodiment, the pixel circuit layer PCL included in each pixel PXL may be disposed under the display element layer DPL and provided in an area which does not overlap the display element layer DPL.

Figure 12:
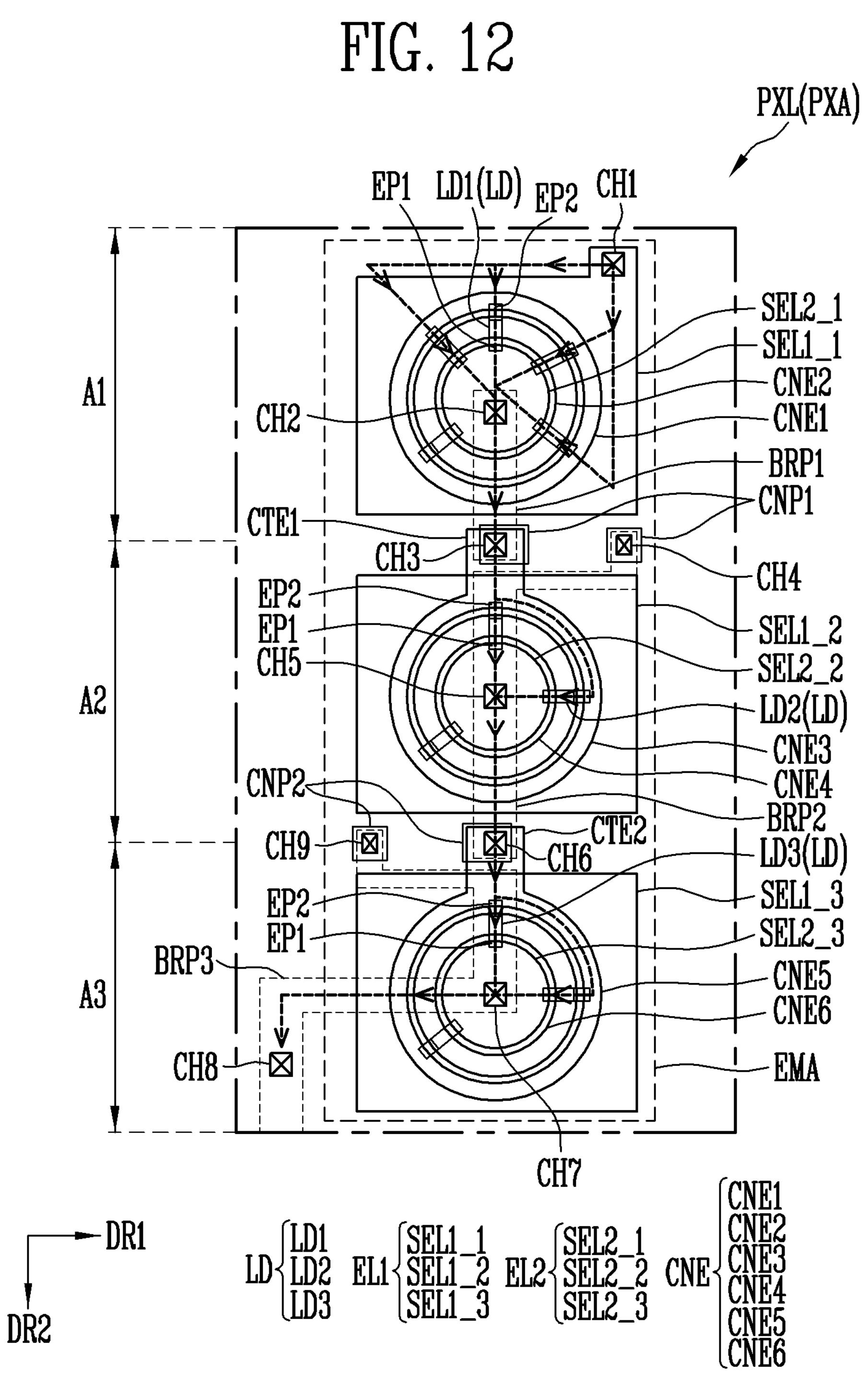
FIG. 12 is a schematic plan diagram illustrating driving current flowing through a pixel in accordance with an embodiment of the disclosure and, for example, illustrates the flow of driving current flowing through the pixel of FIG. 8.

FIG. 12 is a schematic plan view illustrating driving current flowing through a pixel in accordance with an embodiment and, for example, illustrates the flow of driving current flowing through the pixel of FIG. 8. As illustrated in FIG. 12, the flow of driving current flowing through the pixel PXL of FIG. 8 in case that the pixel PXL is driven to emit light in response to a data signal having a predetermined grayscale value, is shown by the dotted arrows.

Referring to FIGS. 1A to 5, 7B, 7C, and 8 to 12, in case that driving current flows from the first power line PL1 to the driving voltage line DVL (PL2) by the first transistor T1 (T), e.g., the driving transistor, provided in the pixel circuit layer PCL included in each pixel PXL, the driving current may be drawn to the emission part EMU of each pixel PXL through the first contact hole CH1. For example, driving current flows to the 1-1-th sub-electrode SEL1_1 of the first serial set SET1 through the first contact hole CH1, and the driving current flows to the 2-1-th sub-electrode SEL2_1 via the first light emitting elements LD1 (LD) of the first serial set SET1. Therefore, the first light emitting elements LD1 (LD) each may emit light at a luminance corresponding to current distributed thereto.

The driving current flowing through the 2-1-th sub-electrode SEL2_1 of the first serial set SET1 may be drawn to the 1-2-th sub-electrode SEL1_2 of the second serial set SET2 via the first bridge pattern BRP1 electrically connected with the 2-1-th sub-electrode SEL2_1 through the second contact hole CH2, the first intermediate electrode CTE1 electrically connected to the first bridge pattern BRP1 through the third contact hole CH3, and the third contact electrode CNE3 electrically connected to the first intermediate electrode CTE1. The driving current may flow to the 2-2-th sub-electrode SEL2_2 of the second serial set SET2 via the second light emitting elements LD2 (LD) electrically connected in the forward direction between the 1-2-th sub-electrode SEL1_2 and the 2-2-th sub-electrode SEL2_2 of the second serial set SET2. Therefore, the second light emitting elements LD2 (LD) each may emit light having a luminance corresponding to current distributed thereto.

The driving current flowing through the 2-2-th sub-electrode SEL2_2 of the second serial set SET2 may be drawn to the 1-3-th sub-electrode SEL1_3 of the third serial set SET3 via the second bridge pattern BRP2 electrically connected with the 2-2-th sub-electrode SEL2_2 through the fifth contact hole CH5, the second intermediate electrode CTE2 electrically connected to the second bridge pattern BRP2 through the sixth contact hole CH6, and the fifth contact electrode CNE5 electrically connected to the second intermediate electrode CTE2. The driving current may flow to the 2-3-th sub-electrode SEL2_3 of the third serial set SET3 via the third light emitting elements LD3 (LD) electrically connected in the forward direction between the 1-3-th sub-electrode SEL1_3 and the 2-3-th sub-electrode SEL2_3 of the third serial set SET3. Therefore, the third light emitting elements LD3 (LD) each may emit light having a luminance corresponding to current distributed thereto.

In this way, the driving current of each pixel PXL may flow successively via the first light emitting elements LD1 (LD) of the first serial set SET1, the second light emitting elements LD2 (LD) of the second serial set SET2, and the third light emitting elements LD3 (LD) of the third serial set SET3. Hence, each pixel PXL may emit light having a luminance corresponding to a data signal supplied thereto during each frame period.

Figure 13:
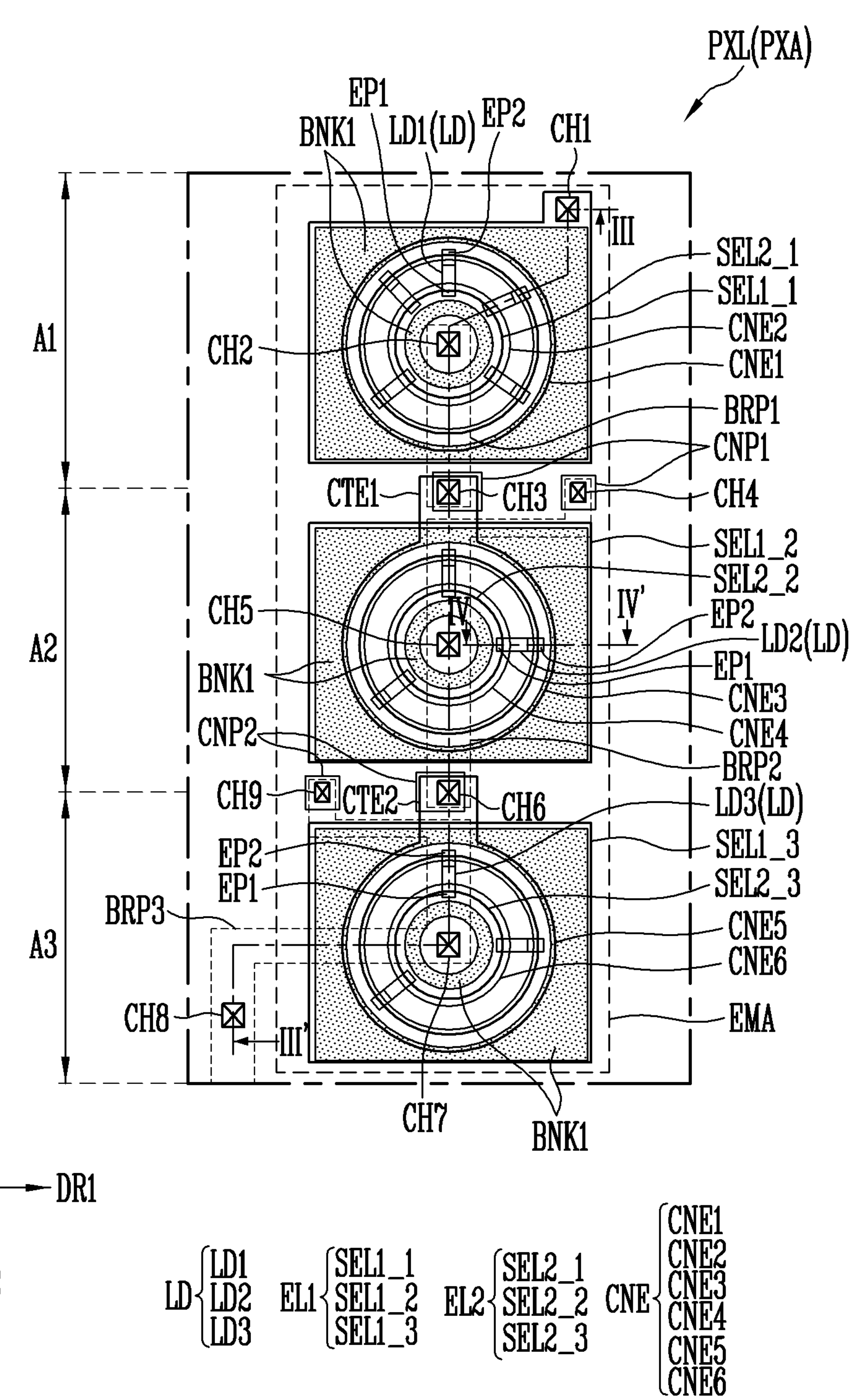
FIG. 13 is a schematic plan view illustrating another example of a pixel in accordance with an embodiment of the disclosure.
Figure 14:
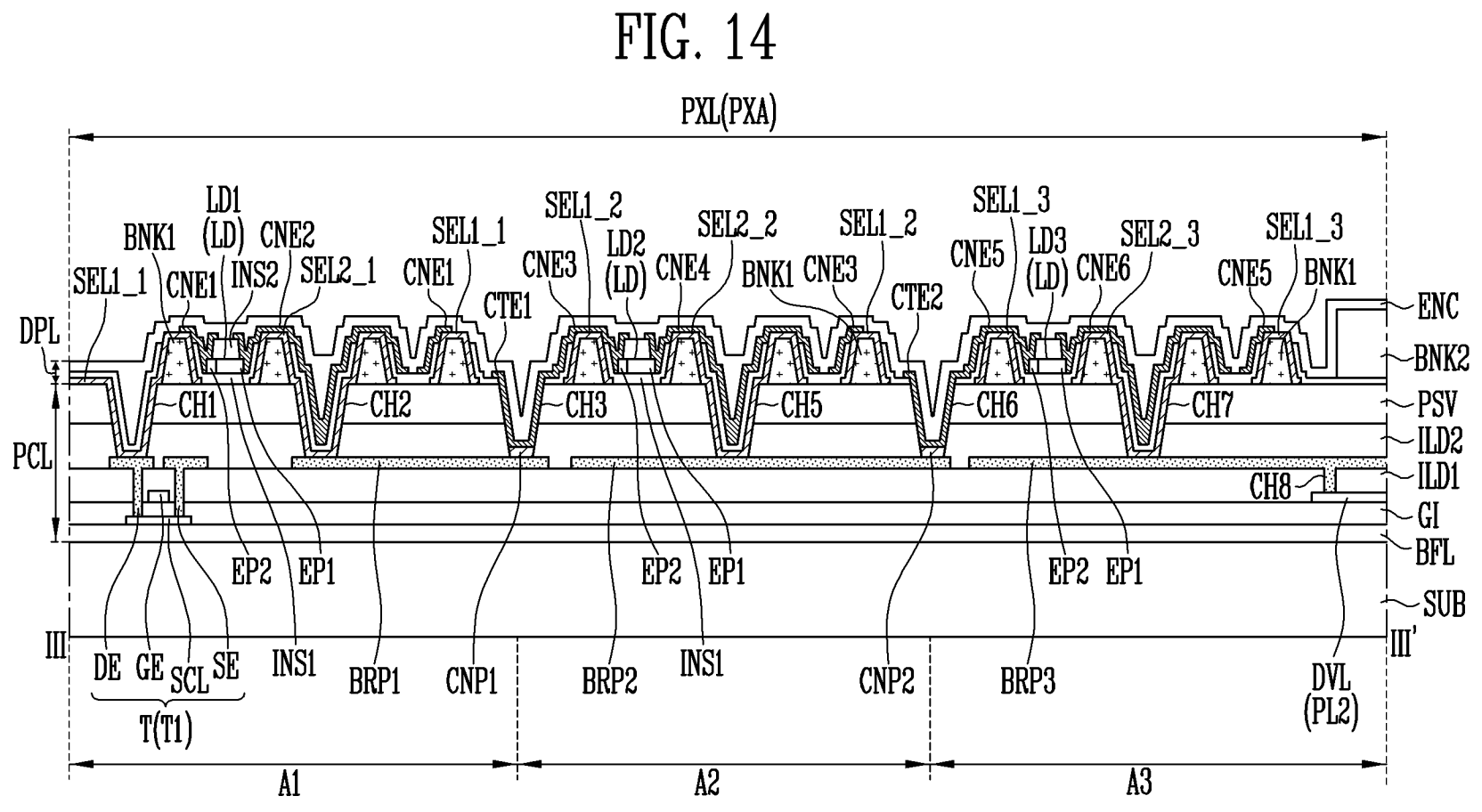
Figure 15:
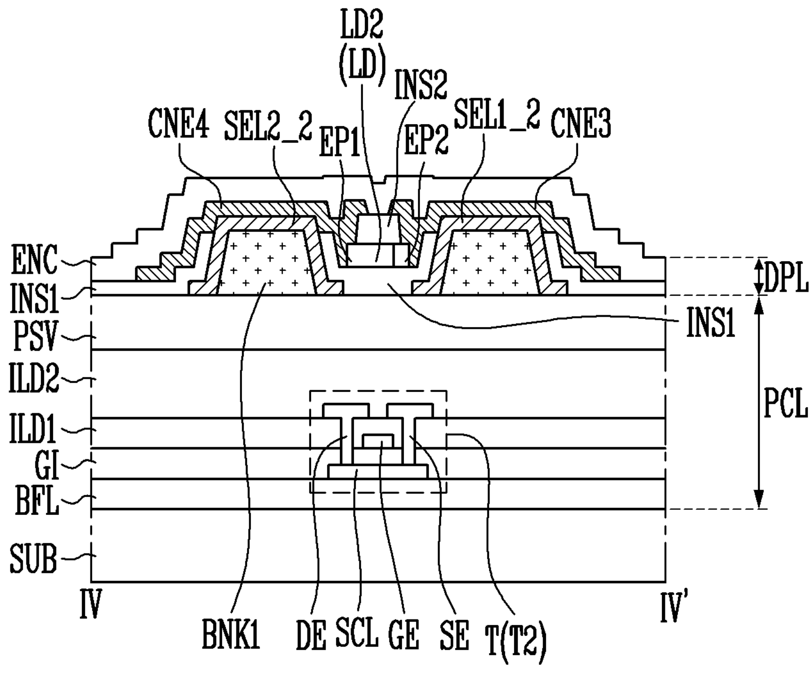
FIG. 15 is a schematic cross-sectional diagram taken along line IV-IV' of FIG. 13.
Figure 16:
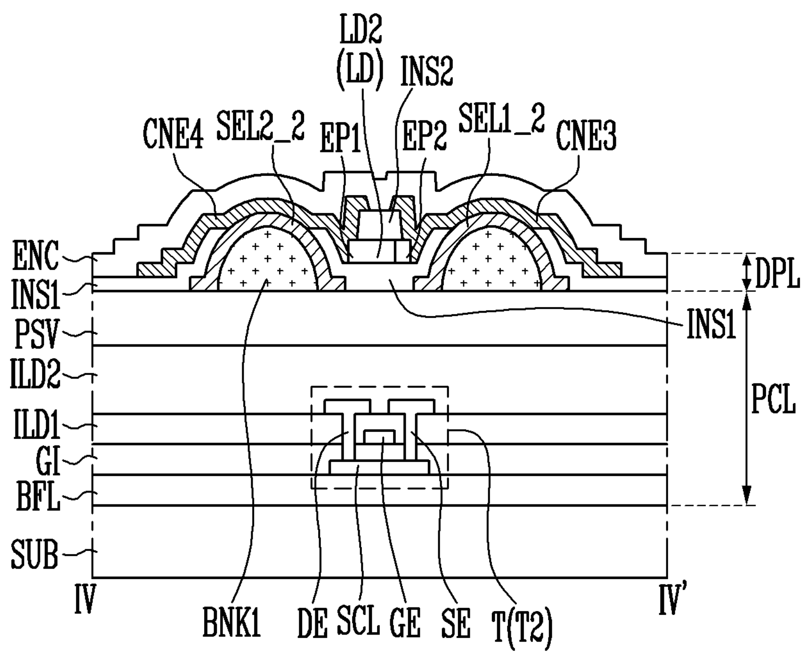
FIG. 16 illustrates another embodiment of a first bank illustrated in FIG. 15, and is a schematic cross-sectional view corresponding to line IV-IV' of FIG. 13.
Figure 17:
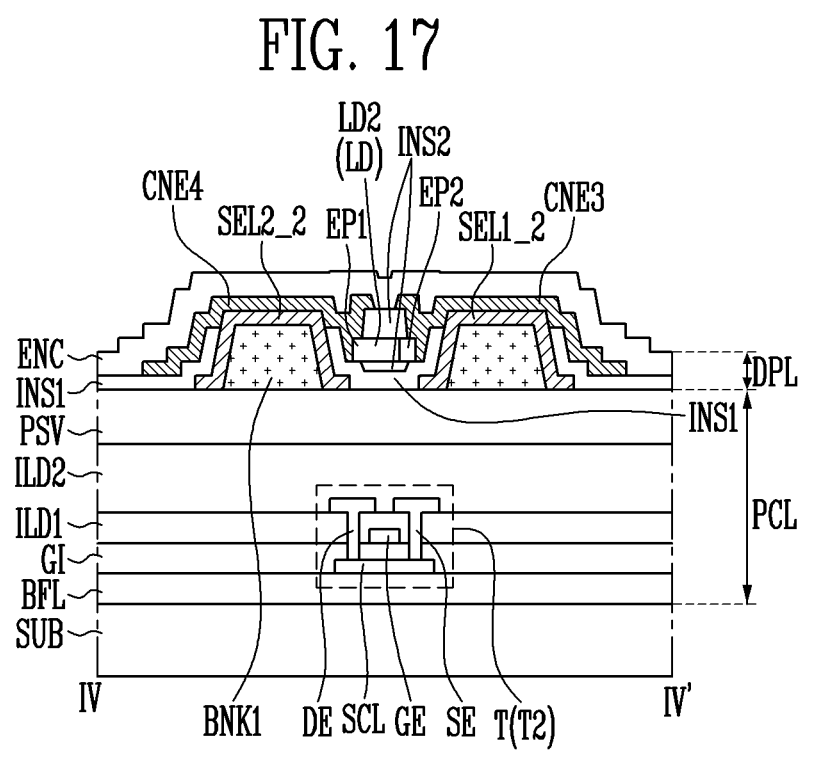

FIG. 13 is a schematic plan view illustrating another example of a pixel in accordance with an embodiment. FIG. 14 is a schematic cross-sectional diagram taken along line III-III' of FIG. 13. FIG. 15 is a schematic cross-sectional diagram taken along line IV-IV' of FIG. 13. FIG. 16 illustrates another embodiment of a first bank illustrated in FIG. 15, and is a schematic cross-sectional view corresponding to line IV-IV' of FIG. 13. FIG. 17 illustrates another embodiment of a display element layer illustrated in FIG. 15, and is a schematic cross-sectional view corresponding to line IV-IV' of FIG. 13.

As illustrated in FIGS. 13 to 17, detailed descriptions of configurations similar or identical to those of the embodiment of FIG. 8 will be omitted.

Referring to FIGS. 1A to 5, 7B, 7C, and 13 to 17, each pixel PXL may include an emission area EMA and a peripheral area which encloses the emission area EMA. The pixel area PXA in which each pixel PXL is disposed may include first to third areas A1, A2, and A3 divided from each other in the second direction DR2. Each pixel PXL may include a pixel circuit layer PCL and a display element layer DPL.

The pixel circuit layer PCL may include at least one transistor T, a first bridge pattern BRP1 disposed in the first area A1, a second bridge pattern BRP2 disposed in the second area A2, and a third bridge pattern BRP3 disposed in the third area A3.

The display element layer DPL may include a first bank BNK1, first and second electrodes EL1 and EL2, light emitting elements LD, a contact electrode CNE, and first and second intermediate electrodes CTE1 and CTE2 which are disposed in the emission area EMA of each pixel PXL, and a second bank BNK2 disposed in a peripheral area of each pixel PXL.

The first bank BNK1 may be a support component which supports each of the sub-electrodes disposed in the emission area EMA to allow light emitted from the light emitting elements LD to more reliably travel in the image display direction of the display device. For example, the first bank BNK1 may be disposed in the emission area EMA of the first area A1, the emission area EMA of the second area A2, and the emission area EMA of the third area A3.

The first bank BNK1 may be provided and/or formed between the passivation layer PSV and the sub-electrodes in the emission area EMA of each of the first to third areas A1, A2, and A3. For example, in the emission area EMA of the first area A1, the first banks BNK1 may be respectively provided and/or formed between the 1-1-th sub-electrode SEL1_1 and the passivation layer PSV and between the 2-1-th sub-electrode SEL2_1 and the passivation layer PSV. In the emission area EMA of the second area A2, the first banks BNK1 may be respectively provided and/or formed between the 1-2-th sub-electrode SEL1_2 and the passivation layer PSV and between the 2-2-th sub-electrode SEL2_2 and the passivation layer PSV. In the emission area EMA of the third area A3, the first banks BNK1 may be respectively provided and/or formed between the 1-3-th sub-electrode SEL1_3 and the passivation layer PSV and between the 2-3-th sub-electrode SEL2_3 and the passivation layer PSV.

Each first bank BNK1 may be formed of an inorganic insulating layer including an inorganic material, or an organic insulating layer including an organic material. In an embodiment, the first bank BNK1 may include an organic insulating layer having a single-layer structure and/or an inorganic insulating layer having a single-layer structure, but the disclosure is not limited thereto. In an embodiment, the first bank BNK1 may be provided in the form of a multi-layer structure formed by stacking at least one organic insulating layer and at least one inorganic insulating layer.

The first bank BNK1 may have a trapezoidal cross-section in which the width thereof is reduced from one surface of the passivation layer PSV upward, but the disclosure is not limited thereto. In an embodiment, the first bank BNK1 may include a curved surface having a cross-section having a semi-elliptical shape, a semi-circular shape, etc., a width of which reduces upward from one surface of the passivation layer PSV, as illustrated in FIG. 16. In a cross-sectional view, the shape of the first bank BNK1 is not limited to the foregoing examples, and may be changed in various ways within a range in which the efficiency of light emitted from each of the light emitting elements LD may be enhanced. First banks BNK1 adjacent to each other may be disposed on a same plane of the passivation layer PSV and have a same height.

As described above, each of the 1-1-th to 1-3-th sub-electrodes SEL1_1, SEL1_2, and SEL1_3 and the 2-1-th to 2-3-th sub-electrodes SEL2_1, SEL2_2, and SEL2_3 may be provided and/or formed on the first bank BNK1 and have a surface profile corresponding to the shape of the first bank BNK1. For example, each of the 1-1-th to 1-3-th sub-electrodes SEL1_1, SEL1_2 and SEL1_3 and the 2-1-th to 2-3-th sub-electrodes SEL2_1, SEL2_2, and SEL2_3 may have a protrusion portion corresponding to the first bank BNK1 and a planar portion corresponding to the passivation layer PSV. As described above, each of the 1-1-th to 1-3-th sub-electrodes SEL1_1, SEL1_2 and SEL1_3 and the 2-1-th to 2-3-th sub-electrodes SEL2_1, SEL2_2, and SEL2_3 has a surface profile corresponding to the shape of the first bank BNK1 disposed thereunder, so that light emitted from each of the light emitting elements LD may be reflected by each of the 1-1-th to 1-3-th sub-electrodes SEL1_1, SEL1_2 and SEL1_3 and the 2-1-th to 2-3-th sub-electrodes SEL2_1, SEL2_2, and SEL2_3 and more reliably travel in the image display direction of the display device. Consequently, the efficiency of light emitted from each of the light emitting elements LD may be further enhanced.

In an embodiment, the first bank BNK1, the 1-1-th to 1-3-th sub-electrodes SEL1_1, SEL1_2, and SEL1_3, and the 2-1-th to 2-3-th sub-electrodes SEL2_1, EL2_2, and EL2_3 each may function as a reflector that guides light emitted from the light emitting elements LD disposed in the emission area EMA of each pixel PXL in a desired direction, thus enhancing the light efficiency of the display device. In other words, the first bank BNK1, the 1-1-th to 1-3-th sub-electrodes SEL1_1, SEL1_2, and SEL1_3, and the 2-1-th to 2-3-th sub-electrodes SEL2_1, EL2_2, and EL2_3 each may function as a reflector that enables light emitted from the light emitting elements LD to travel in the image display direction of the display device, thus enhancing the light emission efficiency of the light emitting elements LD.

The second bank BNK2 may be disposed in the peripheral area of each pixel PXL. The second bank BNK2 and the bank BNK illustrated in the pixel PXL of FIG. 9 described above may have a same configuration. Although the second bank BNK2 and the first bank BNK1 may be formed and/or provided on different layers, the disclosure is not limited thereto. In an embodiment, the second bank BNK2 and the first bank BNK1 may be formed and/or provided on a same layer. In an embodiment, the second bank BNK2 and the first bank BNK1 may be formed on different layers, and the second bank BNK2 may be disposed on a first insulating layer INS1.

In an embodiment, the light emitting elements LD may be provided and/or formed on the first insulating layer INS1 in the emission area EMA of each of the first to third areas A1, A2, and A3.

The first insulating layer INS1 may be formed and/or provided under each of the light emitting elements LD arranged (or disposed) between two adjacent sub-electrodes of the sub-electrodes that form each serial set in the emission area EMA of each pixel PXL. The first insulating layer INS1 may fill space between each of the light emitting elements LD and the passivation layer PSV to stably support the light emitting elements LD and prevent the light emitting elements LD from being removed from the passivation layer PSV.

Furthermore, in the emission area EMA of each pixel PXL, the first insulating layer INS1 may expose a portion of each of the sub-electrodes that form each serial set, and cover (or overlap) the other area (or another area) other than the one area. The contact electrode CNE may be provided and/or formed in a portion of each of the exposed sub-electrodes, so that each of the sub-electrodes and the contact electrode CNE may be electrically and/or physically connected to each other.

The first insulating layer INS1 may be formed of an inorganic insulating layer including an inorganic material, or an organic insulating layer including an organic material. Although in an embodiment the first insulating layer INS1 may be formed of an inorganic insulating layer having an advantage in protecting the light emitting elements LD from the pixel circuit layer PCL of each pixel PXL, the disclosure is not limited thereto. In an embodiment, the first insulating layer INS1 may be formed of an organic insulating layer that has an advantage in planarization of support surfaces of the light emitting elements LD.

A second insulating layer INS2 may be provided and/or formed on the light emitting elements LD. The second insulating layer INS2 may be provided and/or formed on each of the light emitting elements LD to cover a portion of an upper surface of each of the light emitting elements LD, and expose the opposite ends EP1 and EP2 of each of the light emitting elements LD to the outside. The second insulating layer INS2 may be formed in an independent pattern in the emission area EMA of each pixel PXL, but the disclosure is not limited thereto.

The second insulating layer INS2 may have a single-layer structure or a multi-layer structure, and include an inorganic insulating layer including at least one inorganic material or an organic insulating layer including at least one organic material. The second insulating layer INS2 may fix each of the light emitting elements LD aligned in the emission area EMA of each pixel PXL. In an embodiment, the second insulating layer INS2 may include an inorganic insulating layer that has an advantage in protecting the active layer 12 of each of the light emitting elements LD from external oxygen, water, etc. However, the present disclosure is not limited thereto. The second insulating layer INS2 may be formed of an organic insulating layer including an organic material, depending on design conditions of the display device to which the light emitting elements LD are applied.

In an embodiment, after the alignment of the light emitting elements LD in the emission area EMA of each pixel PXL has been completed, the second insulating layer INS2 is formed on the light emitting elements LD so that the light emitting elements LD may be prevented from being removed from the aligned position. As illustrated in FIG. 17, in case that a gap (or space) is present between the first insulating layer INS1 and the light emitting elements LD before the formation of the second insulating layer INS2, the gap may be filled with the second insulating layer INS2 during a process of forming the second insulating layer INS2. Consequently, the light emitting elements LD may be more stably supported. Hence, the second insulating layer INS2 may be formed of an organic insulating layer that has an advantage in filling the gap between the first insulating layer INS1 and the light emitting elements LD.

In an embodiment, the second insulating layer INS2 may be formed on each of the light emitting elements LD so that the active layer 12 of each of the light emitting elements LD may be prevented from contacting an external conductive material. The second insulating layer INS2 may cover only a portion of the surface of each of the light emitting elements LD such that the opposite ends EP1 and EP2 of each of the light emitting elements LD may be exposed to the outside.

The contact electrode CNE may be provided and/or formed on the second insulating layer INS2.

A first contact electrode CNE1 and a second contact electrode CNE2 may be provided and/or formed on the second insulating layer INS2 on the light emitting elements LD that are disposed in the emission area EMA of the first area A1, e.g., on the first light emitting elements LD1 (LD). The first contact electrode CNE1 and the second contact electrode CNE2 may be spaced apart from each other by a predetermined distance on the second insulating layer INS2 on the first light emitting elements LD1 (LD) and thus electrically and/or physically separated from each other.

A third contact electrode CNE3 and a fourth contact electrode CNE4 may be provided and/or formed on the second insulating layer INS2 on the light emitting elements LD that are disposed in the emission area EMA of the second area A2, e.g., on the second light emitting elements LD2 (LD). The third contact electrode CNE3 and the fourth contact electrode CNE4 may be spaced apart from each other by a predetermined distance on the second insulating layer INS2 on the second light emitting elements LD2 (LD) and thus electrically and/or physically separated from each other.

A fifth contact electrode CNE5 and a sixth contact electrode CNE6 may be provided and/or formed on the second insulating layer INS2 on the light emitting elements LD that are disposed in the emission area EMA of the third area A3, e.g., on the third light emitting elements LD3 (LD). The fifth contact electrode CNE5 and the sixth contact electrode CNE6 may be spaced apart from each other by a predetermined distance on the second insulating layer INS2 on the third light emitting elements LD3 (LD) and thus electrically and/or physically separated from each other.

FIGS. 18A to 18F are schematic plan views sequentially illustrating a method of fabricating a pixel illustrated in FIG. 13. FIGS. 19A to 19H are schematic cross-sectional views sequentially illustrating a method of fabricating the pixel illustrated in FIG. 14.

Hereinafter, the method of fabricating the pixel PXL illustrated in FIGS. 13 and 14 in accordance with an embodiment will be described with reference to FIGS. 18A to 18F and 19A to 19H.

Referring to FIGS. 1A to 5, 7B, 7C, 13 to 17, 18A, and 19A, the pixel circuit layer PCL of the pixel PXL is formed on the substrate SUB. The pixel area PXA in which the pixel PXL is provided may include first to third areas A1, A2, and A3 divided from each other in the second direction DR2. Each of the first to third areas A1, A2, and A3 may include an emission area EMA from which light is emitted, and a peripheral area which encloses a perimeter of the emission area EMA.

The pixel circuit layer PCL may include the pixel circuit 144 including at least one transistor T, the first to third bridge patterns BRP1, BRP2, and BRP3, the driving voltage line DVL (PL2), and at least one insulating layer. The at least one insulating layer may include the buffer layer BFL, the gate insulating layer GI, the first and second interlayer insulating layers ILD1 and ILD2, and the passivation layer PSV that are successively formed on the substrate SUB.

The first interlayer insulating layer ILD1 may include the eighth contact hole CH8 which exposes a portion of the driving voltage line DVL (PL2).

Each of the second interlayer insulating layer ILD2 and the passivation layer PSV may include the first contact hole CH1 which exposes a portion of the second terminal DE of the first transistor T1 (T) included in the pixel circuit 144, and the second and third contact holes CH2 and CH3 each of which exposes a portion of the first bridge pattern BRP1. Furthermore, each of the second interlayer insulating layer ILD2 and the passivation layer PSV may include the fourth to sixth contact holes CH4, CH5, and CH6 each of which exposes a portion of the second bridge pattern BRP2. Furthermore, each of the second interlayer insulating layer ILD2 and the passivation layer PSV may include the seventh and ninth contact holes CH7 and CH9 each of which exposes a portion of the third bridge pattern BRP3.

Each of the first to third bridge patterns BRP1, BRP2, and BRP3 may be formed on the first interlayer insulating layer ILD1. In a plan view, each of the first to third bridge patterns BRP1, BRP2, and BRP3 may extend in the second direction DR2, and be spaced apart from each other and electrically and/or physically separated from each other. In an embodiment, the third bridge pattern BRP3 may be electrically and/or physically connected with the driving voltage line DVL (PL2) through the eighth contact hole CH8.

Referring to FIGS. 1A to 5, 7B, 7C, 13 to 17, 18B, 19A, and 19B, the first banks BNK1 are formed on the passivation layer PSV. Each first bank BNK1 may be spaced apart from an adjacent first bank BNK1 by a predetermined distance on the passivation layer PSV. The first bank BNK1 may be formed of an inorganic insulating layer including an inorganic material, or an organic insulating layer including an organic material.

Referring to FIGS. 1A to 5, 7B, 7C, 13 to 17, 18C, and 19A to 19C, the 1-1-th to 1-3-th sub-electrodes SEL1_1 to SEL1_3, the 2-1-th to 2-3-th sub-electrodes SEL2_1 to SEL2_3, first and second connection lines CNL1 and CNL2, and the first and second connection patterns CNP1 and CNP2 that include a conductive material (or substance) having a high reflectivity are formed on the passivation layer PSV including the first bank BNK1.

Each of the 1-1-th to 1-3-th sub-electrodes SEL1_1 to SEL1_3 and the 2-1-th to 2-3-th sub-electrodes SEL2_1 to SEL2_3 may be formed on the corresponding first bank BNK1.

The 1-1-th sub-electrode SEL1_1 and the 2-1-th sub-electrode SEL2_1 may be formed in the emission area EMA of the first area A1 of each pixel PXL. The 1-2-th sub-electrode SEL1_2 and the 2-2-th sub-electrode SEL2_2 may be formed in the emission area EMA of the second area A2 of the pixel PXL. The 1-3-th sub-electrode SEL1_3 and the 2-3-th sub-electrode SEL2_3 may be formed in the emission area EMA of the third area A3 of the pixel PXL.

In the first area A1 of each pixel PXL, the 2-1-th sub-electrode SEL2_1 may have an isolated circular island shape, and the 1-1-th sub-electrode SEL1_1 may have a shape enclosing a perimeter of the 2-1-th sub-electrode SEL2_1. In the second area A2 of each pixel PXL, the 2-2-th sub-electrode SEL2_2 may have an isolated circular island shape, and the 1-2-th sub-electrode SEL1_2 may have a shape enclosing a perimeter of the 2-2-th sub-electrode SEL2_2. In the third area A3 of each pixel PXL, the 2-3-th sub-electrode SEL2_3 may have an isolated circular island shape, and the 1-3-th sub-electrode SEL1_3 may have a shape enclosing a perimeter of the 2-3-th sub-electrode SEL2_3.

In an embodiment, the 1-1-th sub-electrode SEL1_1 and the 1-2-th sub-electrode SEL1_2 may be electrically and/or physically connected to each other by the first connection line CNL1. The first connection line CNL1 may be integral with the 1-1-th sub-electrode SEL1_1 or be integral with the 1-2-th sub-electrode SEL1_2. For example, in case that the first connection line CNL1 is integral with the 1-1-th sub-electrode SEL1_1, the first connection line CNL1 may be regarded as a portion of the 1-1-th sub-electrode SEL1_1. In case that the first connection line CNL1 is integral with the 1-2-th sub-electrode SEL1_2, the first connection line CNL1 may be regarded as a portion of the 1-2-th sub-electrode SEL1_2.

The 1-2-th sub-electrode SEL1_2 and the 1-3-th sub-electrode SEL1_3 may be electrically and/or physically connected to each other by the second connection line CNL2. The second connection line CNL2 may be integral with the 1-2-th sub-electrode SEL1_2 or be integral with the 1-3-th sub-electrode SEL1_3. For example, in case that the second connection line CNL2 is integral with the 1-2-th sub-electrode SEL1_2, the second connection line CNL2 may be regarded as a portion of the 1-2-th sub-electrode SEL1_2. In case that the second connection line CNL2 is integral with the 1-3-th sub-electrode SEL1_3, the second connection line CNL2 may be regarded as a portion of the 1-3-th sub-electrode SEL1_3.

In an embodiment, the 1-1-th sub-electrode SEL1_1 of the first area A1 and the 1-2-th sub-electrode SEL1_2 of the second area A2 may be electrically and/or physically connected to each other by the first connection line CNL1. The 1-2-th sub-electrode SEL1_2 of the second area A2 and the 1-3-th sub-electrode SEL1_3 of the third area A3 may be electrically and/or physically connected to each other by the second connection line CNL2. In other words, the 1-1-th to 1-3-th sub-electrodes SEL1_1, SEL1_2, and SEL1_3 may be electrically and/or physically connected to each other by the first and second connection lines CNL1 and CNL2.

In an embodiment, the 2-1-th sub-electrode SEL2_1 of the first area A1, the 2-2-th sub-electrode SEL2_2 of the second area A2, and the 2-3-th sub-electrode SEL2_3 of the third area A3 may be spaced apart from each other at regular intervals, in a plan view.

The first connection pattern CNP1 may be formed in the portion between the first area A1 and the second area A2. One end of the first connection pattern CNP1 may be electrically connected to the first bridge pattern BRP1 through the third contact hole CH3, and a remaining end thereof may be electrically connected to the second bridge pattern BRP2 through the fourth contact hole CH4. The second connection pattern CNP2 may be formed in the area between the second area A2 and the third area A3. One end of the second connection pattern CNP2 may be electrically connected to the second bridge pattern BRP2 through the sixth contact hole CH6, and a remaining end thereof may be electrically connected to the third bridge pattern BRP3 through the ninth contact hole CH9.

The 2-1-th sub-electrode SEL2_1 of the first area A1 may be electrically and/or physically connected with the first bridge pattern BRP1 through the second contact hole CH2. The 2-2-th sub-electrode SEL2_2 of the second area A2 may be electrically and/or physically connected with the second bridge pattern BRP2 through the fifth contact hole CH5. The 2-3-th sub-electrode SEL2_3 of the third area A3 may be electrically and/or physically connected with the third bridge pattern BRP3 through the seventh contact hole CH7.

In an embodiment, the 2-1-th sub-electrode SEL2_1 of the first area A1 may be electrically and/or physically connected to the 2-2-th sub-electrode SEL2_2 of the second area A2 through the first bridge pattern BRP1, the first connection pattern CNP1, and the second bridge pattern BRP2. Furthermore, the 2-2-th sub-electrode SEL2_2 of the second area A2 may be electrically and/or physically connected to the 2-3-th sub-electrode SEL2_3 of the third area A3 by the second bridge pattern BRP2, the second connection pattern CNP2, and the third bridge pattern BRP3. In other words, the 2-1-th to 2-3-th sub-electrodes SEL2_1, SEL2_2, and SEL2_3 may be electrically and/or physically connected to each other by the first to third bridge patterns BRP1, BRP2, and BRP3 and the first and second connection patterns CNP1 and CNP2.

The 1-1-th sub-electrode SEL1_1 of the first area A1 may be electrically connected to the first transistor T1 (T) of the pixel circuit 144 through the first contact hole CH1.

The 1-1-th to 1-3-th sub-electrodes SEL1_1, SEL1_2, and SEL1_3, the 2-1-th to 2-3-th sub-electrodes SEL2_1, SEL2_2, and SEL2_3, and the first and second connection patterns CNP1 and CNP2 may be provided on a same layer, include a same material, and be formed by a same process.

Referring to FIGS. 1A to 5, 7B, 7C, 13 to 17, and 19A to 19D, an insulating layer INSM is formed on the passivation layer PSV including the 1-1-th to 1-3-th sub-electrodes SEL1_1, SEL1_2, and SEL1_3, the 2-1-th to 2-3-th sub-electrodes SEL2_1, SEL2_2, and SEL2_3, the first and second connection patterns CNP1 and CNP2, etc. The insulating layer INSM may include an inorganic insulating layer including an inorganic material, or an organic insulating layer including an organic material.

Subsequently, the second bank BNK2 is formed in the peripheral area of each of the first to third areas A1, A2, and A3 of each pixel PXL. The second bank BNK2 may be formed on the insulating material layer INSM. The second bank BNK2 may be a pixel defining layer configured to define (or partition) an emission area EMA between each pixel PXL and pixels PXL adjacent thereto.

Referring to FIGS. 1A to 5, 7B, 7C, 13 to 17, 18D, and 19A to 19E, each of the 1-1-th to 1-3-th sub-electrodes SEL1_1 to SEL1_3 and the 2-1-th to 2-3-th sub-electrodes SEL2_1 to SEL2_3 is supplied with a corresponding alignment signal (or an alignment voltage) so that an electric field is formed between two adjacent sub-electrodes in each of the first to third areas A1 to A3. A first alignment signal (or a first alignment voltage) may be applied to the 1-1-th to 1-3-th sub-electrodes SEL1_1 to SEL1_3 electrically connected by the first and second connection lines CNL1 and CNL2. A second alignment signal (or a second alignment voltage) may be applied to the 2-1-th to 2-3-th sub-electrodes SEL2_1 to SEL2_3 electrically connected by the first to third bridge patterns BRP1 to BRP3 and the first and second connection patterns CNP1 and CNP2.

For example, in case that AC power having a predetermined period or DC power having a predetermined voltage is repeatedly applied several times to each of the 1-1-th to 1-3-th sub-electrodes SEL1_1 to SEL1_3 and the 2-1-th to 2-3-th sub-electrodes SEL2_1 to SEL2_3, an electric field may be formed between two adjacent sub-electrodes in each of the first to third areas A1 to A3, the electric field corresponding to a difference between respective potentials of the two adjacent sub-electrodes.

As described above, after the electric field has been formed between two adjacent sub-electrodes in each of the first to third areas A1 to A3, a mixed solution including light emitting elements LD may be supplied to the emission area EMA of each of the first to third areas A1 to A3 by an inkjet printing method or the like. For example, an inkjet nozzle is disposed on the insulating layer INSM, and a solvent mixed with light emitting elements LD may be supplied to the emission area EMA of each of the first to third areas A1 to A3 of each pixel PXL through the inkjet nozzle. The solvent may be any of acetone, water, alcohol, and toluene, but the disclosure is not limited thereto. For example, the solvent may be ink or paste. The method of supplying the light emitting elements LD to the emission area EMA of each of the first to third areas A1 to A3 of each pixel PXL is not limited to that of the foregoing embodiment. The method of supplying the light emitting elements LD may be changed in various ways.

After the light emitting elements LD are supplied to the emission area EMA of each of the first to third areas A1 to A3 of each pixel PXL, the solvent may be removed.

In case that the light emitting elements LD are supplied to the emission area EMA, self-alignment of the light emitting elements LD may be guided by the respective electric fields formed between the 1-1-th and 2-1-th sub-electrodes SEL1_1 and SEL2_1, between the 1-2-th and 2-2-th sub-electrodes SEL1_2 and SEL2_2, and between the 1-3-th and 2-3-th sub-electrodes SEL1_3 and SEL2_3. Hence, the light emitting elements LD may be aligned between the 1-1-th and 2-1-th sub-electrodes SEL1_1 and SEL2_1, between the 1-2-th and 2-2-th sub-electrodes SEL1_2 and SEL2_2, and between the 1-3-th and 2-3-th sub-electrodes SEL1_3 and SEL2_3. For example, the first light emitting elements LD1 (LD) may be aligned between the 1-1-th and 2-1-th sub-electrodes SEL1_1 and SEL2_1. The second light emitting elements LD2 (LD) may be aligned between the 1-2-th and 2-2-th sub-electrodes SEL1_2 and SEL2_2. The third light emitting elements LD3 (LD) may be aligned between the 1-3-th and 2-3-th sub-electrodes SEL1_3 and SEL2_3. The first light emitting elements LD1 (LD) may be aligned on the insulating layer INSM in the emission area EMA of the first area A1. The second light emitting elements LD2 (LD) may be aligned on the insulating layer INSM in the emission area EMA of the second area A2. The third light emitting elements LD3 (LD) may be aligned on the insulating layer INSM in the emission area EMA of the third area A3.

In an embodiment, the light emitting elements LD may include at least one reverse light emitting element LDr electrically connected in a direction opposite to the forward direction depending on a wavelength, etc. of an alignment signal applied to each of two adjacent sub-electrodes in each of the first to third areas A1, A2, and A3.

As described above, at the step of aligning the light emitting elements LD, a ratio of the number of light emitting elements LD aligned in the forward direction in the emission area EMA of each of the first to third areas A1, A2, and A3 and the number of light emitting elements electrically connected in the direction opposite thereto, e.g., the number of reverse light emitting elements LDr, may be adjusted, or the light emitting elements LD aligned in the forward direction may be intensively disposed at a specific position in the emission area EMA, e.g., by controlling the direction and magnitude of the electric field formed between the two adjacent sub-electrodes by adjusting the alignment signal to be applied to the two adjacent sub-electrodes.

Referring to FIGS. 1A to 5, 7B, 7C, 13 to 17, and 19A to 19F, after the light emitting elements LD are aligned in the emission area EMA of each of the first to third areas A1, A2, and A3, the second insulating layer INS2 is formed on each of the light emitting elements LD. The second insulating layer INS2 may cover at least a portion of an upper surface of each of the light emitting elements LD such that the opposite ends EP1 and EP2 of each of the light emitting elements LD other than the active layer 12 may be exposed to the outside.

The first insulating layer INS1 may be formed by etching the insulating layer INSM such that a portion of each of the 1-1-th to 1-3-th sub-electrodes SEL1_1 to SEL1_3 and the 2-1-th to 2-3-th sub-electrodes SEL2_1 to SEL2_3 is exposed by the process of forming the second insulating layer INS2 or an etching process performed therebefore or thereafter.

Referring to FIGS. 1A to 5, 7B, 7C, 13 to 17, 18E, and 19A to 19G, the first to sixth contact electrodes CNE1 to CNE6 and the first and second intermediate electrodes CTE1 and CTE2 are formed on the passivation layer PSV including the second insulating layer INS2.

The first contact electrode CNE1 may be formed directly on the 1-1-th sub-electrode SEL1_1. The second contact electrode CNE2 may be formed directly on the 2-1-th sub-electrode SEL2_1. The third contact electrode CNE3 may be formed directly on the 1-2-th sub-electrode SEL1_2. The fourth contact electrode CNE4 may be formed directly on the 2-2-th sub-electrode SEL2_2. The fifth contact electrode CNE5 may be formed directly on the 1-3-th sub-electrode SEL1_3. The sixth contact electrode CNE6 may be formed directly on the 2-3-th sub-electrode SEL2_3.

The first intermediate electrode CTE1 may be integral with the third contact electrode CNE3 and protrude from the second area A2 to the first area A1. The first intermediate electrode CTE1 may be formed on the first connection pattern CNP1 in the area between the first area A1 and the second area A2.

The second intermediate electrode CTE2 may be integral with the fifth contact electrode CNE5 and have a shape protruding from the third area A3 to the second area A2. The second intermediate electrode CTE2 may be formed on the second connection pattern CNP2 in the area between the second area A2 and the third area A3.

Referring to FIGS. 1A to 5, 7B, 7C, 13 to 17, 18F, and 19A to 19H, a process of removing the first and second connection lines CNL1 and CNL2 is performed by an etching method or the like using a mask so that two sub-electrodes disposed in each of the first to third areas A1 to A3 of each pixel PXL and the light emitting elements LD aligned therebetween may embody one serial set. As the first and second connection lines CNL1 and CNL2 are removed, the 1-1-th sub-electrode SEL1_1 disposed in the first area A1, the 1-2-th sub-electrode SEL1_2 disposed in the second area A2, and the 1-3-th sub-electrode SEL1_3 disposed in the third area A3 may be spaced apart from each other.

Furthermore, during the process of removing the first and second connection lines CNL1 and CNL2, a portion of each of the first and second connection patterns CNP1 and CNP2 may be removed. As a portion of the first connection pattern CNP1 is removed, the first bridge pattern BRP1 of the first area A1 and the second bridge pattern BRP2 of the second area A2 may be electrically and/or physically separated from each other. As a portion of the second connection pattern CNP2 is removed, the second bridge pattern BRP2 of the second area A2 and the third bridge pattern BRP3 of the third area A3 may be electrically and/or physically separated from each other.

Furthermore, during the process of removing the first and second connection lines CNL1 and CNL2, a portion of the 1-1-th sub-electrode SEL1_1 of the first area A1 and a portion of the 1-3-th sub-electrode SEL1_3 of the third area A3 may be removed. Therefore, each pixel PXL may be driven independently (or individually) from pixels PXL adjacent thereto.

Due to the foregoing process, the 1-1-th and 2-1-th sub-electrodes SEL1_1 and SEL2_1 of the first area A1 and the first light emitting elements LD1 (LD) electrically connected in parallel therebetween may form the first serial set SET1, the 1-2-th and 2-2-th sub-electrodes SEL1_2 and SEL2_2 of the second area A2 and the second light emitting elements LD2 (LD) electrically connected in parallel therebetween may form the second serial set SET2, and the 1-3-th and 2-3-th sub-electrodes SEL1_3 and SEL2_3 of the third area A3 and the third light emitting elements LD3 (LD) electrically connected in parallel therebetween may form the third serial set SET3.

In an embodiment, the 1-1-th sub-electrode SEL1_1 of the first serial set SET1, the 1-2-th sub-electrode SEL1_2 of the second serial set SET2, and the 1-3-th sub-electrode SEL1_3 of the third serial set SET3 may form the first electrode EL1 of each pixel PXL. Furthermore, the 2-1-th sub-electrode SEL2_1 of the first serial set SET1, the 2-2-th sub-electrode SEL2_2 of the second serial set SET2, and the 2-3-th sub-electrode SEL2_3 of the third serial set SET3 may form the second electrode EL2 of each pixel PXL.

The first serial set SET1 may be electrically connected to the pixel circuit 144 and thus electrically connected to the second serial set SET2 by the first bridge pattern BRP1 and the first intermediate electrode CTE1. The second serial set SET2 may be electrically connected to the third serial set SET3 by the second bridge pattern BRP2 and the second intermediate electrode CTE2. The third serial set SET3 may be electrically connected to the driving voltage line DVL (PL2) by the third bridge pattern BRP3. Hence, in case that driving current flows from the first power line PL1 to the driving voltage line DVL (PL2) by the first transistor T1 (T), e.g., the driving transistor, included in the pixel circuit 144 of each pixel PXL, the driving current may be drawn to the emission part EMU of each pixel PXL that is formed of the first to third serial sets SET1 to SET3.

Subsequently, the encapsulation layer ENC is formed to cover the first to sixth contact electrodes CNE1 to CNE6.

The encapsulation layer ENC may have a structure formed by alternately stacking at least one inorganic layer and at least one organic layer.

Figure 20:
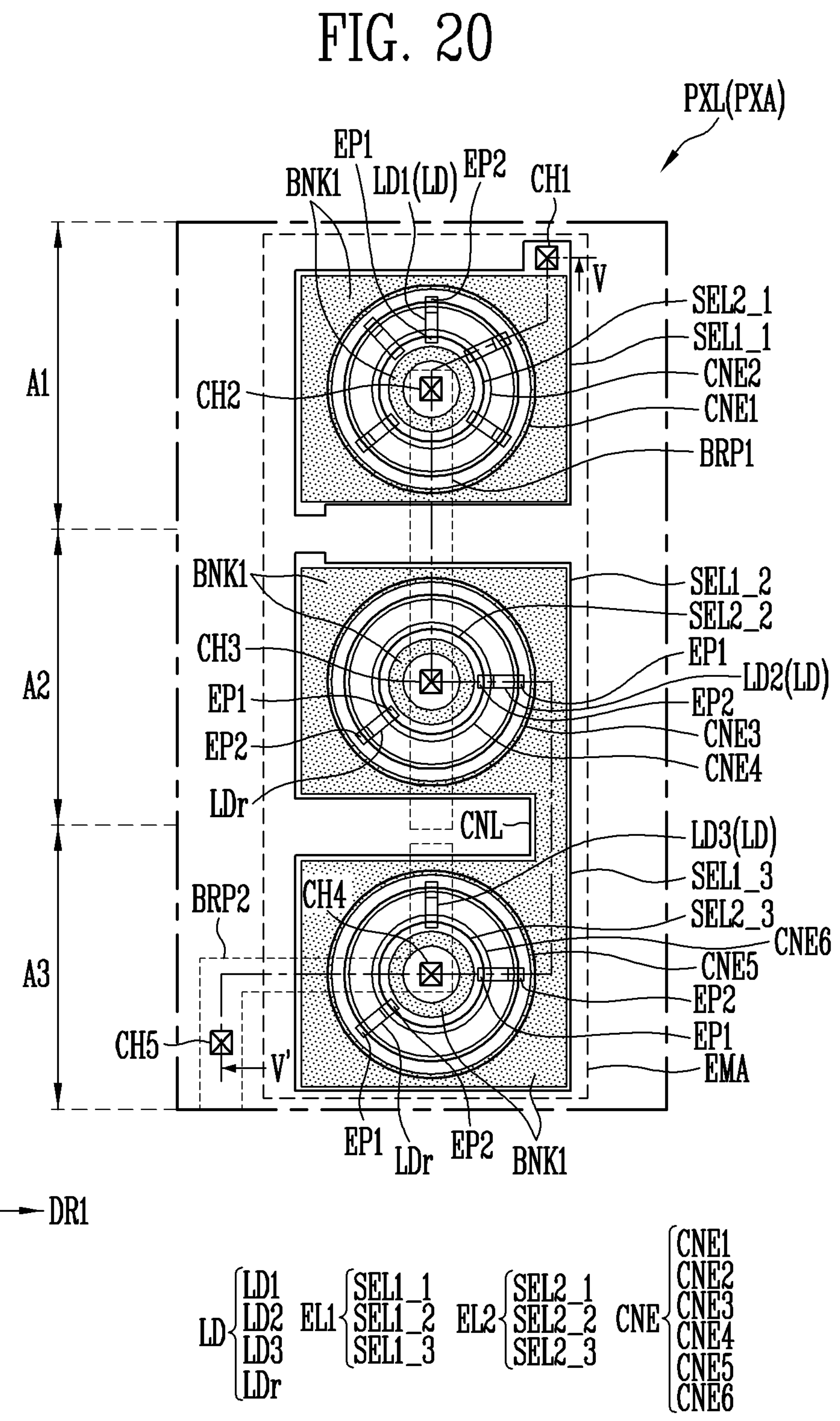
FIG. 20 is a schematic plan view illustrating another example of a pixel in accordance with an embodiment of the disclosure.

FIG. 20 is a schematic plan view illustrating another example of a pixel in accordance with an embodiment. FIG. 21 is a schematic cross-sectional view taken along line V-V' of FIG. 20.

To avoid redundant explanation, the description of the pixel PXL of FIGS. 20 and 21 will be focused on differences from that of the foregoing embodiments. Components which are not separately explained in the following description of the embodiment comply with those of the foregoing embodiments. The same reference numeral will be used to designate the same component, and a similar reference numeral will be used to designate a similar component.

Referring to FIGS. 1A to 5, 7B, 7C, 20, and 21, a pixel area PXA in which each pixel PXL is disposed (or provided) may include first to third areas A1, A2, and A3 divided from each other in the second direction DR2. Each pixel PXL may include a pixel circuit layer PCL and a display element layer DPL.

The pixel circuit layer PCL may include at least one transistor T, and first and second bridge patterns BRP1 and BRP2. In an embodiment, the first and second bridge patterns BRP1 and BRP2 may be disposed on a first interlayer insulating layer ILD1, and the first and second bridge patterns BRP1 and BRP2 and transistor T may be provided on a same layer and include a same. However, the disclosure is not limited thereto. In an embodiment, the first and second bridge patterns BRP1 and BRP2 and a conductive layer that forms at least one of the signal lines included in the pixel circuit layer PCL may be provided on a same layer.

The first bridge pattern BRP1 may be provided to extend from the first area A1 to the second area A2. Furthermore, the first bridge pattern BRP1 may be located between the second area A2 and the third area A3. The second bridge pattern BRP2 may be provided in only the third area A3. In an embodiment, the first bridge pattern BRP1 and the second bridge pattern BRP2 may form a conductive line electrically and/or physically connected before light emitting elements LD are aligned in each pixel PXL. The conductive line may receive a second alignment signal (or a second alignment voltage) through a driving voltage line DVL. After the light emitting elements LD are aligned in each pixel PXL, the conductive line may be provided in the form of including the first bridge pattern BRP1 and the second bridge pattern BRP2 that are spaced apart from each other by disconnecting or removing a portion of the conductive line. The first bridge pattern BRP1 and the second bridge pattern BRP2 that are spaced apart from each other may be electrically and/or physically separated from each other after the light emitting elements LD are aligned.

A 1-1-th sub-electrode SEL1_1, a 2-1-th sub-electrode SEL2_1, at least one first light emitting element LD1 (LD), and first and second contact electrodes CNE1 and CNE2 may be disposed in the first area A1. The 1-1-th and 2-1-th sub-electrodes SEL1_1 and SEL2_1 and the first light emitting element LD1 (LD) electrically connected in parallel therebetween may form a first serial set SET1 of each pixel PXL. In the first area A1, one end (or first end) EP1 (e.g., a first semiconductor layer) of the first light emitting element LD1 (LD) may be electrically connected to the 2-1-th sub-electrode SEL2_1, and a remaining end (or second end) EP2 (e.g., a second semiconductor layer) thereof may be electrically connected to the 1-1-th sub-electrode SEL1_1.

In an embodiment, the 1-1-th sub-electrode SEL1_1 may be electrically connected to the pixel circuit 144 of each pixel PXL through a first contact hole CH1 passing through the second interlayer insulating layer ILD2 and the passivation layer PSV. The 2-1-th sub-electrode SEL2_1 may be electrically connected to one side of the first bridge pattern BRP1 through a second contact hole CH2 passing through the second interlayer insulating layer ILD2 and the passivation layer PSV. A 1-2-th sub-electrode SEL1_2, a 2-2-th sub-electrode SEL2_2, at least one second light emitting element LD2 (LD), at least one reverse light emitting element LDr (LD), and third and fourth contact electrodes CNE3 and CNE4 may be disposed in the second area A2. The 1-2-th and 2-2-th sub-electrodes SEL1_2 and SEL2_2, and the second light emitting element LD2 (LD) and the reverse light emitting element LDr (LD) that are electrically connected in parallel therebetween may form a second serial set SET2 of each pixel PXL.

In the second area A2, a first end EP1 (e.g., a first semiconductor layer) of the second light emitting element LD2 (LD) may be electrically connected to the 1-2-th sub-electrode SEL1_2, and a second end EP2 (e.g., a second semiconductor layer) thereof may be electrically connected to the 2-2-th sub-electrode SEL2_2. In the second area A2, a first end EP1 of the reverse light emitting element LDr (LD) may be electrically connected to the 2-2-th sub-electrode SEL2_2, and a second end EP2 thereof may be electrically connected to the 1-2-th sub-electrode SEL1_2.

In an embodiment, the 2-2-th sub-electrode SEL2_2 may be electrically connected to another side of the first bridge pattern BRP1 through a third contact hole CH3 passing through the second interlayer insulating layer ILD2 and the passivation layer PSV. Hence, the first serial set SET1 and the second serial set SET2 may be electrically connected to each other by the first bridge pattern BRP1 disposed in the portion between the first area A1 and the second area A2.

The second bridge pattern BRP2, a 1-3-th sub-electrode SEL1_3, a 2-3-th sub-electrode SEL2_3, at least one third light emitting element LD3 (LD), at least one reverse light emitting element LDr (LD), and fifth and sixth contact electrodes CNE5 and CNE6 may be disposed in the third area A3. The 1-3-th and 2-3-th sub-electrodes SEL1_3 and SEL2_3, and the third light emitting element LD3 (LD) and the reverse light emitting element LDr (LD) that are electrically connected in parallel therebetween may form the third serial set SET3 of each pixel PXL.

The second bridge pattern BRP2 may be electrically connected to the 2-3-th sub-electrode SEL2_3 through a fourth contact hole CH4 passing through the second interlayer insulating layer ILD2 and the passivation layer PSV, and may be electrically connected to the driving voltage line DVL (PL2) through a fifth contact hole CH5 passing through the first interlayer insulating layer ILD1.

In the third area A3, a first end EP1 (e.g., the first semiconductor layer) of the third light emitting element LD3 (LD) may be electrically connected to the 2-3-th sub-electrode SEL2_3, and a second end EP2 (e.g., the second semiconductor layer) thereof may be electrically connected to the 1-3-th sub-electrode SEL1_3. In the third area A3, a first end EP1 of the reverse light emitting element LDr (LD) may be electrically connected to the 1-3-th sub-electrode SEL1_3, and a second end EP2 thereof may be electrically connected to the 2-3-th sub-electrode SEL2_3.

The second serial set SET2 and the third serial set SET3 may be electrically connected to each other by a connection line CNL in the area between the second area A2 and the third area A3.

In an embodiment, the connection line CNL may be provided between the 1-2-th sub-electrode SEL1_2 and the 1-3-th sub-electrode SEL1_3 and electrically and/or physically connect the 1-2-th sub-electrode SEL1_2 and the 1-3-th sub-electrode SEL1_3. In other words, the 1-2-th sub-electrode SEL1_2 and the 1-3-th sub-electrode SEL1_3 may be electrically and/or physically connected to each other by the connection line CNL.

The connection line CNL may be integral with the 1-2-th sub-electrode SEL1_2 and/or the 1-3-th sub-electrode SEL1_3. In case that the connection line CNL is integral with the 1-2-th sub-electrode SEL1_2, the connection line CNL may be regarded as a portion of the 1-2-th sub-electrode SEL1_2. In case that the connection line CNL is integral with the 1-3-th sub-electrode SEL1_3, the connection line CNL may be regarded as a portion of the 1-3-th sub-electrode SEL1_3. Since the connection line CNL is integral with the 1-2-th sub-electrode SEL1_2 and/or the 1-3-th sub-electrode SEL1_3, the connection line CNL and the 1-2-th and 1-3-th sub-electrodes SEL1_2 and SEL1_3 may be provided on A same layer and include a same material.

In an embodiment, the 1-1-th sub-electrode SEL1_1 and the 1-2-th sub-electrode SEL1_2 may be electrically and/or physically connected before the light emitting elements LD are aligned in each pixel PXL, and may be spaced apart from each other after the light emitting elements LD are aligned. For example, the 1-1-th sub-electrode SEL1_1 and the 1-2-th sub-electrode SEL1_2 may be electrically and/or physically connected to each other in a boundary portion of the first area A1 and the second area A2 before the light emitting elements LD are aligned in each pixel PXL, and be spaced apart from each other by disconnecting or removing a portion thereof in the boundary portion after the light emitting elements LD are aligned. Hence, the 1-1-th sub-electrode SEL1_1 and the 1-2-th sub-electrode SEL1_2 may be electrically and/or physically separated from each other after the light emitting elements LD are aligned in each pixel PXL.

Before the alignment of the light emitting elements LD, the 1-1-th sub-electrode SEL1_1 and the 1-2-th sub-electrode SEL1_2 may be electrically and/or physically connected to each other, and the 1-2-th sub-electrode SEL1_2 and the 1-3-th sub-electrode SEL1_3 may be electrically and/or physically connected to each other by the connection line CNL. Hence, before the alignment of the light emitting elements LD, the 1-1-th to 1-3-th sub-electrodes SEL1_1, SEL1_2, and SEL1_3 may be electrically and/or physically connected to each other and may be supplied with the first alignment signal (or the first alignment voltage) from the pixel circuit 144 through the first contact hole CH1.

In case that driving current flows from the first power line PL1 to the driving voltage line DVL (PL2) by the first transistor T1 (T), e.g., the driving transistor, of the pixel circuit 144 included in each pixel PXL having the above-described configuration, the driving current may be supplied to the 1-1-th sub-electrode SEL1_1 of the first serial set SET1 through the first contact hole CH1.

The driving current supplied to the 1-1-th sub-electrode SEL1_1 flows to the 2-1-th sub-electrode SEL2_1 via the first light emitting element LD1 (LD) of the first serial set SET1. Hence, the first light emitting element LD1 (LD) may emit light having a luminance corresponding to current distributed to the first light emitting element LD1 (LD).

The driving current that flows to the 2-1-th sub-electrode SEL2_1 of the first serial set SET1 may be drawn into the 2-2-th sub-electrode SEL2_2 of the second serial set SET2 via the third contact hole CH3 and the first bridge pattern BRP1 electrically connected to the 2-1-th sub-electrode SEL2_1 through the second contact hole CH2. The driving current may flow to the 1-2-th sub-electrode SEL1_2 via the second light emitting elements LD2 (LD) electrically connected between the 2-2-th sub-electrode SEL2_2 and the 1-2-th sub-electrode SEL1_2 of the second serial set SET2. Hence, the second light emitting element LD2 (LD) may emit light having a luminance corresponding to current distributed to the second light emitting element LD2 (LD). Here, since the driving current does not flow to the reverse light emitting element LDr of the second area A2, the reverse light emitting element LDr remains disabled. In other words, the reverse light emitting element LDr of the second area A2 may not emit light.

The driving current that flows to the 1-2-th sub-electrode SEL1_2 of the second serial set SET2 may be drawn into the 1-3-th sub-electrode SEL1_3 of the third serial set SET3 via the connection line CNL. The driving current may flow to the 2-3-th sub-electrode SEL2_3 via the third light emitting elements LD3 (LD) electrically connected between the 1-3-th sub-electrode SEL1_3 and the 2-3-th sub-electrode SEL2_3 of the third serial set SET3. Hence, the third light emitting element LD3 (LD) may emit light having a luminance corresponding to current distributed to the third light emitting element LD3 (LD). Here, since the driving current does not flow to the reverse light emitting element LDr of the third area A3, the reverse light emitting element LDr remains disabled. In other words, the reverse light emitting element LDr of the third area A3 may not emit light.

In this way, the driving current of each pixel PXL may flow successively via the first light emitting element LD1 (LD) of the first serial set SET1, the second light emitting element LD2 (LD) of the second serial set SET2, and the third light emitting element LD3 (LD) of the third serial set SET3. Hence, each pixel PXL may emit light having a luminance corresponding to a data signal supplied during each frame period.

Figure 22:
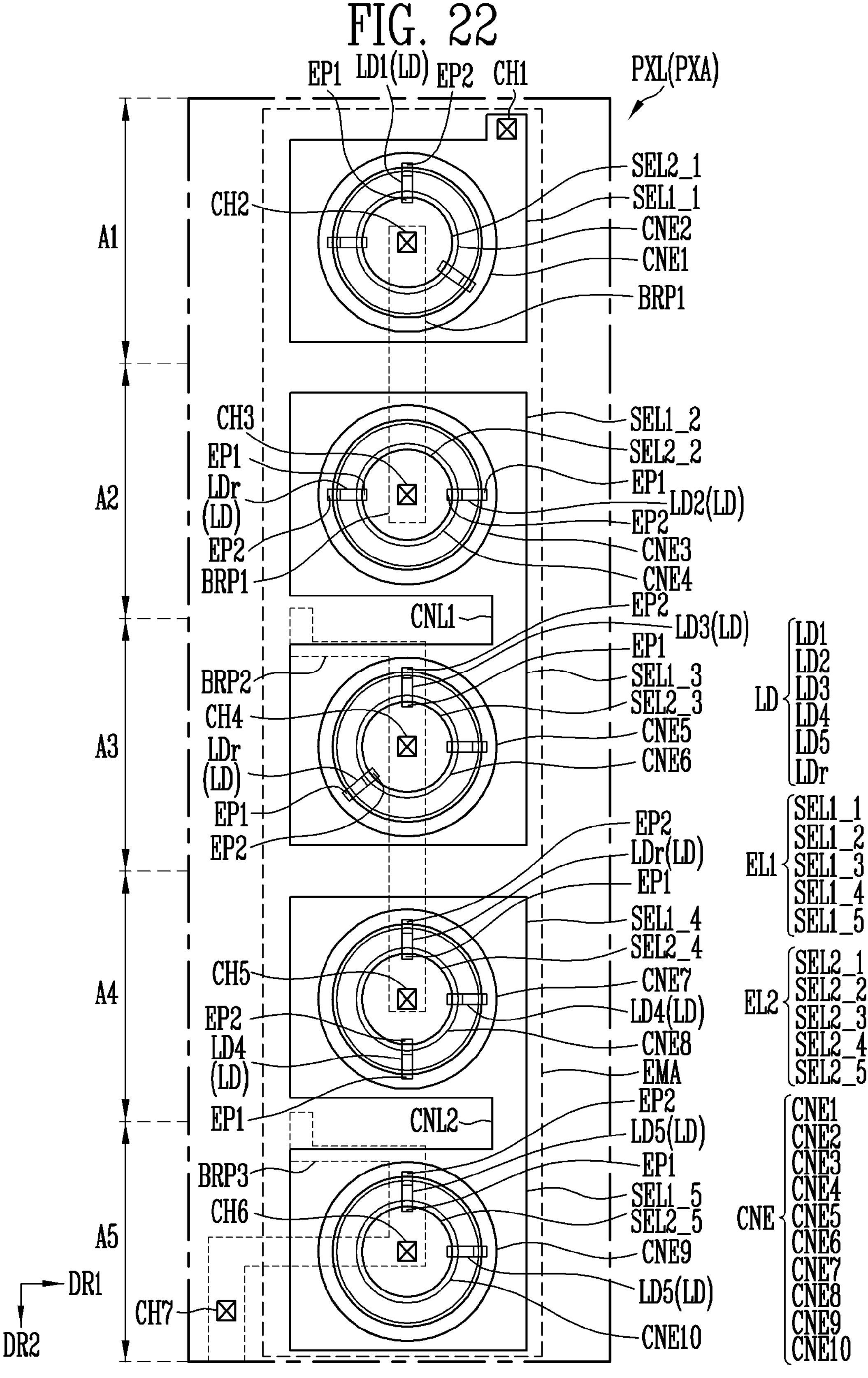
FIG. 22 is a schematic plan view illustrating another example of a pixel in accordance with an embodiment of the disclosure.

FIG. 22 is a schematic plan view illustrating another example of a pixel in accordance with an embodiment.

With regard to the pixel PXL of FIG. 22, detailed descriptions of configurations similar or identical to those of the embodiment of FIGS. 20 and 21 will be omitted.

Referring to FIGS. 1A to 5, 7B, 7C, and 22, a pixel area PXA in which each pixel PXL is disposed may include first to fifth areas A1, A2, A3, A4, and A5 divided from each other in the second direction DR2. Each pixel PXL may include a pixel circuit layer PCL and a display element layer DPL.

The pixel circuit layer PCL may include at least one transistor T, and first to third bridge patterns BRP1, BRP2, and BRP3.

The first bridge pattern BRP1 may be provided to extend from the first area A1 to the second area A2. The second bridge pattern BRP2 may be provided in the third area A3. The third bridge pattern BRP3 may be provided to extend from the fourth area A4 to the fifth area A5. A 1-1-th sub-electrode SEL1_1, a 2-1-th sub-electrode SEL2_1, at least one first light emitting element LD1 (LD), and first and second contact electrodes CNE1 and CNE2 may be disposed in the first area A1. The 1-1-th and 2-1-th sub-electrodes SEL1_1 and SEL2_1 and the first light emitting element LD1 (LD) electrically connected in parallel therebetween may form a first serial set SET1 of each pixel PXL. In the first area A1, a first end EP1 (e.g., a first semiconductor layer) of each first light emitting element LD1 (LD) may be electrically connected to the 2-1-th sub-electrode SEL2_1, and a second end EP2 (e.g., a second semiconductor layer) thereof may be electrically connected to the 1-1-th sub-electrode SEL1_1.

The 1-1-th sub-electrode SEL1_1 may be electrically connected with the pixel circuit 144 of each pixel PXL through a first contact hole CH1. The 2-1-th sub-electrode SEL2_1 may be electrically connected with a side of the first bridge pattern BRP1 through a second contact hole CH2.

A 1-2-th sub-electrode SEL1_2, a 2-2-th sub-electrode SEL2_2, at least one second light emitting element LD2 (LD), at least one reverse light emitting element LDr (LD), and third and fourth contact electrodes CNE3 and CNE4 may be disposed in the second area A2. The 1-2-th and 2-2-th sub-electrodes SEL1_2 and SEL2_2, and the second light emitting element LD2 (LD) and the reverse light emitting element LDr (LD) that are electrically connected in parallel therebetween may form a second serial set SET2 of each pixel PXL.

A first end EP1 of the second light emitting element LD2 (LD) may be electrically connected to the 1-2-th sub-electrode SEL1_2, and a second end EP2 thereof may be electrically connected to the 2-2-th sub-electrode SEL2_2. A first end EP1 of the reverse light emitting element LDr (LD) in the second area A2 may be electrically connected to the 2-2-th sub-electrode SEL2_2, and a second end EP2 thereof may be electrically connected to the 1-2-th sub-electrode SEL1_2.

The 2-2-th sub-electrode SEL2_2 may be electrically connected to another side of the second bridge pattern BRP1 through a third contact hole CH3. Hence, the first serial set SET1 and the second serial set SET2 may be electrically connected to each other by the first bridge pattern BRP1.

A 1-3-th sub-electrode SEL1_3, a 2-3-th sub-electrode SEL2_3, at least one third light emitting element LD3 (LD), at least one reverse light emitting element LDr (LD), and fifth and sixth contact electrodes CNE5 and CNE6 may be disposed in the third area A3. The 1-3-th and 2-3-th sub-electrodes SEL1_3 and SEL2_3, and the third light emitting element LD3 (LD) and the reverse light emitting element LDr (LD) that are electrically connected in parallel therebetween may form a third serial set SET3 of each pixel PXL.

A first end EP1 of the third light emitting element LD3 (LD) may be electrically connected to the 2-3-th sub-electrode SEL2_3, and a second end EP2 thereof may be electrically connected to the 1-3-th sub-electrode SEL1_3. A first end EP1 of the reverse light emitting element LDr (LD) in the third area A3 may be electrically connected to the 1-3-th sub-electrode SEL1_3, and a second end EP2 thereof may be electrically connected to the 2-3-th sub-electrode SEL2_3.

The second serial set SET2 and the third serial set SET3 may be electrically connected to each other by a first connection line CNL1 disposed in the area between the second area A2 and the third area A3.

The first connection line CNL1 may be provided between the 1-2-th sub-electrode SEL1_2 and the 1-3-th sub-electrode SEL1_3 and electrically and/or physically connect the 1-2-th sub-electrode SEL1_2 and the 1-3-th sub-electrode SEL1_3. In other words, the 1-2-th sub-electrode SEL1_2 and the 1-3-th sub-electrode SEL1_3 may be electrically and/or physically connected to each other by the first connection line CNL1. The first connection line CNL1 may be integral with the 1-2-th sub-electrode SEL1_2 and/or the 1-3-th sub-electrode SEL1_3.

The 2-3-th sub-electrode SEL2_3 may be electrically connected to a side of the second bridge pattern BRP2 through a fourth contact hole CH4.

A 1-4-th sub-electrode SEL1_4, a 2-4-th sub-electrode SEL2_4, at least one fourth light emitting element LD4 (LD), at least one reverse light emitting element LDr (LD), and seventh and eighth contact electrodes CNE7 and CNE8 may be disposed in the fourth area A4. The 1-4-th and 2-4-th sub-electrodes SEL1_4 and SEL2_4, and the fourth light emitting element LD4 (LD) and the reverse light emitting element LDr (LD) that are electrically connected in parallel therebetween may form a fourth serial set of each pixel PXL.

A first end EP1 of the fourth light emitting element LD4 (LD) may be electrically connected to the 1-4-th sub-electrode SEL1_4, and a second end EP2 thereof may be electrically connected to the 2-4-th sub-electrode SEL2_4. A first end EP1 of the reverse light emitting element LDr (LD) in the fourth area A4 may be electrically connected to the 2-4-th sub-electrode SEL2_4, and a second end EP2 thereof may be electrically connected to the 1-4-th sub-electrode SEL1_4.

In an embodiment, the seventh contact electrode CNE7 may be disposed on the 1-4-th sub-electrode SEL1_4 and the first end EP1 of the fourth light emitting element LD4 (LD) and thus electrically connect the 1-4-th sub-electrode SEL1_4 and the first end EP1 of the fourth light emitting element LD4 (LD). The seventh contact electrode CNE7 may be disposed in the second end EP2 of the reverse light emitting element LDr (LD) in the fourth area A4. The eighth contact electrode CNE8 may be disposed on the 2-4-th sub-electrode SEL2_4 and the second end EP2 of the fourth light emitting element LD4 (LD) and thus electrically connect the 2-4-th sub-electrode SEL2_4 and the second end EP2 of the fourth light emitting element LD4 (LD). The eighth contact electrode CNE8 may be disposed in the first end EP1 of the reverse light emitting element LDr (LD) in the fourth area A4.

The 2-4-th sub-electrode SEL2_4 may be electrically connected to another side of the second bridge pattern BRP2 through a fifth contact hole CH5. Hence, the third serial set SET3 and the fourth serial set may be electrically connected to each other by the second bridge pattern BRP2.

The third bridge pattern BRP3, a 1-5-th sub-electrode SEL1_5, a 2-5-th sub-electrode SEL2_5, at least one fifth light emitting element LD5 (LD), and ninth and tenth contact electrodes CNE9 and CNE10 may be disposed in the fifth area A5. The 1-5-th and 2-5-th sub-electrodes SEL1_5 and SEL2_5 and the fifth light emitting element LD5 (LD) electrically connected in parallel therebetween may form a fifth serial set of each pixel PXL.

A first end EP1 of the fifth light emitting element LD5 (LD) may be electrically connected to the 2-5-th sub-electrode SEL2_5, and a second end EP2 thereof may be electrically connected to the 1-5-th sub-electrode SEL1_5.

In an embodiment, the ninth contact electrode CNE9 may be disposed on the 1-5-th sub-electrode SEL1_5 and the second end EP2 of the fifth light emitting element LD5 (LD) and thus electrically connect the 1-5-th sub-electrode SEL1_5 and the second end EP2 of the fifth light emitting element LD5 (LD). The tenth contact electrode CNE10 may be disposed on the 2-5-th sub-electrode SEL2_5 and the first end EP1 of the fifth light emitting element LD5 (LD) and thus electrically connect the 2-5-th sub-electrode SEL2_5 and the first end EP1 of the fifth light emitting element LD5 (LD).

The fourth serial set and the fifth serial set may be electrically connected to each other by a second connection line CNL2 disposed in an area between the fourth area A4 and the fifth area A5.

The second connection line CNL2 may be provided between the 1-4-th sub-electrode SEL1_4 and the 1-5-th sub-electrode SEL1_5 and electrically and/or physically connect the 1-4-th sub-electrode SEL1_4 and the 1-5-th sub-electrode SEL1_5. In other words, the 1-4-th sub-electrode SEL1_4 and the 1-5-th sub-electrode SEL1_5 may be electrically and/or physically connected to each other by the second connection line CNL2.

The second connection line CNL2 may be formed integrally with the 1-4-th sub-electrode SEL1_4 and/or the 1-5-th sub-electrode SEL1_5. In case that the second connection line CNL2 is integral with the 1-4-th sub-electrode SEL1_4, the second connection line CNL2 may be regarded as a portion of the 1-4-th sub-electrode SEL1_4. In case that the second connection line CNL2 is integral with the 1-5-th sub-electrode SEL1_5, the second connection line CNL2 may be regarded as a portion of the 1-5-th sub-electrode SEL1_5. Since the second connection line CNL2 is integral with the 1-4-th sub-electrode SEL1_4 and/or the 1-5-th sub-electrode SEL1_5, the second connection line CNL2 and the 1-4-th and 1-5-th sub-electrodes SEL1_4 and SEL1_5 may be provided on a same layer and have a same material.

The 2-5-th sub-electrode SEL2_5 may be electrically connected to the third bridge pattern BRP3 through a sixth contact hole CH6. The third bridge pattern BRP3 may be electrically connected, through a seventh contact hole CH7, to the second power line PL2 (FIGS. 7B and 7C) to which the second driving power supply VSS is to be applied.

In case that driving current flows from the first power line PL1 to the second power line (PL2) by the first transistor T1 (T), e.g., the driving transistor T, of the pixel circuit 144 included in each pixel PXL having the above-described configuration, the driving current may be supplied to the 1-1-th sub-electrode SEL1_1 of the first serial set SET1 through the first contact hole CH1.

The driving current supplied to the 1-1-th sub-electrode SEL1_1 flows to the 2-1-th sub-electrode SEL2_1 via the first light emitting elements LD1 (LD) of the first serial set SET1. Therefore, the first light emitting elements LD1 (LD) each may emit light at a luminance corresponding to current distributed thereto.

The driving current that flows to the 2-1-th sub-electrode SEL2_1 of the first serial set SET1 may be drawn into the 2-2-th sub-electrode SEL2_2 of the second serial set SET2 via the third contact hole CH3 and the first bridge pattern BRP1 electrically connected to the 2-1-th sub-electrode SEL2_1 through the second contact hole CH2. The driving current may flow to the 1-2-th sub-electrode SEL1_2 via the second light emitting elements LD2 (LD) electrically connected between the 2-2-th sub-electrode SEL2_2 and the 1-2-th sub-electrode SEL1_2 of the second serial set SET2. Hence, the second light emitting element LD2 (LD) may emit light having a luminance corresponding to current distributed to the second light emitting element LD2 (LD).

The driving current that flows to the 1-2-th sub-electrode SEL1_2 of the second serial set SET2 may be drawn into the 1-3-th sub-electrode SEL1_3 of the third serial set SET3 via the first connection line CNL1. The driving current may flow to the 2-3-th sub-electrode SEL2_3 via the third light emitting elements LD3 (LD) electrically connected between the 1-3-th sub-electrode SEL1_3 and the 2-3-th sub-electrode SEL2_3 of the third serial set SET3. Hence, the third light emitting element LD3 (LD) may emit light having a luminance corresponding to current distributed to the third light emitting element LD3 (LD).

The driving current that flows to the 2-3-th sub-electrode SEL2_3 of the third serial set SET3 may be drawn into the 2-4-th sub-electrode SEL2_4 of the fourth serial set via the fifth contact hole CH5 and the second bridge pattern BRP2 electrically connected to the 2-3-th sub-electrode SEL2_3 through the fourth contact hole CH4. The driving current may flow to the 1-4-th sub-electrode SEL1_4 via the fourth light emitting elements LD4 (LD) electrically connected between the 2-4-th sub-electrode SEL2_4 and the 1-4-th sub-electrode SEL1_4 of the fourth serial set. Hence, the fourth light emitting element LD4 (LD) may emit light having a luminance corresponding to current distributed to the fourth light emitting element LD4 (LD).

The driving current that flows to the 1-4-th sub-electrode SEL1_4 of the fourth serial set may be drawn into the 1-5-th sub-electrode SEL1_5 of the fifth serial set via the second connection line CNL2. The driving current may flow to the 2-5-th sub-electrode SEL2_5 via the fifth light emitting elements LD5 (LD) electrically connected between the 1-5-th sub-electrode SEL1_5 and the 2-5-th sub-electrode SEL2_5 of the fifth serial set. Hence, the fifth light emitting element LD5 (LD) may emit light having a luminance corresponding to current distributed to the fifth light emitting element LD5 (LD).

In this way, the driving current of each pixel PXL may flow successively via the first light emitting element LD1 (LD) of the first serial set SET1, the second light emitting element LD2 (LD) of the second serial set SET2, the third light emitting element LD3 (LD) of the third serial set SET3, the fourth light emitting element LD4 (LD) of the fourth serial set, and the fifth light emitting element LD5 (LD) of the fifth serial set. Hence, each pixel PXL may emit light having a luminance corresponding to a data signal supplied during each frame period.

While various embodiments have been described above, those skilled in the art will appreciate that various modifications, additions and substitutions are possible, without departing from the scope of the disclosure.

Therefore, the embodiments disclosed in this specification are only for illustrative purposes rather than limiting the technical scope of the disclosure. The scope of the disclosure must be defined by the accompanying claims.

The invention claimed is:

1. A display device comprising:
a display area including pixel areas;
a non-display area; and
a pixel provided in each of the pixel areas,
wherein the pixel comprises:
a first area, a second area, and a third area divided from each other in a direction;
a first sub-electrode and a second sub-electrode provided in each of the first to the third areas, and spaced apart from each other;
light emitting elements provided in each of the first to the third areas, and disposed between the first and the second sub-electrodes, the light emitting elements comprising a first end, a second end, and a side portion between the first end and the second end;
a bridge pattern disposed in each of the first to the third areas under the first and the second sub-electrodes of a corresponding one of the first to the third areas with an insulating layer disposed between the bridge pattern and the first and the second sub-electrodes, the insulating layer comprising contact holes each of which is formed to expose a portion of the bridge pattern of each of the first to the third areas;
a first contact electrode provided in each of the first to the third areas on the first sub-electrode of a corresponding one of the first to the third areas;
a second contact electrode provided in each of the first to the third areas on the second sub-electrode of a corresponding one of the first to third areas; and a first intermediate electrode provided in at least one contact hole formed in an area between the first area and the second area among the contact holes, and electrically connecting the bridge pattern of the first area to the first contact electrode of the second area, wherein the bridge pattern of the first area and the first contact electrode of the second area are electrically connected to each other, and wherein the first contact electrode covers the first end and a first portion of the side portion, and the second contact electrode covers the second end and a second portion of the side portion.

2. The display device according to claim 1, wherein in each of the first to third areas, one sub-electrode of the first sub-electrode and the second sub-electrode has a circular shape, and a remaining sub-electrode of the first sub-electrode and the second sub-electrode has a shape enclosing the one sub-electrode.

3. The display device according to claim 2, wherein the light emitting elements comprise:

first light emitting elements disposed between the first and the second sub-electrodes of the first area;

second light emitting elements disposed between the first and the second sub-electrodes of the second area; and third light emitting elements disposed between the first and the second sub-electrodes of the third area, wherein the first to the third light emitting elements each are disposed around the one sub-electrode in a corresponding one of the first to the third areas in a circumferential direction between the one sub-electrode and the remaining sub-electrode.

4. The display device according to claim 3, wherein, in a plan view, the bridge pattern of the first area, the bridge pattern of the second area, and the bridge pattern of the third area are spaced apart from each other.

5. The display device according to claim 4, wherein at least a portion of the bridge pattern of the first area extends to the second area, and at least a portion of the bridge pattern of the second area extends to the third area.

6. The display device according to claim 5, wherein the first intermediate electrode is integral with the first contact electrode of the second area.

7. The display device according to claim 5, further comprising a second intermediate electrode provided in at least one contact hole formed in an area between the second area and the third area among the contact holes, and electrically connecting the bridge pattern of the second area to the first contact electrode of the third area.

8. The display device according to claim 7, wherein the second intermediate electrode is integral with the first contact electrode of the third area.

9. The display device according to claim 8, wherein the bridge pattern of the first area is electrically connected to each of the second sub-electrode of the first area and the first intermediate electrode, the bridge pattern of the second area is electrically connected to each of the first intermediate electrode, the second sub-electrode of the second area, and the second intermediate electrode, and the bridge pattern of the third area is electrically connected to each of the second intermediate electrode and the second sub-electrode of the third area.

10. The display device according to claim 9, wherein the first light emitting elements form a first set connected in parallel between the first and the second sub-electrodes of the first area, the second light emitting elements form a second set connected in parallel between the first and the second sub-electrodes of the second area, the third light emitting elements form a third set connected in parallel between the first and the second sub-electrodes of the third area, the first set and the second set are electrically connected through the bridge pattern of the first area and the first intermediate electrode, and the second set and the third set are electrically connected through the bridge pattern of the second area and the second intermediate electrode.

11. The display device according to claim 10, further comprising:

a conductive pattern provided on the bridge pattern of each of the first to the third areas and electrically connected to the bridge pattern;

a first auxiliary electrode disposed between the bridge pattern of the first area and the first intermediate electrode in the area between the first area and the second area; and a second auxiliary electrode disposed between the bridge pattern of the second area and the second intermediate electrode in the area between the second area and the third area.

12. The display device according to claim 11, wherein the conductive pattern of the first area is disposed between the second sub-electrode of the first area and the bridge pattern of the first area, the conductive pattern of the second area is disposed between the second sub-electrode of the second area and the bridge pattern of the second area, and the conductive pattern of the third area is disposed between the second sub-electrode of the third area and the bridge pattern of the third area.

13. The display device according to claim 12, wherein the conductive pattern of each of the first to the third areas and the first and the second auxiliary electrodes are provided on a same layer.

14. A display device comprising:

a display area including pixel areas;

a non-display area; and a pixel provided in each of the pixel areas, wherein the pixel comprises:

a first area, a second area, and a third area divided from each other in a direction;

a first sub-electrode and a second sub-electrode provided in each of the first to the third areas, and spaced apart from each other;

light emitting elements provided in each of the first to the third areas, and disposed between the first and the second sub-electrodes;

a first bridge pattern extending from the first area to the second area, and disposed under the second sub-electrodes of each of the first and the second areas with an insulating layer disposed between the first bridge pattern and the first and the second sub-electrodes, the insulating layer comprising contact holes each of which is formed to expose a portion of the first bridge pattern of each of the first to the second areas;

a second bridge pattern provided in the third area and disposed under the second sub-electrode of the third area;

a connection line provided between the first sub-electrode of the second area and the first sub-electrode of the third area, and electrically connecting the first sub-electrode of the second area to the first sub-electrode of the third area; and a first intermediate electrode electrically connecting the first bridge pattern of the first area to a first contact electrode of the second area, the first intermediate electrode being in at least one contact hole formed in an area between the first area and the second area among the contact holes.

15. The display device according to claim 14, wherein the connection line is integral with one first sub-electrode of the first sub-electrode of the second area and the first sub-electrode of the third area.

16. The display device according to claim 15, wherein in each of the first to third areas, one sub-electrode of the first sub-electrode and the second sub-electrode has a circular shape, and a remaining sub-electrode of the first sub-electrode and the second sub-electrode has a shape enclosing the one sub-electrode.

17. The display device according to claim 16, wherein the light emitting elements comprise:

first light emitting elements disposed between the first and the second sub-electrodes of the first area;

second light emitting elements disposed between the first and the second sub-electrodes of the second area; and third light emitting elements disposed between the first and the second sub-electrodes of the third area, and the first to the third light emitting elements each are disposed around the one sub-electrode in a corresponding one of the first to the third areas in a circumferential direction between the one sub-electrode and the remaining sub-electrode.

18. The display device according to claim 17, wherein the first light emitting elements form a first set connected in parallel between the first and the second sub-electrodes of the first area, the second light emitting elements form a second set connected in parallel between the first and the second sub-electrodes of the second area, the third light emitting elements form a third set connected in parallel between the first and the second sub-electrodes of the third area, the first set and the second set are electrically connected to each other through the first bridge pattern, and the second set and the third set are electrically connected to each other through the connection line.

* * * * *